United States Patent [19]
Yonehara et al.

[11] Patent Number: 5,750,000
[45] Date of Patent: May 12, 1998

[54] SEMICONDUCTOR MEMBER, AND PROCESS FOR PREPARING SAME AND SEMICONDUCTOR DEVICE FORMED BY USE OF SAME

[75] Inventors: Takao Yonehara, Atsugi; Nobuhiko Sato, Yokohama; Kiyofumi Sakaguchi, Atsugi; Shigeki Kondo, Hiratsuka, all of Japan

[73] Assignee: Canon Kabushiki Kaisha, Tokyo, Japan

[21] Appl. No.: 755,356

[22] Filed: Nov. 25, 1996

Related U.S. Application Data

[60] Continuation of Ser. No. 551,450, Nov. 1, 1995, abandoned, which is a division of Ser. No. 514,984, Aug. 14, 1995, abandoned, which is a continuation of Ser. No. 355,117, Dec. 13, 1994, abandoned, which is a continuation of Ser. No. 191,767, Feb. 4, 1994, abandoned, which is a continuation of Ser. No. 921,232, Jul. 29, 1992, abandoned, which is a continuation-in-part of Ser. No. 740,439, Aug. 5, 1991, Pat. No. 5,371,037.

[30] Foreign Application Priority Data

| Aug. 3, 1990 | [JP] | Japan | 2-206548 |
| Jul. 29, 1991 | [JP] | Japan | 3-210369 |
| Jul. 29, 1991 | [JP] | Japan | 3-210370 |
| Aug. 1, 1991 | [JP] | Japan | 3-214241 |
| Aug. 1, 1991 | [JP] | Japan | 3-214242 |
| Aug. 1, 1991 | [JP] | Japan | 3-214243 |
| Aug. 1, 1991 | [JP] | Japan | 3-214244 |
| Aug. 2, 1991 | [JP] | Japan | 3-216573 |
| Aug. 2, 1991 | [JP] | Japan | 3-216574 |
| Aug. 2, 1991 | [JP] | Japan | 3-216575 |

[51] Int. Cl.$^6$ .................................. H01L 21/00
[52] U.S. Cl. .................. 156/630.1; 156/631.1; 156/657.1; 216/2; 216/36; 216/56; 257/347
[58] Field of Search .................. 216/2, 56, 36; 257/347, 352, 273; 438/30, 455, 690, 458, 735, 738, 739, 740, 741, 745; 117/10, 86

[56] References Cited

U.S. PATENT DOCUMENTS

| 3,414,434 | 12/1968 | Manasevit | 257/352 |
| 3,997,381 | 12/1976 | Wanlass | 156/3 |
| 4,409,724 | 10/1983 | Tasch, Jr. et al. | 257/72 |
| 4,800,527 | 1/1989 | Ozaki et al. | 365/182 |
| 4,809,056 | 2/1989 | Shirato | 257/347 |
| 4,868,140 | 9/1989 | Yonehara | 437/109 |
| 5,010,033 | 4/1991 | Tokunaga | 437/83 |
| 5,073,230 | 12/1991 | Maracas et al. | 156/631.1 |

FOREIGN PATENT DOCUMENTS

| 0016464 | 2/1980 | Japan. |
| 0222249 | 10/1986 | Japan. |

OTHER PUBLICATIONS

Silicon–On Insulator Technology and Devices, W. P. Maszara, vol. 90–6, 1990, pp. 199–212B, "SOI by Wafer Bonding: A Review".

Journal of Applied Physics, vol. 64, No. 10, Nov. 15, 1988, pp. 4943–4950, W.P. Maszara et al., "Bonding of Silicon Wafers For Silicon–On–Insulator".

Applied Physics Letters, vol. 43, No. 3, Aug. 1, 1983, pp. 263–265, M. Kimura et al., "Epitaxial Film Transfer Technique For Producing single crystal Si Film on an Insulating Substrate".

1989 IEEE SOS/SOI Technology Conference, 1989, pp. 64–65, A. Soderbarg, "Fabrication of Besoi-Materials Using Implanted Nitrogen As An Effective Etch Stop Barrier".

*Primary Examiner*—William Powell
*Attorney, Agent, or Firm*—Fitzpatrick, Cella, Harper & Scinto

[57] ABSTRACT

A semiconductor device having a substrate with an insulating surface and a non-porous semiconductor region bonded to the body of the device. A porous semiconductor region on the surface of the substrate was removed by etching.

69 Claims, 30 Drawing Sheets

SEMICONDUCTOR MEMBER, AND PROCESS FOR PREPARING SAME AND SEMICONDUCTOR DEVICE FORMED BY USE OF SAME

This application is a continuation of application Ser. No. 08/551,450 filed Nov. 1, 1995, now abandoned, which is a division of application Ser. No. 08/514,984 filed Aug. 14, 1995, now abandoned, which is a continuation of application Ser. No. 08/355,117 filed Dec. 13, 1994, now abandoned, which is a continuation of application Ser. No. 08/191,767 filed Feb. 4, 1994, now abandoned, which is a continuation of application Ser. No. 07/921,232 filed Jul. 29, 1992, now abandoned, which is a continuation-in-part application Ser. No. 07/740,439 filed Aug. 5, 1991, now U.S. Pat. No. 5,371,037 issued Dec. 6, 1994.

BACKGROUND OF THE INVENTION

1. Field of the Invention

This invention relates to a semiconductor member, a process for preparing the semiconductor member and a semiconductor device formed by use of the semiconductor member, more particularly to a semiconductor member which is suitable for separation of dielectric materials or electronic devices, integrated circuits prepared on a monocrystalline semiconductor layer on an insulating material, a process for preparing the member and a semiconductor device formed by use of the member.

2. Related Background Art

Formation of a monocrystalline Si semiconductor layer on an insulating material has been widely known as the silicon on insulator (SOI) technology, and since a large number of advantages which cannot be reached by bulk Si substrates for preparation of conventional Si integrated circuits are possessed by the device utilizing the SOI structure, so many researches have been done. More specifically, by utilizing the SOI structure the following advantages can be obtained:

1. Dielectric isolation can be easily done to enable high degree of integration;
2. Radiation hardness is excellent;
3. Stray capacity is reduced to attain high speed;
4. Well formation step can be omitted;
5. Latch-up can be prevented;
6. Fully depleted field effect transistor can be made by thin film formation.

In order to realize the many advantages in device characteristics as mentioned above, studies have been made about the method for forming the SOI structure for these some 10 years. The contents are summarized in, for example, the literature as mentioned below:

Special Issue: "Single-crystal silicon on non-single-crystal insulators"; edited by G. W. Cullen, Journal of Crystal Growth, volume 63, No. 3, pp. 429–590 (1983).

Also, it has been known for a long time to form the SOS (silicon on sapphire) structure by heteroepitaxy of Si on a monocrystalline sapphire substrate by CVD (chemical vapor deposition) method. This was successful to some extent as the most mature SOI technique, but for such reasons as a large amount of crystal defects because of lattice mismatching at the interface between the Si layer and the sapphire substrate, introduction of aluminum from the sapphire substrate into the Si layer, and above all the high cost of the substrate and delay in enlargement of the substrate wafer size, it is obstructed from being widely applied. Relatively in recent years, attempts to realize the SOI structure without use of a sapphire substrate have been done. Such attempts may be broadly classified into the three shown below.

(1) After surface oxidation of a Si monocrystalline substrate, a window is formed to have the Si substrate partially exposed, and epitaxial growth is proceeded in the lateral direction with that exposed portion as the seed to form a Si monocrystalline layer on $SiO_2$. (In this case, deposition of Si layer on $SiO_2$ is accompanied.)

(2) By use of a Si monocrystalline substrate itself as active layer, $SiO_2$ is formed therebeneath. (This method is accompanied by no deposition of Si layer.)

(3) After epitaxial growth of Si on a Si monocrystalline substrate, isolation separation is effected. (This method is accompanied by deposition of Si layer.)

As the means for realizing the above (1), there have been known the method in which a monocrystalline Si layer is formed directly to lateral epitaxial growth by CVD, the method in which amorphous Si is deposited and subjected to solid phase lateral epitaxial growth by heat treatment, the method in which amorphous or polycrystalline Si layer is irradiated convergently with an energy beam such as electron beam, laser beam, etc. and a monocrystalline layer is grown on $SiO_2$ by melting and recrystallization, and the method in which a melting region is scanned in a zone fashion by a rod-shaped heater (zone melting recrystallization). These methods have both advantages and disadvantages, they still have many problems with respect to controllability, productivity, uniformity and quality, and none of them have been industrially applied yet up to date. For example, the CVD method requires sacrifice-oxidation in flat thin film formation, while the crystallinity is poor in the solid phase growth method. On the other hand, in the beam annealing method, problems are involved in controllability such as treatment time by converged beam scanning, the manner of overlapping of beams, focus adjustment, etc. Among these, the Zone Melting Recrystallization method is the most mature, and a relatively larger scale integrated circuit has been tried, but still a large number of crystal defects such as point defect, line defect, plane defect (sub-boundary), etc. remain, and no device driven by minority carriers had been prepared.

Concerning the method using no Si substrate as the seed for epitaxial growth which is the above method (2), for example, the following methods may be included.

1. An oxide film is formed on a Si monocrystalline substrate with V-grooves as anisotropically etched on the surface, a polycrystalline Si layer is deposited on the oxide film thick to the extent as the Si substrate, and thereafter by polishing from the back surface of the Si substrate, Si monocrystalline regions dielectrically separated by surrounding with the V-grooves on the thick polycrystalline Si layer are formed. In this method, although crystallinity is good, there are problems with respect to controllability and productivity in the step of depositing the polycrystalline Si thick as some hundred microns and the step in which the monocrystalline Si substrate is polished from the back surface to leave only the Si active layer as separated.

2. This is the method called SIMOX (Separation by ion-implanted oxygen) in which a $SiO_2$ layer is formed by ion implantation of oxygen into a Si monocrystalline substrate, which is one of the most mature methods because of good matching with the Si-IC (Integrated Circuit) process. However, for formation of the $SiO_2$ layer, $10^{18}$ ions/$cm^2$ or more of oxygen ions are required to be implanted, and the implantation time is very long to be not high in productivity, and also the wafer cost is high. Further, many crystal defects remain, and from an industrial point of view, no sufficient level of quality capable of preparing a device driven by minority carriers has been attained.

3. This is the method to form an SOI structure by dielectric isolation according to oxidation of porous Si. This is a method in which an N-type Si layer is formed on the surface of a P-type Si monocrystalline substrate in shape of islands by way of proton ion implantation (Imai et al., J. Crystal Growth, Vol. 63,547 (1983)), or by epitaxial growth and patterning; only the p-type Si substrate is made porous by anodization in HF solution so as to surround the Si islands from the surface; and then the N-type Si islands are dielectrically isolated by accelerated oxidation. In this method, the separated Si region is determined before the device stops, whereby there is the problem that the degree of freedom in device and circuit design may be limited in some cases.

As the method (3) as descried above, the method described in Japanese Laid-open Patent Application No. 55-16464 has the steps of forming an N-type monocrystalline Si layer on a P-type Si wafer, providing a glass layer containing an oxide of the N-type impurity thereon and the step of bonding the glass layer to a glass layer containing the oxide of an N-purity impurity provided on another silicon wafer by heat treatment. And, subsequent to the bonding step, the P-type Si wafer is made porous, and then the porous layer is oxidized, followed by etching to remove the porous layer, thereby forming an SOI structure. Also, Japanese Patent Publication No. 53-45675 discloses a method in which a silicon monocrystalline wafer is made porous, then oxidized to make the porous layer higher in resistance; a monocrystalline Si layer is formed on the porous silicon layer; and a part of the monocrystalline Si layer is made porous and higher in resistance so as to surround the monocrystalline Si region, thereby separating the monocrystalline Si region.

The methods described in these publications all include the step of oxidizing a porous layer, and because the volume of porous layer is increased by oxidation, sometimes an influence of distortion may be exerted on the monocrystalline Si layer, and therefore in these methods, a monocrystalline Si layer with constantly good quality could not necessarily be formed on the insulator.

SUMMARY OF THE INVENTION

An object of the present invention is to provide a semiconductor member capable of overcoming the problems as described above and meeting the demands as described above and a process for preparing the member.

Another object of the present invention is to provide a semiconductor having a monocrystalline layer excellent in crystallinity equally as monocrystalline SOI safer, and a process for preparing the member excellent also in aspects of productivity, uniformity, controllability, and economy.

Still another object to the present invention is to provide a semiconductor member having excellent characteristics which can be sufficiently alternative for expansive SOS or SIMOX even in preparing a large scale integrated circuit by the SOI structure and a process for preparing the member economically.

A further object of the present invention is to provide a semiconductor device formed on a good-quality monocrystalline semiconductor layer on an insulating substrate and an integrated circuit comprising such semiconductor devices.

A further object of the present invention is to provide a semiconductor device capable of being used instead of an expensive SOS or SIMOX and formed on a good-quality monocrystalline semiconductor layer on an insulating material and an integrated circuit comprising such semiconductor devices.

Still a further object of the present invention is to provide a liquid crystal display having, on one substrate, semiconductor active devices formed on a good-quality monocrystalline semiconductor layer on a light-transmissive insulating substrate and an integrated circuit comprising such semiconductor devices.

Other objects of the present invention than those as mentioned above are:

to provide a process for preparing a semiconductor member comprising the steps of:
  forming a member having a non-porous monocrystalline semiconductor region on a porous monocrystalline semiconductor region,
  bonding the surface of a member of which the surface is constituted of an insulating substance onto the surface of the non-porous monocrystalline semiconductor region, and then
  removing the porous monocrystalline semiconductor region by chemical etching;

to provide a process for preparing a semiconductor member comprising the steps of:
  forming a member having a non-porous monocrystalline semiconductor region on a porous monocrystalline semiconductor region,
  forming a region constituted of an insulating substance on the non-porous monocrystalline semiconductor side of the member, then
  bonding the surface of a member of which the surface is constituted of an insulating substance onto the surface of the region constituted of the insulating substance, and
  removing the porous monocrystalline semiconductor region by chemical etching;

to provide a process for preparing a semiconductor member comprising the steps of:
  making a non-porous monocrystalline semiconductor member porous to form a porous monocrystalline semiconductor region,
  forming a non-porous monocrystalline semiconductor region on the porous monocrystalline semiconductor region,
  bonding the surface of a member of which the surface is constituted of an insulating substance onto the surface of the non-porous monocrystalline semiconductor region, and
  removing the porous monocrystalline semiconductor region by chemical etching;

to provide a process for preparing a semiconductor member comprising the steps of:
  making a non-porous monocrystalline semiconductor member porous to form a porous monocrystalline semiconductor region,
  forming a non-porous monocrystalline semiconductor region on the porous monocrystalline semiconductor region,
  forming region constituted of an insulating substance on the non-porous monocrystalline semiconductor region side,
  bonding the surface of a member of which the surface is constituted of an insulating substance onto the surface of the region constituted of the insulating substance, and
  removing the porous monocrystalline semiconductor region by chemical etching;

to provide a process for preparing a semiconductor member comprising the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, bonding the surface of a member of which the surface is constituted of an insulating substance onto the surface of the third non-porous monocrystalline semiconductor region, and removing the second non-porous monocrystalline semiconductor region mechanically, and removing the porous monocrystalline semiconductor region by chemical etching;

to provide a process for preparing a semiconductor member comprising the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, forming a region constituted of an insulating substance on the third non-porous monocrystalline semiconductor region side, bonding the surface of a member of which the surface is constituted of an insulating substance onto the surface of the region constituted of the insulating substance, and removing the second non-porous monocrystalline semiconductor mechanically, and removing the porous monocrystalline semiconductor region by chemical etching;

to provide a process for preparing a semiconductor member comprising the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, bonding the surface of a member of which the surface is formed of an insulating substance onto the surface of the second monocrystalline semiconductor region, and removing the porous monocrystalline semiconductor region by chemical etching;

to provide a process for preparing a semiconductor member comprising the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, forming a region constituted of an insulating substance on the second monocrystalline semiconductor region side, bonding the surface of a member of which the surface is formed of an insulating substance onto the surface of the second monocrystalline semiconductor region, and removing the porous monocrystalline semiconductor region by chemical etching;

to provide a semiconductor member comprising:

a first member having a non-porous monocrystalline semiconductor region on a porous monocrystalline semiconductor region, and a second member having the surface constituted of an insulating substance bonded onto the surface of the non-porous monocrystalline semiconductor region;

to provide a semiconductor member comprising:

a first member having a non-porous monocrystalline semiconductor region and a region constituted of an insulating substance arranged in this order on a porous monocrystalline semiconductor region, and a second member bonded through a region constituted of an insulating substance onto the surface of the region constituted of the insulting substance;

to provide a semiconductor member having a non-porous silicon monocrystalline semiconductor region arranged on a region constituted of an insulating substance, characterized in that the dislocation defect density in the non-porous silicon monocrystalline semiconductor region is $2.0 \times 10^4 / cm^2$ or less, and the life time of carriers is $5.0 \times 10^{-4}$ second or longer; and to provide a semiconductor member having a non-porous silicon monocrystalline semiconductor region arranged on a region constituted of an insulating substance, characterized in that the dislocation defect density in the non-porous silicon monocrystalline semiconductor region is $2.0 \times 10^4 / cm^2$ or less, and the life time of carriers is $5.0 \times 10^{-4}$ sec or longer, and also the difference between the maximum value and the minimum value of the thickness of the silicon monocrystalline semiconductor region is 10% of less with respect to maximum value.

Still a further object to the present invention is to provide a semiconductor device constructed by using a non-porous monocrystalline semiconductor region provided on a member having a surface composed of an insulating material which semiconductor region is obtained by forming a member having a porous monocrystalline semiconductor region and a corresponding non-porous monocrystalline semiconductor region formed on the porous monocrystalline semiconductor region, bonding a surface of the member having a surface composed of an insulating material to a surface of the non-porous monocrystalline semiconductor region, and thereafter removing the porous monocrystalline semiconductor region by etching.

Still a further object of the present invention is to provide an insulated gate type field effect transistor in which monocrystalline semiconductor layer constituting at least a channel region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

Still a further object of the present invention is to provide a bipolar transistor in which a monocrystalline semiconductor layer constituting at least an active region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

Still a further object of the present invention is to provide a power transistor in which a monocrystalline semiconductor layer constituting at least a channel region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

Still a further object of the present invention is to provide a semiconductor device having a bipolar transistor and a field effect transistor in which a monocrystalline semiconductor layer constituting active regions of the bipolar transistor and the field effect transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

Still a further object of the present invention is to provide a liquid crystal display having a semiconductor active device and a liquid crystal layer on one substrate in which a monocrystalline layer constituting at least an active region of the semiconductor active device is a non-porous monocrystalline layer on a light-transmissive substrate which monocrystalline layer is obtained by bonding a surface of a corresponding non-porous monocrystalline layer formed on a silicon substrate formed into a porous structure or an oxidized surface of the non-porous monocrystalline layer to a surface of the light-transmissive substrate, and thereafter removing the porous silicon substrate by a step including chemical etching.

DESCRIPTION OF THE PREFERRED EMBODIMENTS

Figure 1A:
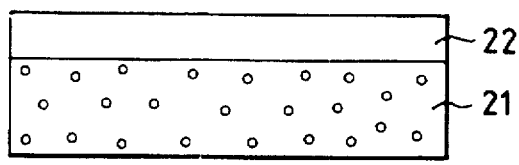
FIGS. 1A–1C, 2A–2D, 3A–3C,4A–4D, 5A–5C,6A–6D, 7A–7C, 8A–8D, 9A–9C, 10A–10D, 11A–11C, 12A–12D and 13A–13F are schematic illustrations showing semiconductor member of the present invention.

Preferable semiconductors of the present invention are as described below.

A semiconductor member of the present invention comprises:

a first member having a non-porous monocrystalline semiconductor region provided on a porous monocrystalline semiconductor region, and a second member having the surface constituted of an insulating substance bonded onto the surface of the non-porous monocrystalline semiconductor region.

Another semiconductor member comprises:

a first member having a non-porous monocrystalline semiconductor region and a region constituted of an insulating substance arranged in this order on a porous monocrystalline semiconductor region, and a second member bonded through a region constituted of an insulating substance onto the surface of the region constituted of the insulating substance.

Still another semiconductor member has a non-porous silicon monocrystalline semiconductor region arranged on a region constituted of an insulating substance, wherein the dislocation defect density in the non-porous silicon monocrystalline semiconductor region is $2.0 \times 10^4/cm^2$ or less, and the life time of carriers is $5.0 \times 10^{-4}$ sec or longer.

Still another semiconductor member has a non-porous silicon monocrystalline semiconductor region arranged on a region constituted of an insulating substance, wherein the dislocation defect density in the non-porous silicon monocrystalline semiconductor region is $2.0 \times 10^4/cm^2$ or less, and the life time of carriers is $5.0 \times 10^{-4}$ sec or longer, and also the difference between the maximum value and the minimum value of the thickness of the silicon monocrystalline semiconductor region is 10% or less, with respect to the maximum value.

Preferable processes for preparing the semiconductor member of the present invention are as described below.

A process for preparing a semiconductor member of the present invention comprises:

forming a member having a non-porous monocrystalline semiconductor region on a porous monocrystalline semiconductor region, bonding the surface of a member of which the surface is constituted of an insulating substance onto the surface of the non-porous monocrystalline semiconductor region, and then removing the porous monocrystalline semiconductor region by chemical etching.

Another process comprises:

forming a member having a non-porous monocrystalline semiconductor region on a porous monocrystalline semiconductor region;

forming a region constituted of an insulating substance on the non-porous monocrystalline semiconductor side of the member, then bonding the surface of a member of which the surface is constituted of an insulating substance onto the surface of the region constituted of the insulating substance, and removing the porous monocrystalline semiconductor region by chemical etching.

Still another process comprises:

making a non-porous monocrystalline semiconductor member porous to form a porous monocrystalline semiconductor region, forming a non-porous monocrystalline semiconductor region on the porous monocrystalline semiconductor region, bonding the surface of a member of which the surface is constituted of an insulating substance onto the surface of the non-porous monocrystalline semiconductor region, and removing the porous monocrystalline semiconductor region by chemical etching.

Still another process comprises the steps of:

making a non-porous monocrystalline semiconductor member porous to form a porous monocrystalline semiconductor region, forming a non-porous monocrystalline semiconductor region on the porous monocrystalline semiconductor region, forming a region constituted of an insulating substance on the non-porous monocrystalline semiconductor region side, bonding the surface of a member of which the surface is constituted of an insulating substance onto the surface of the region constituted of the insulating substance, and removing the porous monocrystalline semiconductor region by chemical etching.

Still another process comprises the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, bonding the surface of a member of which the surface is constituted of an insulating substance onto the surface of the third non-porous monocrystalline semiconductor region, and removing the second non-porous monocrystalline semiconductor region by mechanical grinding, and removing the porous monocrystalline semiconductor region by chemical etching.

Still another process comprises the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, forming a region constituted of an insulating substance on the third non-porous monocrystalline semiconductor region side, bonding the surface of a member of which the surface is constituted of an insulating substance onto the surface of the region constituted of the insulating substance, and removing the second non-porous monocrystalline semiconductor by mechanical grinding, and removing the porous monocrystalline semiconductor region by chemical etching.

Still another process comprises the steps of:

forming a second monocrystalline semiconductor region of a second conduction type on a first monocrystalline semiconductor region of a first conduction type, making the first monocrystalline semiconductor region porous to form a porous monocrystalline semiconductor region, forming a region constituted of an insulating material on the second monocrystalline semiconductor region side, bonding the surface of a member of which the surface is constituted of an insulating substance onto the surface of the second monocrystalline semiconductor region, and removing the porous monocrystalline semiconductor region by chemical etching.

Still another process comprises the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, forming a region constituted of an insulating substance on the second monocrystalline semiconductor region side, bonding the surface of a member of which the surface is formed of an insulating substance onto the surface of the region constituted of the insulating substance, and removing the porous monocrystalline semiconductor region by chemical etching.

The following are preferred semiconductor devices in accordance with the present invention.

A semiconductor device of the present invention is a semiconductor device constructed by using a non-porous monocrystalline semiconductor region provided on a member having a surface composed of an insulating material which semiconductor region is obtained by forming a member having a porous monocrystalline semiconductor region and a corresponding non-porous monocrystalline semiconductor region formed on the porous monocrystalline semiconductor region, bonding a surface of the member having a surface composed of an insulating material to a surface of the non-porous monocrystalline semiconductor region, and thereafter removing the porous monocrystalline semiconductor region by etching.

Another semiconductor device of the present invention is an insulated gate type field effect transistor in which a monocrystalline semiconductor layer constituting at least a channel region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

Still another semiconductor device of the present invention is a bipolar transistor in which a monocrystalline semiconductor layer constituting at least an active region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

A further semiconductor device of the present invention is a power transistor in which a monocrystalline semiconductor layer constituting at least a channel region of the transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

A further semiconductor device of the present invention is a semiconductor device having a bipolar transistor and a field effect transistor in which a monocrystalline semiconductor layer constituting active regions of the bipolar transistor and the field effect transistor is a non-porous monocrystalline semiconductor layer formed on a substrate having a surface composed of an insulating material which semiconductor layer is obtained by bonding a surface of a corresponding non-porous monocrystalline layer formed on a silicon substrate formed into a porous structure or an oxidized surface of the non-porous monocrystalline layer to a surface of the substrate having a surface composed of an insulating material, and thereafter removing the porous silicon substrate by a step including chemical etching.

A further semiconductor device of the present invention is a liquid crystal display having a semiconductor active device and a liquid crystal layer on one substrate in which a monocrystalline layer constituting at least an active region of the semiconductor active device is a non-porous monocrystalline layer on a light-transmissive substrate which monocrystalline layer is obtained by bonding a surface of a corresponding non-porous monocrystalline layer formed on a silicon substrate formed into a porous structure or an oxidized surface of the non-porous monocrystalline layer to a surface of the light-transmissive substrate, and thereafter removing the porous silicon substrate by a step including chemical etching.

The semiconductor member of the present invention has a monocrystalline semiconductor region where carrier life time is long and the defect is extremely little on an insulating material with excellent uniformity of thickness, and is applicable to various semiconductor devices. Also, the semiconductor member of the present invention is capable of high speed response, and is applicable to semiconductor devices high in reliability. The semiconductor member of the present invention can be also an alternative for expensive SOS or SIMOX.

The process for preparing a semiconductor member of the present invention provides a process excellent in aspects of productivity, uniformity, controllability, and economy in obtaining a Si crystal layer having crystallinity equal to monocrystalline wafer on an insulating material.

Further, according to the process for preparing a semiconductor member of the present invention, it is possible to provide semiconductor members wherein the advantages of the SOI device of the prior art can be realized and applied.

Also, according to the present invention, there can be provided a process for preparing a semiconductor member which can be an alternative for expensive SOS or SIMOX also in preparing a large scale integrated circuit of SOI structure.

The process for preparing a semiconductor member of the present invention, as is described in detail in Examples, make it possible to perform the treatment efficiently within a short time, and is excellent in its productivity and economy.

The semiconductor device of the present invention is constructed by using a monocrystalline semiconductor region which is formed on an insulating substrate, and in which the carrier life time is long and the amount of defects is very small. The semiconductor device of the present invention exhibits characteristics enabling high-speed response with improved reliability.

When an insulated gate type field effect transistor is constructed as a semiconductor device in accordance with the present invention, an integrated circuit having a small stray capacity, capable of high-speed operation and free from a latch-up phenomenon or the like, i.e., having various advantages as an SOI device can be provided.

When a bipolar transistor is constructed as a semiconductor device in accordance with the present invention, an integrated circuit having a small capacitance between collectors, capable of high-speed operation and free from soft errors caused by alpha rays, i.e., having various advantages as an SOI device can be provided.

When a power transistor is constructed as a semiconductor device in accordance with the present invention, an integrated circuit having a high withstand voltage and free from a latch-up phenomenon or the like can be provided. An intelligent power IC can also be provided by forming power transistors and low-withstand-voltage CMOS transistors on one substrate, because complete dielectric isolation is possible.

When a semiconductor device having a bipolar transistor and a field effect transistor is constructed as a semiconductor device in accordance with the present invention, it can be designed as a suitable combination of a bipolar transistor having a small capacitance between collectors, capable of high-speed operation and free from soft errors caused by alpha rays, and a field effect transistor having a small stray capacity and free from latch-up phenomenon or the like. It is therefore possible to provide an integrated circuit capable of high-speed operation and having various advantages as an SOI.

When a light-transmissive substrate represented by glass is used as an insulating substrate, a semiconductor device can be constructed by transferring a good-quality monocrystalline Si layer to the light-transmissive substrate (e.g., glass substrate having transparent $SiO_2$ as a main component). It is thereby possible to provide high-performance driving device indispensable to a contact sensor or a projection type liquid crystal image display.

Referring now to silicon as an example of semiconductor materials, the present invention is described in detail, but the semiconductor material in the present invention is not limited to silicon at all.

In porous Si layer, according to observation by transmission electron microscopy, pores with diameters of about 600 angstroms on an average are formed, and despite the fact that their density is half or lower as compared with monocrystalline silicon, monocrystallinity is maintained. Monocrystal refers to a crystalline solid such that, when calling attention on an optional crystal axis, its direction is the same at any part of the sample, and the porous layer used in the present invention, although having pores therethrough, the crystal axis in the crystalline region is the same in the direction at any part, thus being monocrystalline. And, epitaxial growth of a monocrystalline Si layer onto the porous layer is possible. However, at a temperature of 1000° C. or higher, rearrangement of the atoms positioned around the inner pores takes place, whereby the characteristics of accelerated chemical etching may be sometimes impaired. For this reason, in the present invention, for epitaxial growth of Si layer, there may be suitably used the crystal growth method capable of low temperature growth such as molecular beam epitaxial growth, plasma CVD, low pressure CVD method, photo CVD, bias sputtering method, liquid phase growth method, etc.

Since the porous layer has a large amount of voids formed internally thereof, its density can be reduced to half or lower. As the result, the surface area per unit volume (specific surface area) can be dramatically increased, and therefore its chemical etching rate is remarkably accelerated as compared with that of the etching rate of conventional non-porous monocrystalline layer. The present invention utilizes the two above-mentioned characteristics of the semiconductor as made porous, namely the fact that single crystallinity is maintained and a non-porous semiconductor monocrystal can therefore be epitaxially grown on the semiconductor substrate as made porous, and the fact that etching rate is remarkably,more rapid as compared with non-porous monocrystal, whereby a non-porous semiconductor monocrystalline layer of high quality can be formed on a substrate having an insulating material surface within a short time.

The porous layer can be more readily formed on a P-type Si layer than an N-type Si layer for the following reason. First, a porous Si was discovered by Uhlir et al. in the research process of electrolytic polishing of semiconductor in 1956 (A. Uhlir, Bell Syst. Tech. J., vol. 35, p. 333 (1956))

Unagami et al. studied the dissolving reaction of Si in anodization, and has reported that positive holes are necessary for the anodic reaction of Si in an HF solution, and the reaction is as follows (T. Unagami, J. Electrochem. Soc., vol. 127, p. 476 (1980)).

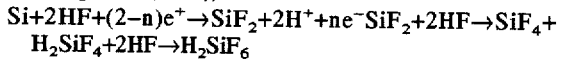

or

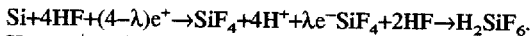

Here, $e^+$ and $e^-$ represent a positive hole and an electron, respectively. n and $\lambda$ are respectively numbers of positive holes necessary for dissolving one atom of silicon, and it has been postulated that porous silicon is formed when satisfying the condition of n>2 or X>4.

For the reasons mentioned above, the P-type silicon in which positive holes exist will be more readily made porous than the N-type silicon of the opposite characteristic. Selectivity in such pore structure formation has been verified by Nagano et al. (Nagano, Nakajima, Yasuno, Ohnaka, Kajiwara; Denshi Tsushin Gakkai Gijutsu Kenkyu Hokoku, vol. 79, SSD 79-9549 (1979)) and Imai (K. Imai; Solid-State Electronics, vol. 24, 159 (1981)). However, depending on the conditions, the N-type silicon can be also made porous.

Referring now to the drawings, the present invention is described in more detail.

Embodiment 1

Description is made about the process for obtaining a semiconductor substrate by making porous all of a P-type substrate and permitting a monocrystalline layer to be epitaxially grown.

As shown in FIG. 1A, first a P-type Si monocrystalline substrate is provided, and all of it is made porous. According to the crystal growth method capable of low temperature growth as mentioned above, epitaxial growth is effected on the substrate surface as made porous to form a thin film monocrystalline layer 22. The above P-type Si substrate is made porous by the anodization method by use of an HF solution. The porous Si layer 21 can be varied in its density to a range of 1.1 to 0.6 g/cm³ by varying the HF solution concentration to 50 to 20% as compared with the density 2.33 g/cm³ of the monocrystalline Si.

Figure 1B:
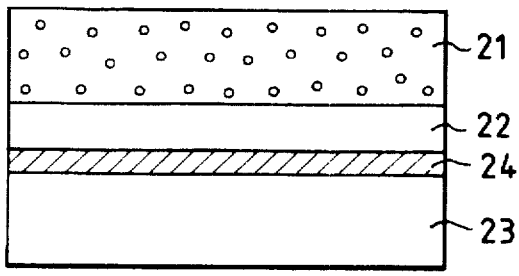
Figure 1C:
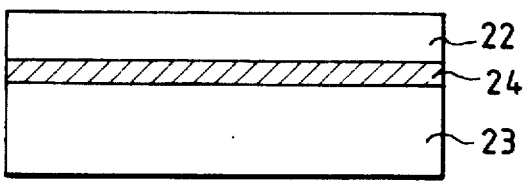

Subsequently, as shown in FIG. 1B, by providing another Si substrate 23 and after forming an oxidized layer 24 on its surface, the Si substrate 23 having the oxidized layer 24 on the surface is bonded onto the surface of the monocrystalline layer 22 on the porous Si substrate 21. Then, as shown in FIG. 1C, the porous Si substrate 21 is all etched away to form a thin film-like monocrystalline silicon layer 22 remaining on the SiO₂ layer 24. In the present invention, since the porous semiconductor layer is etched away without the application of the oxidation treatment on the porous semiconductor layer, the oxidation swelling of the porous semiconductor layer can be prevented, whereby the influence of distortion on the monocrystalline layer as epitaxially grown can be prevented. According to this method, the monocrystalline Si layer 22 equal to silicon wafer in crystallinity is formed flat and yet uniformly thinly over the whole wafer region with a large area on the oxidized Si layer 24 which is an insulating material. The semiconductor substrate thus obtained can be suitably used also with respect to preparation of an insulation separated electronic device.

Here, the thickness of the non-porous semiconductor crystalline layer to be formed on the porous semiconductor substrate may be desirably made preferably 50 μm or less, more preferably 20 μm or less, for forming a thin film semiconductor device on the above semiconductor monocrystalline layer.

Bonding between the above non-porous semiconductor monocrystal and the substrate having the insulating material surface should be preferably performed in an atmosphere of nitrogen, an inert gas or a gas mixture of these, or in an atmosphere containing an inert gas or nitrogen, and further desirably under heated state.

As the etchant for selectively etching the above semiconductor substrate as made porous with the non-porous semiconductor monocrystalline layer as bonded onto the substrate having the insulating material surface being left to remain, for example, there may be employed etchants such as aqueous sodium hydroxide solution, aqueous potassium hydroxide solution, hydrofluoric acid-nitric acid-acetic acid mixed solution, etc.

The substrate having an insulating material which can be used in the present invention may be one with at least its surface being constituted of an insulating material, or one with all of the substrate being constituted of an insulating material. Examples of the substrate with the surface being constituted of an insulating material may include monocrystalline or polycrystalline silicon substrates having the surface oxidized, electroconductive or semiconductive substrates having a layer of an insulating material such as oxide, nitride, boride, etc. formed on the surface, etc. Specific examples of the substrates wholly constituted of an insulating material may include substrates comprising insulating materials such as fused silica glass, sintered alumina, etc.

Meanwhile, in the present Embodiment 1, an example of forming a non-porous semiconductor monocrystalline layer on a porous semiconductor substrate has been shown, but the present invention is not limited only to the mode of the Embodiment 1 as described above, but a porous semiconductor substrate having a non-porous semiconductor monocrystalline layer may also be formed by applying a pore forming treatment on a substrate having a monocrystalline layer comprising a material which can be made porous with difficulty (e.g. N-type silicon) and a layer comprising a material which can be readily made porous (e.g. P-type silicon).

Also, in the step of removing the porous semiconductor substrate by etching, the substrate may be also coated with an etching preventive material except for the porous semiconductor substrate during etching so that the non-porous semiconductor monocrystalline layer and the substrate having the insulating material surface may not be deleteriously influenced by the etchant.

The non-porous monocrystalline layer on the insulating material thus formed can be one having $5.0 \times 10^{-4}$ sec or longer in terms of the life time of carriers, having remarkably less crystal defect such as through dislocation, etc. and also being extremely small in distribution of the layer thickness of the semiconductor monocrystalline layer. Specifically, the dislocation defect density becomes $2 \times 10^4/cm^2$ or less, and concerning the layer thickness of the semiconductor monocrystalline layer, within the range of the area of the semiconductor monocrystalline layer from 20 $cm^2$ to 500 $cm^2$ (2 inches wafer to 10 inches wafer), the difference between the maximum value and the minimum value of the thickness of the semiconductor monocrystalline layer can be suppressed below 10% or less based on the maximum value.

In the following, other embodiments are shown.

Embodiment 2

Referring now to FIGS. 2A to 2D, Embodiment 2 is described in detail.

Figure 2A:
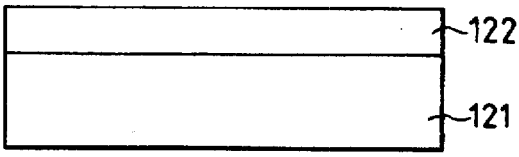

First, as shown in FIG. 2A, a low impurity concentration layer 122 is formed by epitaxial growth according to various thin film growth methods. Alternatively, protons may be ion implanted into the surface of the P-type Si monocrystalline substrate 121 to form an N-type monocrystalline layer 122.

Figure 2B:
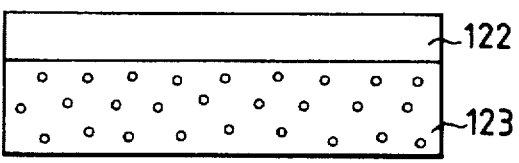

Next, as shown in FIG. 2B, the back surface of the P-type monocrystalline substrate 121 is denatured into a porous Si substrate 123 according to the anodization method by use of an HF solution. The porous Si layer 123 can be varied in its density to a range of 1.1 to 0.6 g/cm$^3$ by varying the HF solution concentration within the range of 50 to 20% as compared with the density of the monocrystalline Si of 2.33 g/cm$^3$. The porous layer, as described above, is formed on the P-type substrate.

Figure 2C:
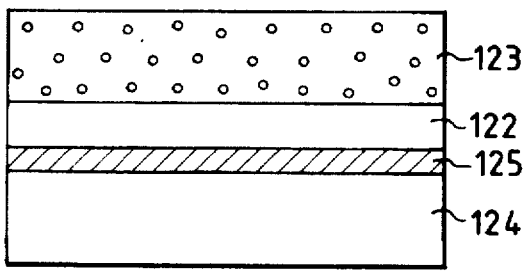

As shown in FIG. 2C, by providing another Si substrate 124 and after forming an oxidized layer 125 on its surface, the Si substrate 124 having the oxidized layer 125 on its surface is bonded to the surface of the monocrystalline Si layer 122 on the porous Si substrate 123.

Then, the porous Si substrate 123 is all etched to leave a monocrystalline silicon layer 122 as thin film on the SiO$_2$ layer 125, thereby forming a semiconductor substrate.

According to this process, the monocrystalline Si layer 122 equal in crystallinity to silicon wafer is formed on the oxidized layer 125 which is an insulating material to be flat and to be yet made uniformly into thin layer, over the whole wafer region with a large area.

The semiconductor substrate thus obtained can be used suitably also with respect to preparation of an insulation separated electronic device.

The above Embodiment 2 is an example of the process of forming an N-type layer on a P-type substrate before pore formation, and then making selectively only the P-type substrate porous by anodization. Also in the present Embodiment, a semiconductor substrate having a semiconductor substrate having a semiconductor monocrystalline layer with the same performances as Embodiment 1 can be obtained.

Embodiment 3

Figure 3A:
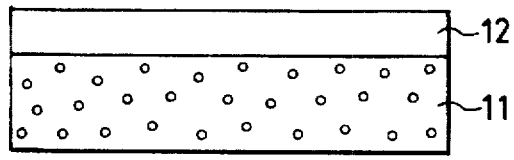

As shown in FIG. 3A, first a P-type Si monocrystalline substrate is prepared and all of it is made porous. According to various growth methods, epitaxial growth is effected on the substrate surface made porous to form a thin film monocrystalline layer 12.

Figure 3B:
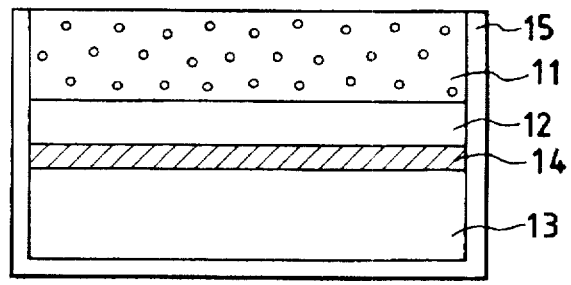

As shown in FIG. 3B, by preparing another Si substrate 13 and after forming an oxidized layer 14 on its surface, the Si substrate having the oxidized layer 14 on the surface is bonded to the surface of the monocrystalline Si layer 12 on the porous Si substrate 11.

Next, as shown in FIG. 3B, and Si$_3$N$_4$ layer 15 is deposited to cover over the whole of the bonded two silicon wafers as the anti-etching film.

Figure 3C:
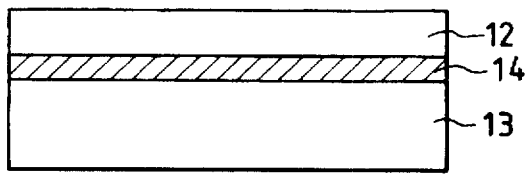

Subsequently, as shown in FIG. 3C, the Si$_3$N$_4$ layer on the surface of the porous silicon substrate is removed. As another anti-etching film material, Apiezon Wax may be also employed in place of Si$_3$N$_4$. Then, the porous Si substrate 11 is all etched and a monocrystalline silicon layer 12 made into a thin film remains on the SiO$_2$ layer 14 to form a semiconductor substrate.

FIG. 3C shows a semiconductor substrate obtained in the present invention. More specifically, by removing the Si$_3$N$_4$ layer 15 as the anti-etching film in FIG. 3B, a monocrystalline Si layer 12 of which crystallinity is equal to that of bulk wafer is formed through the SiO$_2$ layer 14 which is an insulating substance on the Si substrate 13, flat and yet uniformly into a thin layer, over the whole wafer region with a large area. The semiconductor substrate thus obtained can be used suitably also with respect to preparation of a discrete insulated electronic device. Also in the present Embodiment, a semiconductor substrate having a semiconductor monocrystalline layer with the same performances as Embodiment 1 can be obtained.

Embodiment 4

Figure 4A:
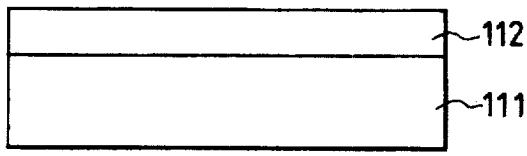
Figure 4B:
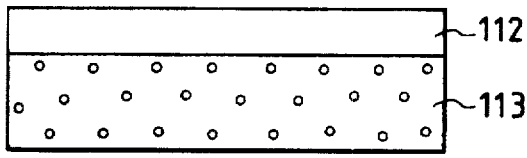

Referring now to FIGS. 4A to 4B, the Embodiment 4 of the present invention is described below in detail.

First, as shown in FIG. 4A, a low impurity concentration layer 112 is formed by epitaxial growth according to various thin film growth methods. Alternatively, protons may be ion-implanted into the surface of the P-type Si monocrystalline substrate 111 to form an N-type monocrystalline layer 112.

Next, as shown in FIG. 4B, the back surface of the P-type monocrystalline substrate 111 is denatured into a porous Si substrate 113 according to the anodization method by use of an HF solution. The porous Si layer 113 can be varied in its density to a range of 1.1 to 0.6 g/cm$^3$ by varying the HF solution concentration to 50 to 20% as compared with the density of the monocrystalline Si of 2.33 g/cm$^3$. The porous layer 113, as described above, is formed from the P-type substrate.

Figure 4C:
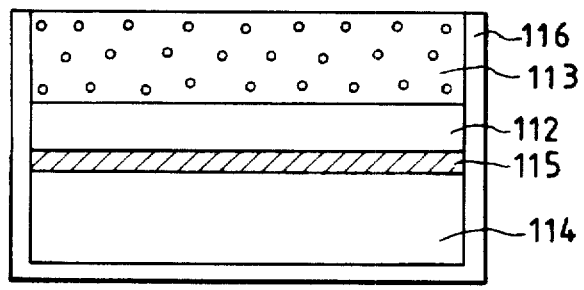

As shown in FIG. 4C, by preparing another Si substrate 114 and after forming an oxidized layer 115 on its surface, the Si substrate 114 having the oxidized layer 115 on the surface is bonded on the surface of the monocrystalline Si layer 112 on the porous Si substrate 113.

Figure 4D:
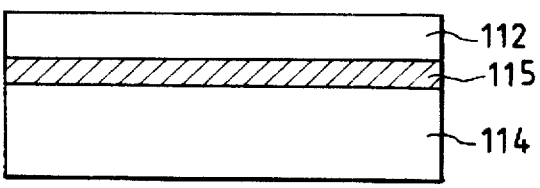

Here, as shown in FIG. 4C, as the anti-etching film 116, an $Si_3N_4$ layer 116 is deposited to cover the whole of the bonded two silicon wafers as the anti-etching film. Subsequently, as shown in FIG. 4C, the $Si_3N_4$ layer on the surface of the porous silicon substrate is removed. As another anti-etching film 116, a material excellent in etching resistance such as Apiezon Wax may be also employed in place of $Si_3N_4$. Then, the porous Si substrate 113 is all etched to form a semiconductor substrate by retaining a monocrystalline silicon layer 112 made into a thin film on the $SiO_2$ layer 115. FIG. 4D shows a substrate having the semiconductor layer obtained in the present invention. That is, by removing the $Si_3N_4$ layer 116 as the anti-etching film 116 shown in FIG. 4C, a monocrystalline Si layer 112 is formed on the $SiO_2$ layer 115 which is the insulating material, flat and yet uniformly into a thin layer, over the whole wafer region with a large area.

The semiconductor thus obtained will not be deleteriously affected by the etchant, and can be used suitably also with respect to preparation of a discrete insulated electronic device.

Also, the semiconductor substrate obtained in the present Embodiment has the same performances as that obtained in Embodiment 1.

Embodiment 5

Figure 5A:
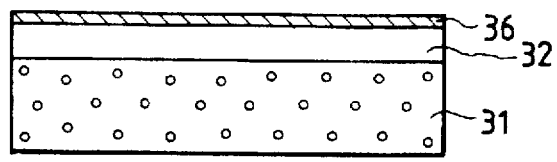

As shown in FIG. 5A, first, a P-type Si monocrystalline substrate is prepared and all of it is made porous. A thin film monocrystalline layer 32 is formed by effecting epitaxial growth on the substrate surface made porous according to various growth methods.

Figure 5B:
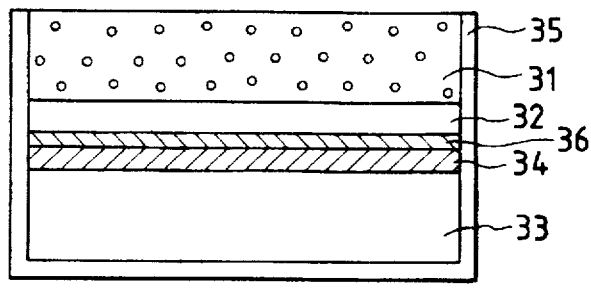
Figure 5C:
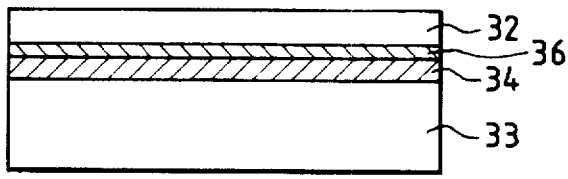

As shown in FIG. 5B, by preparing another Si substrate 33 and after forming an oxidized layer 34 on its surface, the Si substrate 33 having the oxidized layer 34 on the surface is bonded to the surface of the oxidized layer 36 formed on the monocrystalline Si layer 32 on the porous substrate 31. The bonding step is practiced by closely contacting the cleaned surfaces with each other, followed by heating in an inert gas atmosphere or nitrogen atmosphere. The oxidized layer 34 is formed in order to reduce the interface level of the non-porous monocrystalline layer 32 which is the final active layer. As shown in FIG. 5B, an $Si_3N_4$ layer 35 is deposited as the anti-etching film to be coated on the bonded two silicon wafers as a whole. Subsequently, as shown in FIG. 5C, the $Si_3N_4$ layer 35 on the surface of the porous silicon substrate 31 is removed. As another anti-etching film material, Apiezon Wax, etc. may be also employed in place of $Si_3N_4$. Then all of the porous Si substrate 31 is etched to have the monocrystalline silicon layer 32 made into a thin film remaining on the $SiO_2$ layer, thereby forming a semiconductor substrate.

FIG. 5C shows the substrate having the semiconductor layer obtained in the present invention. More specifically, by removing the $Si_3N_4$ layer 35 as the anti-etching film shown in FIG. 5B, the monocrystalline Si layer 32 equal in crystallinity to silicon wafer is formed through the $SiO_2$ layers 34 and 36 on the Si substrate 33, flat and yet uniformly into a thin layer, over the whole wafer region with a large area. The semiconductor substrate thus obtained can be used suitably also with respect to preparation of a discrete insulated electronic device. Also, the semiconductor substrate obtained in the present Embodiment has the same performances as that obtained in Embodiment 1.

Embodiment 6

Referring now to FIGS. 6A to 6D, the Embodiment 6 of the present invention is described below in detail.

Figure 6A:
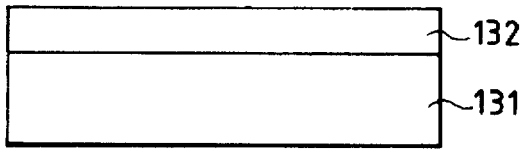

First, as shown in FIG. 6A, a low impurity concentration layer 132 is formed by epitaxial growth according to various thin film growth methods. Alternatively, the surface of the P-type Si monocrystalline substrate 131 is subjected to ion implantation of protons to form an N-type monocrystalline layer 132.

Figure 6B:
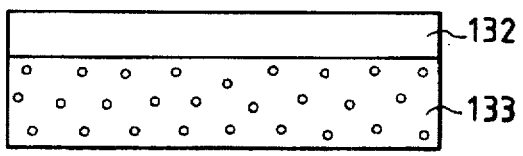

Next, as shown in FIG. 6B, the P-type Si monocrystalline substrate 131 is denatured from the back surface to a porous Si substrate 133 by the anodization method with an HF solution. The porous Si layer 133 can be varied in its density in the range of 1.1 to 0.6 $g/cm^3$ by varying the HF solution concentration to 50 to 20% as compared with the density of the monocrystalline Si of 2.33 $g/cm^3$. The porous layer, as described above, is formed from the p-type substrate.

Figure 6C:
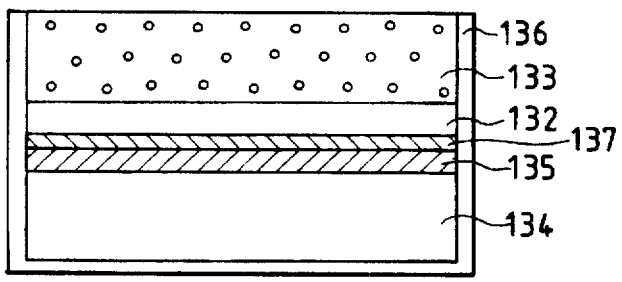

As shown in FIG. 6C, by preparing another Si substrate 134 and after forming an oxidized layer 135 on its surface, the Si substrate 134 having the oxidized layer 135 is bonded onto the surface of the oxidized layer 137 formed on the monocrystalline Si layer 132 on the porous Si substrate 133.

Figure 6D:
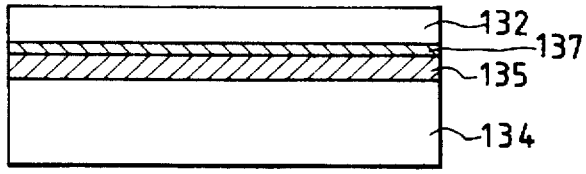

Subsequently, as the anti-etching film 136, an $Si_3N_4$ layer 136 is deposited to be coated on the bonded two silicon wafers as a whole. Then, as shown in FIG. 6D, the $Si_3N_4$ layer 136 on the surface of the porous silicon substrate 133 is removed. Then the porous Si substrate 131 is all chemically etched to have a monocrystalline silicon layer made into a thin film remaining on the $SiO_2$ layers 135 and 137, thereby forming a semiconductor substrate.

The semiconductor substrate thus obtained is excellent in adhesion between the respective layers, and can be also used with respect to preparation of an isolation separated electronic device. Also, the semiconductor substrate obtained in the present Embodiment has the same performances as that obtained in Embodiment 1.

Embodiment 7

Figure 7A:
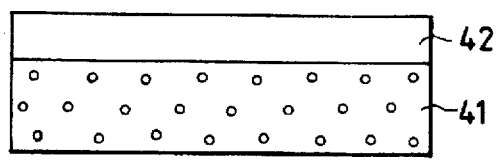
Figure 7B:
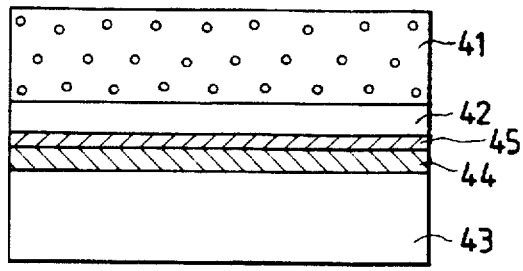
Figure 7C:
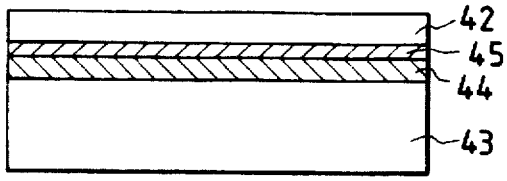

As shown in FIG. 7A, first, a P-type Si monocrystalline substrate is prepared and all of it is made porous. According to various growth methods, epitaxial growth is effected on the substrate surface made porous to form a thin film monocrystalline layer 42. As shown in FIG. 7B, by preparing another Si substrate 43 and after forming an oxidized layer 44 on its surface, the Si substrate 43 having the above oxidized layer 44 on the surface is bonded onto the surface of the oxidized layer 45 formed on the monocrystalline Si layer 42 on the porous Si substrate 41. This bonding step is practiced by closely contacting cleaned surfaces with each other, followed by heating in an inert gas atmosphere or nitrogen atmosphere. The oxidized layer 44 is formed in order to reduce the interface level of the monocrystalline layer 42 which is the active layer as the final semiconductor. As shown in FIG. 7C, the porous Si substrate 41 is all etched to have the monocrystalline silicon layer made into a thin film on the $SiO_2$ layers 44 and 45, thereby forming a semiconductor substrate. FIG. 7C shows the semiconductor substrate obtained in the present invention.

A monocrystalline Si layer 42 equal in crystallinity to silicon wafer is formed through the $SiO_2$ layers 44 and 45 on the Si substrate 43, flat and yet uniformly into a thin layer, over the whole wafer region with a large area. The semiconductor substrate thus obtained can be also used suitably as seen from the standpoint of preparation of an isolation separated electron device. Also, the semiconductor substrate obtained in the present embodiment has the same performances as that obtained in Embodiment 1.

Embodiment 8

Referring now to FIGS. 8A to 8D, the Embodiment 8 of the present invention is described below in detail.

Figure 8A:
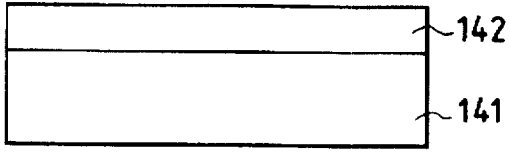

First, as shown in FIG. 8A, a low impurity concentration layer 142 is formed by epitaxial growth according to various thin film growth methods. Alternatively, the surface of the P-type Si monocrystalline substrate 141 is subjected to ion implantation of protons to form an N-type monocrystalline layer 142.

Figure 8B:
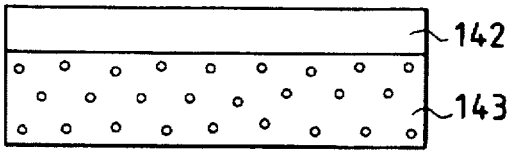

Next, as shown in FIG. 8B, the P-type Si monocrystalline substrate 141 is denatured from the back surface to a porous Si substrate 143 by the anodization method with an HF solution. The porous Si layer 143 can be varied in its density in the range of 1.1 to 0.6 g/cm³ by varying the HF solution concentration to 50 to 20% as compared with the density of the monocrystalline Si of 2.33 g/cm³. The porous layer, as described above, is formed on the P-type substrate 141.

Figure 8C:
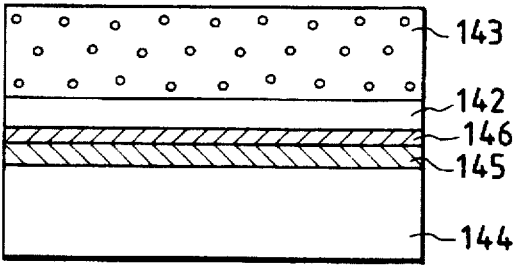

As shown in FIG. 8C, by preparing another Si substrate 144 and after forming an oxidized layer 145 on its surface, the Si substrate 144 having the oxidized layer 145 is bonded onto the surface of the oxidized layer 146 formed on the monocrystalline Si layer 142 on the porous Si substrate 143.

Then the porous Si substrate is all chemically etched to have a monocrystalline silicon layer made into a thin film remaining on the SiO₂ layers 145 and 146, thereby forming a semiconductor substrate.

Figure 8D:
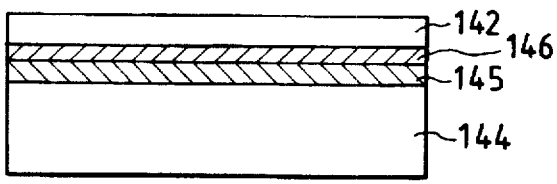

FIG. 8D shows the semiconductor substrate obtained in the present invention. A monocrystalline Si layer 142 equal in crystallinity to silicon wafer is formed through the SiO₂ layers 145 and 146 on the Si substrate 144, flat and yet uniformly into a thin layer, over the whole wafer region with a large area.

The semiconductor substrate thus obtained can be also used suitably with respect to preparation of an isolation separated electronic device. Also, the semiconductor substrate obtained in the present Embodiment has the same performances as that obtained in Embodiment 1.

Embodiment 9

Figure 9A:
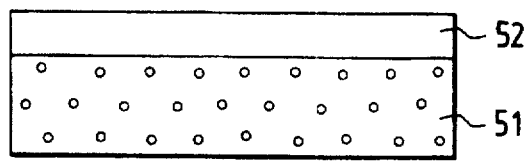

As shown in FIG. 9A, first, a P-type Si monocrystalline substrate is prepared, and all of it is made porous. According to various growth methods, epitaxial growth is effected on the surface of the substrate 51 made porous to form a thin film monocrystalline layer 52.

Figure 9B:
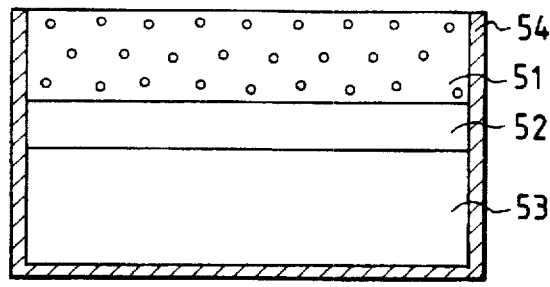

As shown in FIG. 9B, a light-transmissive substrate 53 represented by glass is prepared and the light-transmissive substrate 53 is bonded onto the surface of the monocrystalline Si layer 52 on the porous Si substrate 51.

Figure 9C:
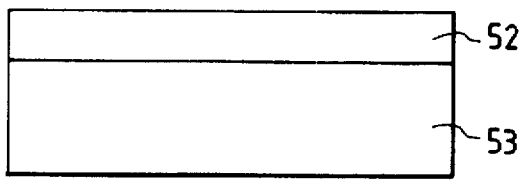

Here, as shown in FIG. 9B, as the anti-etching film 54, an Si₃N₄ layer 54 is deposited to be coated on the bonded two substrates as a whole. Subsequently, as shown in FIG. 9C, the Si₃N₄ layer 54 on the surface of the porous silicon substrate is removed. Then, the porous Si substrate 51 is all etched away to have a monocrystalline silicon layer 52 made into a thin film remaining on the light-transmissive substrate 53, thereby forming a semiconductor substrate. FIG. 9C shows the semiconductor substrate obtained in the present invention.

The semiconductor substrate thus obtained can be also used suitably as seen from the standpoint of preparation of an electronic device isolation separated with a light-transmissive insulating material. Also, the semiconductor obtained in the present Embodiment has the same performances as that obtained in Embodiment 1.

Embodiment 10

Referring now to FIGS. 10A to 10D, the Embodiment 10 of the present invention is described below in detail.

Figure 10A:
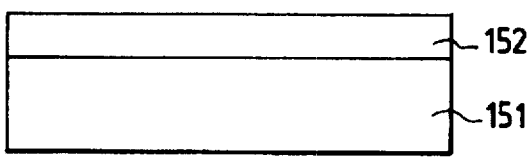

First, as shown in FIG. 10A, a low impurity concentration layer 152 is formed by epitaxial growth according to various thin film growth methods. Alternatively, the surface of the P-type Si monocrystalline substrate 151 is subjected to ion implantation of protons to form an N-type monocrystalline layer 152.

Figure 10B:
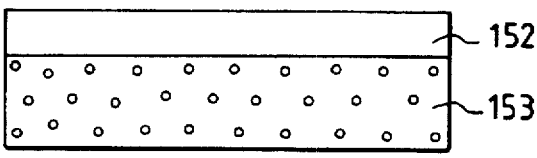

Next, as shown in FIG. 10B, the P-type Si monocrystalline substrate 151 is denatured from the back surface to a porous Si substrate 153 by the anodization method with an HF solution. The porous Si layer 153 can be varied in its density in the range of 1.1 to 0.6 g/cm³ by varying the HF solution concentration to 50 to 20% as compared with the density of the monocrystalline Si of 2.33 g/cm³. The porous layer 153, as described above, is formed on the P-type substrate 151.

Figure 10C:
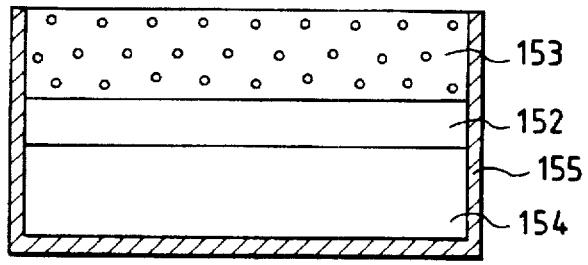
Figure 10D:
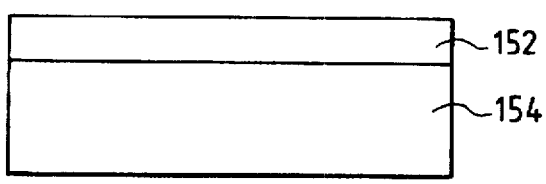

As shown in FIG. 10C, after preparing a light-transmissive substrate 154, onto the surface of the monocrystalline Si layer 152 on the porous Si substrate 153 is bonded the light-transmissive substrate 154. Then, as shown in FIG. 10C, as an anti-etching film 155, an Si₃N₄ layer, etc. is deposited to be coated on the bonded two substrates as a whole. Subsequently, as shown in FIG. 10D, the Si₃N₄ layer 155 on the surface of the porous silicon substrate 153 is removed. Then, the porous Si substrate 153 is all etched away to have the monocrystalline silicon layer 152 made into a thin film remaining on the light-transmissive substrate 154, thereby forming a semiconductor substrate.

FIG. 10D above the semiconductor substrate obtained in the present invention. It is the monocrystalline Si layer 152 equal in crystallinity to silicon wafer formed on the light-transmissive substrate 154, flat and yet uniformly into a thin layer, over the whole wafer region with a large area.

The semiconductor substrate thus obtained can be also used suitably with respect to preparation of an isolation separated electronic device with a light-transmissive insulating material. Also, the semiconductor substrate obtained in the present Embodiment has the same performances as that obtained in Embodiment 1.

Embodiment 11

Figure 11A:
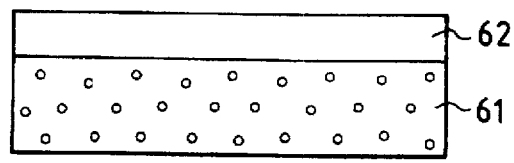

As shown in FIG. 11A, first a P-type Si monocrystalline substrate is prepared, and all of it is made porous. According to various growth methods, epitaxial growth is effected on the surface of the substrate 61 made porous to form a thin film monocrystalline layer 62.

Figure 11B:
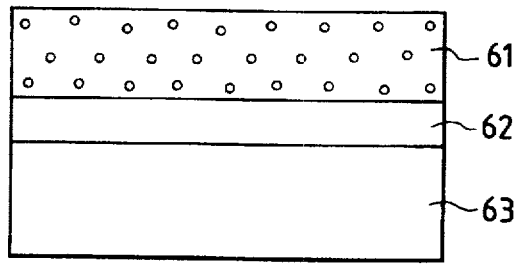

As shown in FIG. 11B, a light-transmissive substrate 63 represented by glass is prepared and the light-transmissive substrate 63 is bonded to the surface of the monocrystalline Si layer 62 on the porous Si substrate 61.

Then, the porous Si substrate 61 is all etched to have the monocrystalline silicon layer 62 made into a thin film remaining on the light-transmissive substrate 63, thereby forming a semiconductor substrate.

Figure 11C:
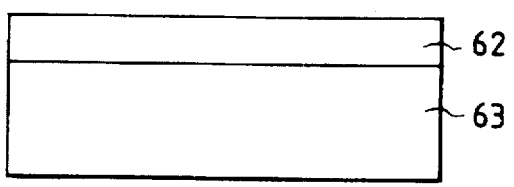

FIG. 11C shows the semiconductor substrate obtained in the present invention. It is the monocrystalline Si layer 62 equal in crystallinity to silicon wafer formed on the light-transmissive substrate 63, flat and yet uniformly into a thin layer, over the whole wafer region with a large area. The semiconductor thus obtained can be also suitably used with respect to preparation of an electronic device isolation separated with a light-transmissive insulating material.

Embodiment 12

Referring now to FIGS. 12A to 12D, the Embodiment 12 of the present invention is described below in detail.

Figure 12A:
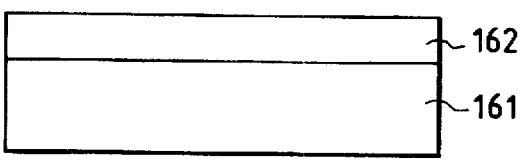

First, as shown in FIG. 12A, a low impurity concentration layer 162 is formed by epitaxial growth according to various thin film growth methods.

Alternatively, the surface of the P-type Si monocrystalline substrate 161 is subjected to ion implantation of protons to form an N-type monocrystalline layer 162.

Figure 12B:
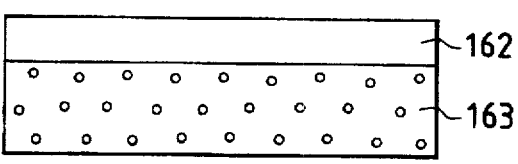

Next, as shown in FIG. 12B, the P-type Si monocrystalline substrate 161 is denatured from the back surface to a porous Si substrate 163 by the anodization method with an HF solution. The porous Si layer 163 can be varied in its density in the range of 1.1 to 0.6 g/cm$^3$ by varying the HF solution concentration to 50 to 20% as compared with the density of the monocrystalline Si of 2.33 g/cm$^3$. The porous layer 163, as described above, is formed on the P-type substrate 161.

Figure 12C:
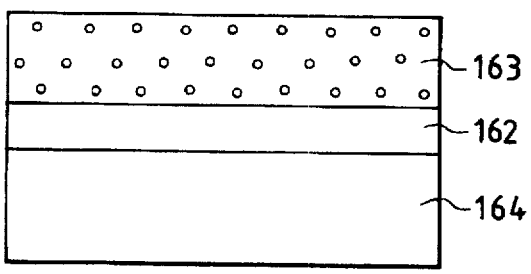

As shown in FIG. 12C, after preparing a light-transmissive substrate 164, onto the surface of the monocrystalline Si layer 162 on the porous Si substrate 163 is bonded the light-transmissive substrate 164. As shown in FIG. 12C, the porous Si substrate 163 is all etched away to have the monocrystalline silicon layer 162 made into a thin film remaining on the light-transmissive substrate 164, thereby forming a semiconductor substrate.

Figure 12D:
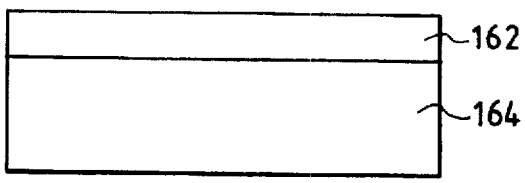

FIG. 12D shows the semiconductor substrate obtained in the present invention. It is the monocrystalline Si layer 162 equal in crystallinity to silicon wafer formed on the light-transmissive substrate 164, flat and yet uniformly into a thin layer, over the whole wafer region with a large area.

The semiconductor substrate thus obtained can be also used suitably with respect to preparation of an isolation separated electronic device with a light-transmissive insulating material. Also, the semiconductor substrate obtained in the present Embodiment has the same performances as that obtained in Embodiment 1.

Embodiment 13

Figure 13A:
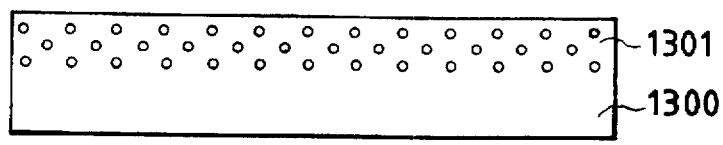
Figure 13B:
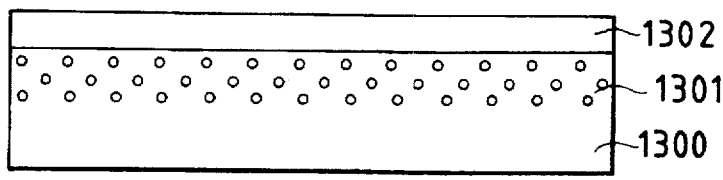
Figure 13C:
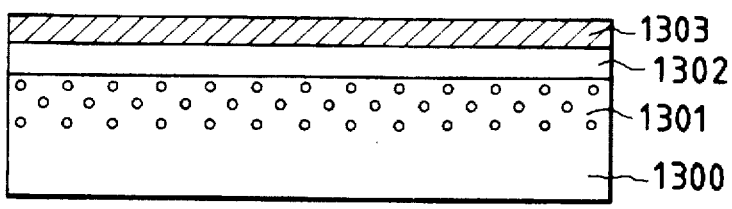

This Embodiment is described by referring to FIGS. 13A to 13F. As shown in FIG. 13A, first a porous region 1301 is formed on a part of a Si monocrystalline substrate 1300. Subsequently, a thin film Si monocrystalline layer 1302 is formed according to various crystal growth methods on the porous region 1301 (FIG. 13B). On the thin film Si monocrystalline layer 1302 is formed an oxidized film 1303 (FIG. 13C).

Figure 13D:
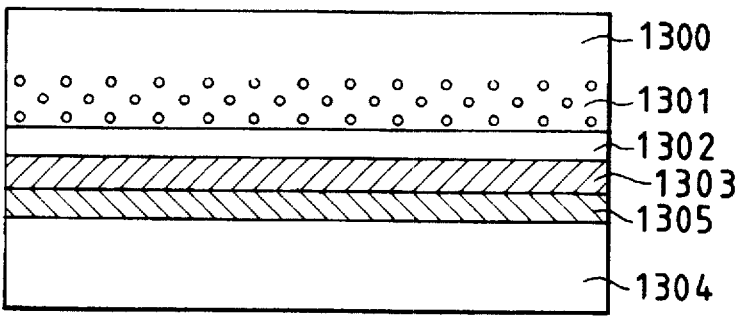

The oxidized film 1305 formed on the surface of another Si substrate 1304 is bonded to the above oxidized film 1303 (FIG. 13D).

Figure 13E:
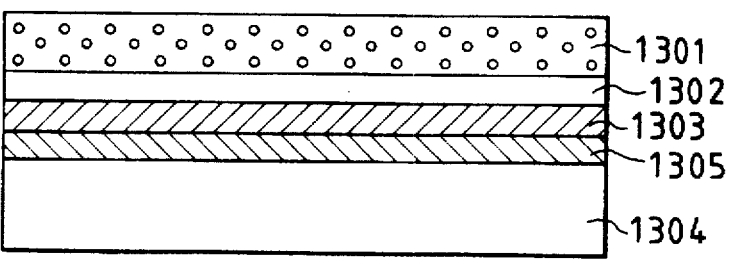

Subsequently, the Si monocrystalline substrate 1300 remaining without being made porous is removed by mechanical polishing or etching to have the porous region 1301 exposed (FIG. 13E).

Figure 13F:
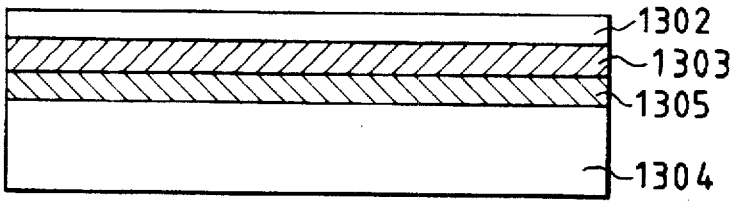

The porous region 1301 is etched away to form a semiconductor substrate having a thin film Si monocrystalline layer on an insulating material (FIG. 13F).

When such step is employed, the time required for making the substrate porous can be shortened and also the time for etching away the porous Si substrate can be shortened, whereby substrate formation can be effected highly efficiently.

It is also possible to bond the thin film Si monocrystalline layer 1302 directly to the oxidized film 1305 without forming the oxidized film 1303 shown in FIG. 13, and it is also possible to bond an insulating substrate such as glass, etc. in place of the oxidized film 1305 formed on the Si substrate 1304.

Also, the respective steps in the Embodiments 1 to 12 can be incorporated in the present Embodiment.

The semiconductor substrate thus obtained has the same excellent performances as those of the semiconductor substrate obtained in Embodiments 1 to 12.

Embodiment 14

Figure 14:
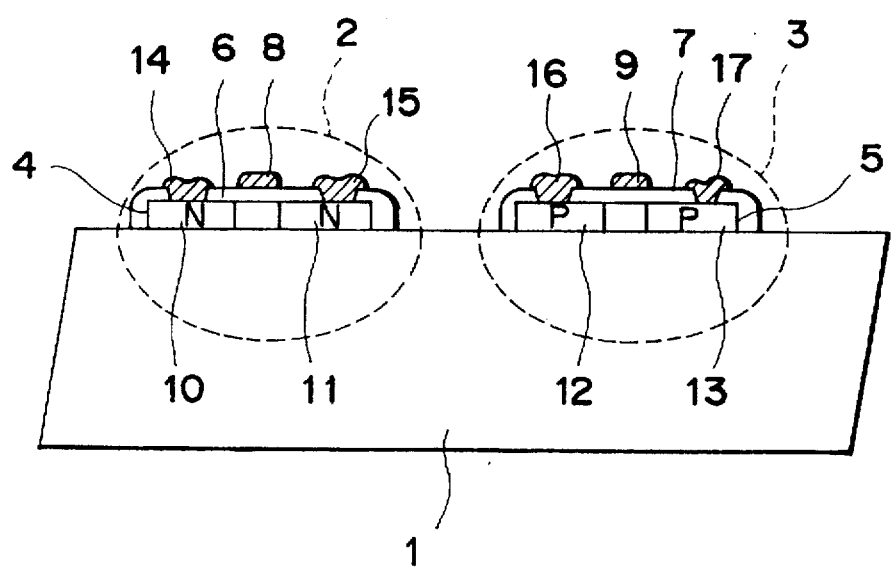
FIGS. 14 through 16 are schematic illustrations showing examples of the semiconductor device of the present invention.

FIG. 14 is a schematic illustration of an example of the semiconductor device in accordance with the present invention. Substrate 1 shown in FIG. 14 is a light-transmissive substrate (serving as a light-transmissive base) of $SiO_2$ formed by selectively removing porous Si.

N-channel field effect transistor 2, and P-channel field effect transistor 3 are formed on the substrate 1, and these two transistors are connected to form a complementary field effect type semiconductor device.

The steps of forming a monocrystalline semiconductor layer on the light-transmissive substrate in the process for forming transistors 2 and 3 will be described below with reference to FIGS. 3A to 3C and FIGS. 10A to 10D.

FIGS. 3A to 3C and FIGS. 10A and 10D are schematic section views of steps of the process for manufacturing a semiconductor substrate in accordance with the present invention.

The process of growing a monocrystalline layer by epitaxial growth after making the Si-P type substrate entirely porous will first be described below. As shown in FIG. 3A, a silicon monocrystalline substrate is first prepared and is made porous to form a porous Si monocrystalline substrate 11, and epitaxial growth is effected by any of various growing methods on the surface of the substrate which has been made porous to form a thin-film monocrystalline layer 12. The Si substrate is made porous by anodization method using an HF solution.

Next, a shown in FIG. 3B, a light-transmissive substrate 13 represented by a glass substrate is prepared, the surface of the monocrystalline Si layer on the porous Si substrate is oxidized, and the light-transmissive substrate 13 is thereafter bonded to the oxidized layer 14. This oxidized layer has an important role in forming the device. That is, as the interface level generated at the subbing interface of the Si active layer, the interface level of the oxide film interface in accordance with the present invention can be smaller than that of the glass interface, so that the characteristics of the electronic device can be greatly improved. As shown in FIG. 3B, an anti-etching film, e.g., $Si_3N_4$ layer 15 is formed by deposition to entirely cover the two substrates bonded to each other, and the $Si_3N_4$ layer on the surface of the porous silicon substrate is removed. As another example of the etching prevention film, Apiezon Wax film may be used instead of the $Si_3N_4$ layer. Thereafter, the porous Si substrate 11 is entirely removed by a means such as etching, so that the monocrystalline silicon layer 12 formed as a thin film is left on the light-transmissive substrate 13.

FIG. 3C shows a semiconductor substrate obtained in accordance with the present invention. That is, monocrystalline Si layer 12 equivalent to a silicon wafer in crystallinity is formed as a flat and uniform thin layer on light-transmissive substrate 13 by removing the $Si_3N_4$ layer formed as an anti-etching film. Use of the semiconductor substrate obtained in this manner is advantageous in terms of dielectric isolated electronic devices as well.

Another process will be described below with reference to FIGS. 10A to 10D.

First, as shown in FIG. 10A, a low-impurity-density layer 152 is formed on a high-density silicon monocrystal substrate 151 by epitaxial growth based on any of various thin-film growth methods. Alternatively, portions are implanted into the surface of a P-type Si monocrystal substrate 151 to form an N-type monocrystal layer 152.

Next, as shown in FIG. 10B, the P-type Si monocrystal substrate 151 is processed on the reverse side by an anodization method using an HF solution to be changed into a porous Si substrate 153. The density of this porous Si layer can be changed in the range of 1.1 to 0.6 g/cm$^3$ by changing the HF solution concentration by 50 to 20%, compared with the density of the monocrystalline Si being 2.33 g/cm$^3$. This porous layer is formed as a P-type substrate as mentioned above.

As shown in FIG. 10C, a light-transmissive substrate 154 is prepared and bonded to the surface of the monocrystalline Si layer on the porous Si substrate. As shown in FIG. 10C, the porous Si substrate 153 is etched and removed, so that monocrystalline silicon layer formed as a thin film is left on the light-transmissive substrate formed by the present invention.

The above method is a method of forming an N-type layer before the porous structure formation and, thereafter, selectively making only the P-type substrate porous by anodization.

Next, the monocrystalline thin layer 12 or 152 formed in this manner on the surface of the light-transmissive substrate is separated into islands by partial oxidation or etching, as shown in FIG. 14. P-type impurity ions and N-type impurity ions are independently implanted into the monocrystalline silicon island (4 in FIG. 14) for forming an N-channel transistor (2 in FIG. 14) and the monocrystalline silicon island (5 in FIG. 14) for forming a P-channel transistor (3 in FIG. 14), respectively.

Then, gate insulating film (6 and 7 in FIG. 14) is formed on each monocrystalline silicon layer (4 and 5 in FIG. 14), and polycrystalline silicon gate electrodes (8 and 9 in FIG. 14) are formed by patterning.

Source and drain regions are formed by using the polycrystalline silicon gate electrodes as a mask and implanting impurity ions in a self alignment manner. More specifically, N-type impurity ions are implanted with respect to the N-channel transistor (2 in FIG. 14) to form a source region (10 in FIG. 14) and a drain region (11 in FIG. 14), and P-type impurity ions are implanted with respect to the P-channel transistor (3 in FIG. 14) to form a source region (12 in FIG. 14) and a drain region (13 in FIG. 14). Source and drain electrodes (14, 15, 16, and 17 in FIG. 14) are formed by metallic film deposition and patterning, thereby completing devices. The devices are connected by thin-film electrodes to form a complementary field effect transistor.

In this example, devices can be formed on a silicon monocrystal layer formed on a light-transmissive substrate and having a very small amount of defects. It is thereby possible to manufacture an insulated gate type field effect transistor having reduced source and drain stray capacities, and to provide a semiconductor device capable of high-speed operation, free from a latch-up phenomenon or the like and having improved radiation resistance characteristics.

A selective etching process for etching only porous Si by non-electrolytic wet chemical etching will not be described below.

Hydrofluoric acid, buffered hydrofluoric acid, a mixture of hydrofluoric acid or buffered hydrofluoric acid and hydrogen peroxide solution, a mixture of hydrofluoric acid or buffered hydrofluoric acid and an alcohol, a mixture of hydrofluoric acid or buffered hydrofluoric acid and hydrogen peroxide solution and an alcohol, or the like can be suitably used as an etchant having no etching action on crystalline Si and capable of selectively etching only porous Si.

FIGS. 29 to 36 are graphs showing the etching time dependency of the etched depth of the porous Si and monocrystalline Si layers by being immersed in these various types of etchants. As etchants, FIG. 29 corresponds to a 49% hydrofluoric acid, FIG. 30 a mixture of 49% hydrofluoric acid and hydrogen peroxide solution (1:5), FIG. 31 a mixture of 49% hydrofluoric acid and an alcohol (10:1), FIG. 32 a mixture of 49% hydrofluoric acid, an alcohol and hydrogen peroxide solution (10:6:50), FIG. 33 a buffered hydrofluoric acid liquid, FIG. 34 a mixture of buffered hydrofluoric acid and a hydrogen peroxide solution (1:5), FIG. 35 a mixture of buffered hydrofluoric acid and an alcohol (10:1), and FIG. 36 a mixture of buffered hydrofluoric acid, an alcohol and hydrogen peroxide solution (10:6:50). The etchants containing an alcohol were immersed without stirring, while the etchants containing no alcohol were immersed with stirring.

Porous Si was formed by anodizing monocrystalline Si under the conditions shown below. The starting material of porous Si formed by anodization is not limited to monocrystalline Si, and Si having other crystalline structures can be used.

Applied Voltage: 2.6 (V)
Current density: 30 (mA.cm$^2$)
Anodization solution: HF:H$_2$O:C$_2$H$_5$OH=1:1:1
Time: 2.4 (hours)
Thickness of porous Si: 300 (μm)
Porosity: 56%

Porous Si formed under these conditions was immersed in the above-described various etching liquids at room temperature.

Figure 29:
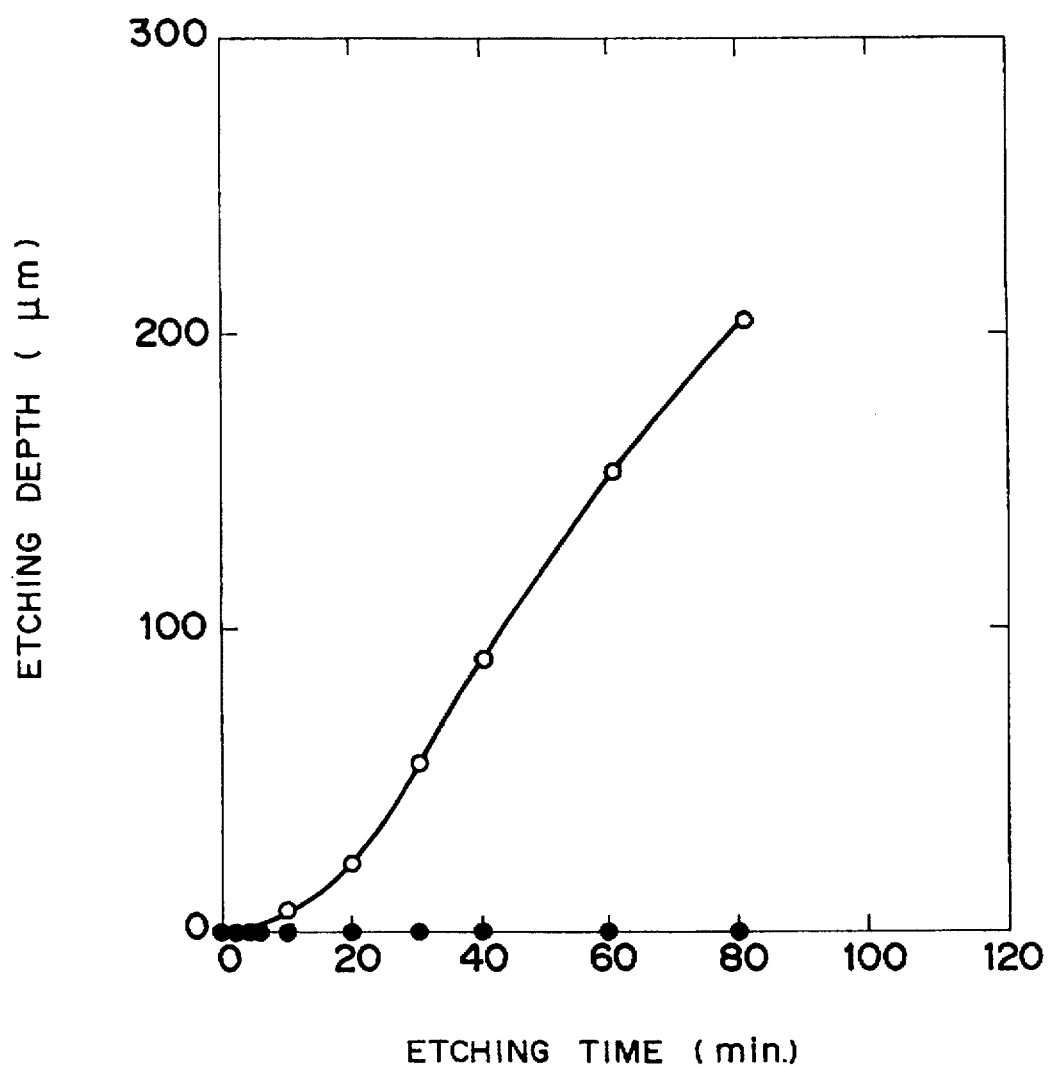
FIGS. 29 through 36 are graphs showing characteristics of etching of porous Si and non-porous Si.

The reduction in the thickness of porous Si was measured with respect to the sample processed by being immersed in the 49% hydrofluoric acid while stirring the liquid (white circles in FIG. 29). It was thereby found that porous Si was etched rapidly, that is, it was uniformly etched to 90 μm in about 40 minutes and to 205 μm in 80 minutes while having an improved surface property.

Figure 30:
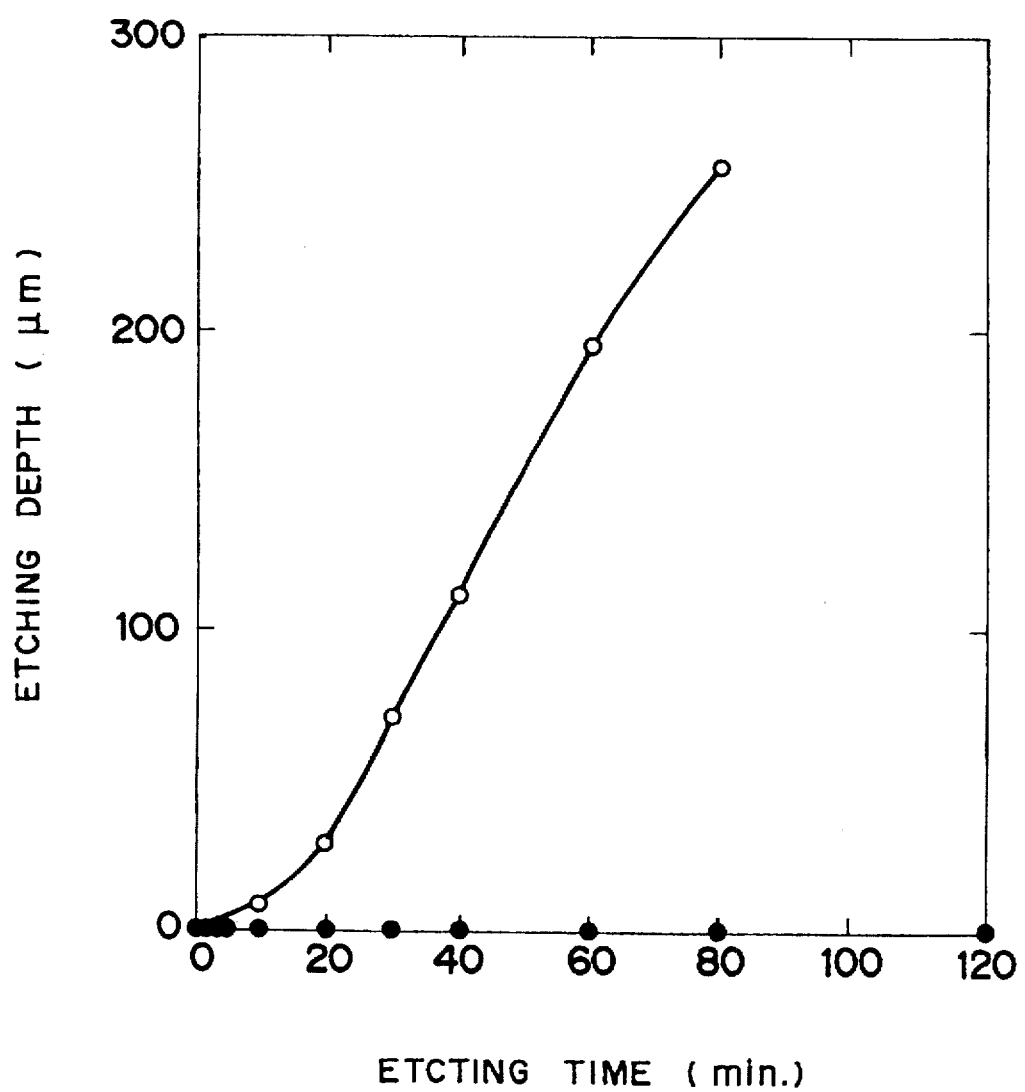

The reduction in the thickness of porous Si was measured with respect to the sample processed by being immersed in the mixture of 49% hydrofluoric acid and hydrogen peroxide solution (1:5) while stirring the mixture (white circles in FIG. 30). It was found that porous Si was etched rapidly, that is, it was uniformly etched to 112 μm in about 40 minutes and to 256 μm in 80 minutes while having an improved surface property.

Figure 31:
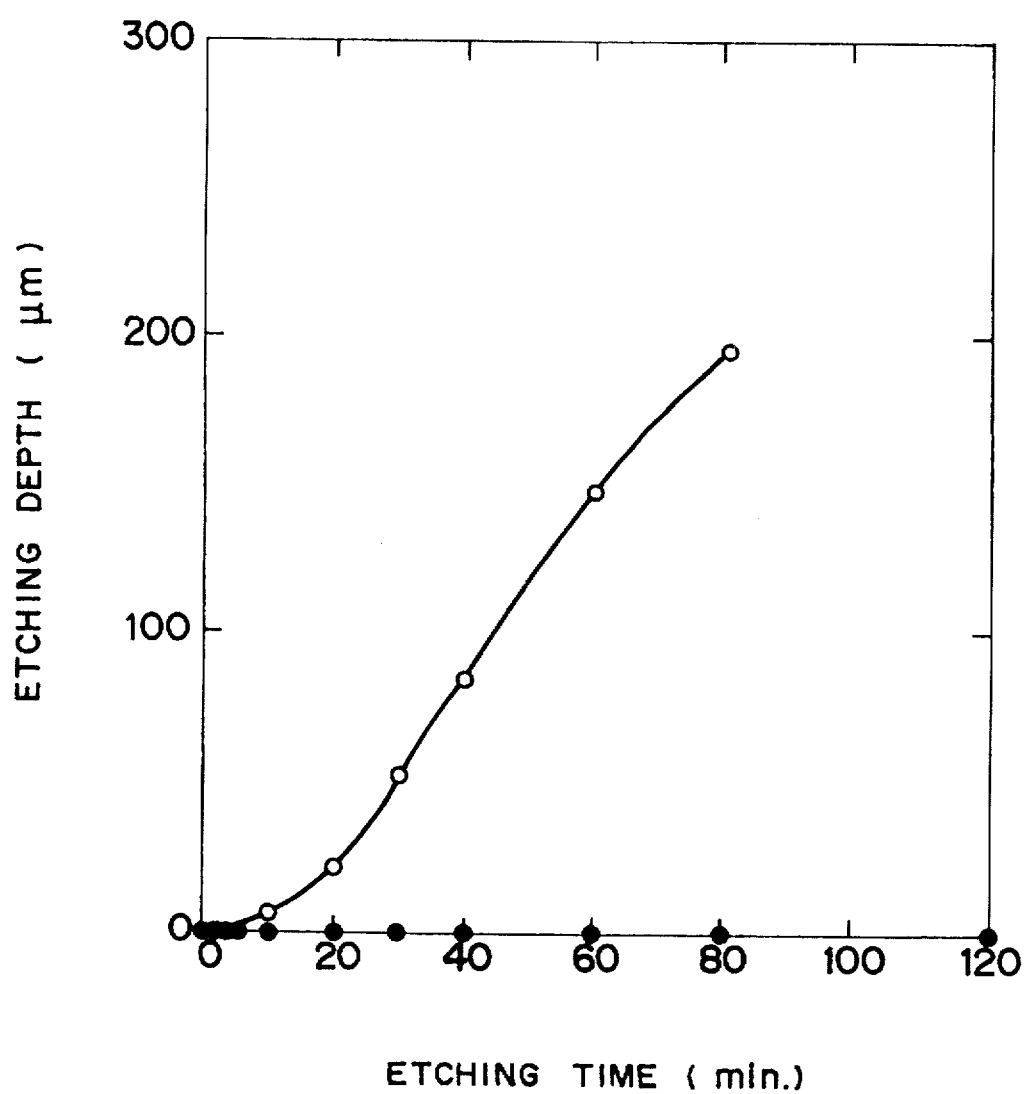

The reduction in the thickness of porous Si was measured with respect to the sample processed by being immersed in the mixture of 49% hydrofluoric acid and an alcohol (10:1) without stirring (white circles in FIG. 31). It was found that porous Si was etched rapidly, that is, it was uniformly etched to 85 μm in about 40 minutes and to 195 μm in 80 minutes while having an improved surface property.

Figure 32:
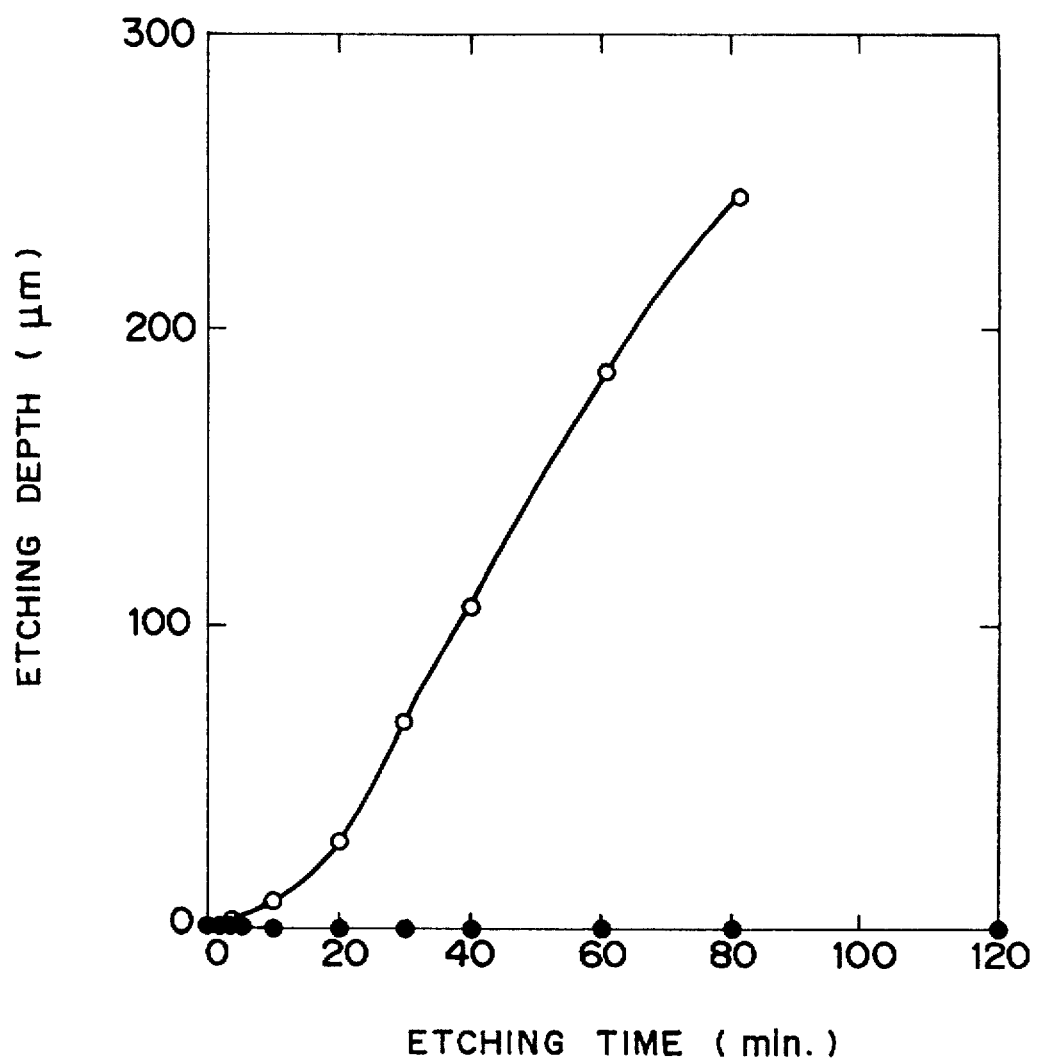

The reduction in the thickness of porous Si was measured with respect to the sample processed by being immersed in the mixture of 49% hydrofluoric acid, an alcohol and hydrogen peroxide solution (10:6:50) without stirring (white circles in FIG. 32). It was found that porous Si was etched rapidly, that is, it was uniformly etched to 107 μm in about 40 minutes and to 244 μm in 80 minutes while having an improved surface property.

Figure 33:
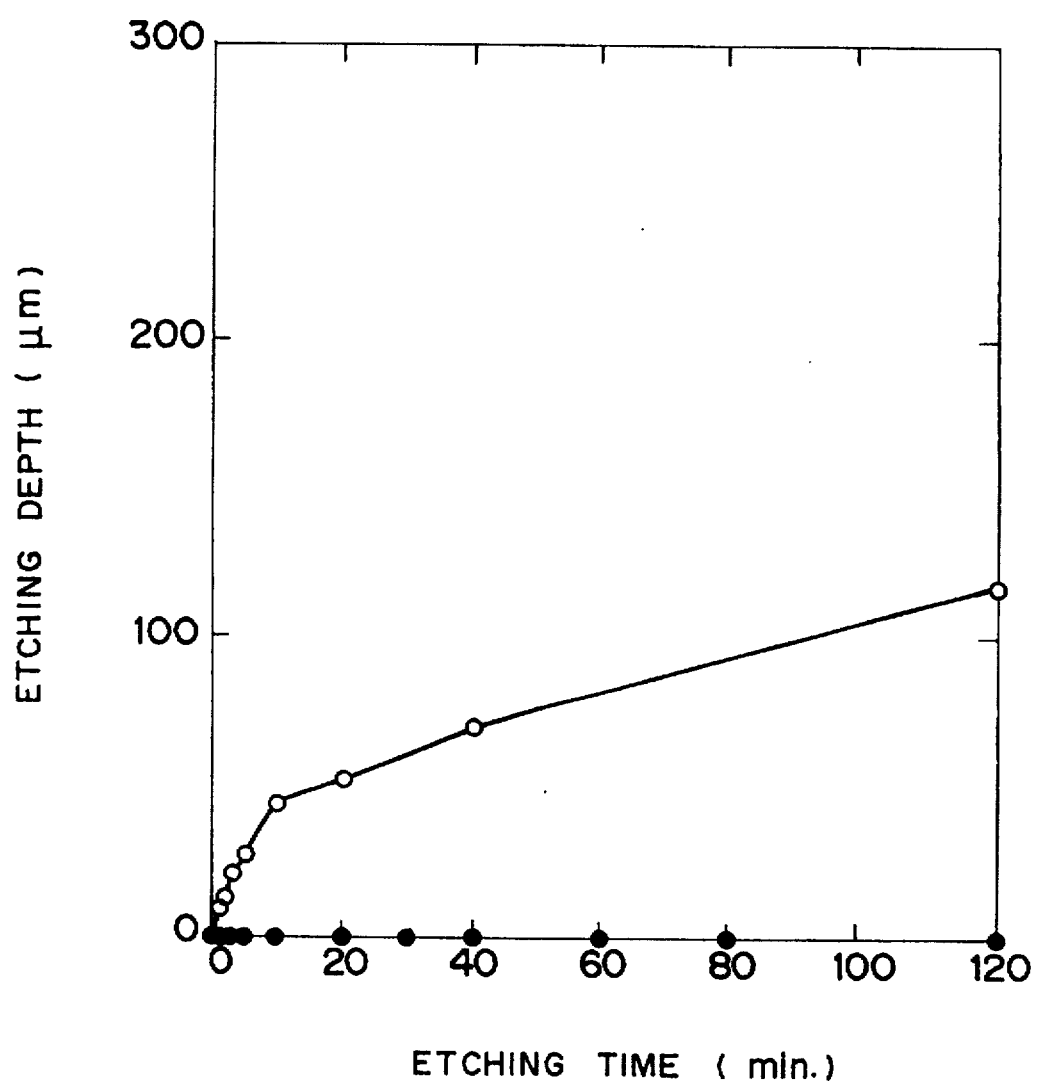

The reduction in the thickness of porous Si was measured with respect to the sample processed by being immersed in the buffered hydrofluoric acid while stirring the liquid (white circles in FIG. 33). It was found that porous Si was etched rapidly, that is, it was uniformly etched to 70 µm in about 40 minutes and to 118 µm in 120 minutes while having an improved surface property.

Figure 34:
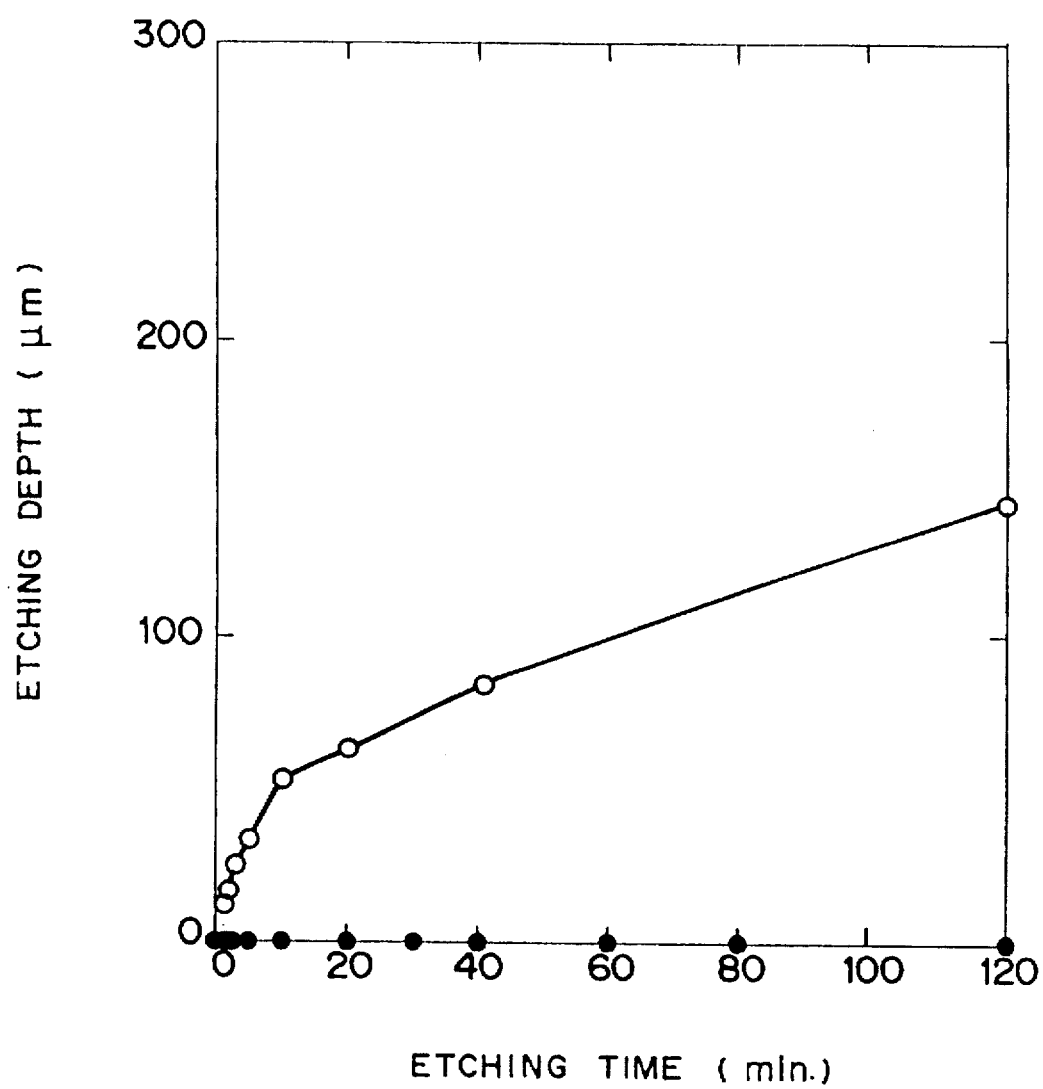

The reduction in the thickness of porous Si was measured with respect to the sample processed by being immersed in the mixture of buffered hydrofluoric acid and hydrogen peroxide solution (1:5) while stirring the mixture (white circles in FIG. 34). It was found that the porous Si was etched rapidly, that is, it was uniformly etched to 88 µm in about 40 minutes and to 147 µm in 120 minutes while having an improved surface property.

Figure 35:
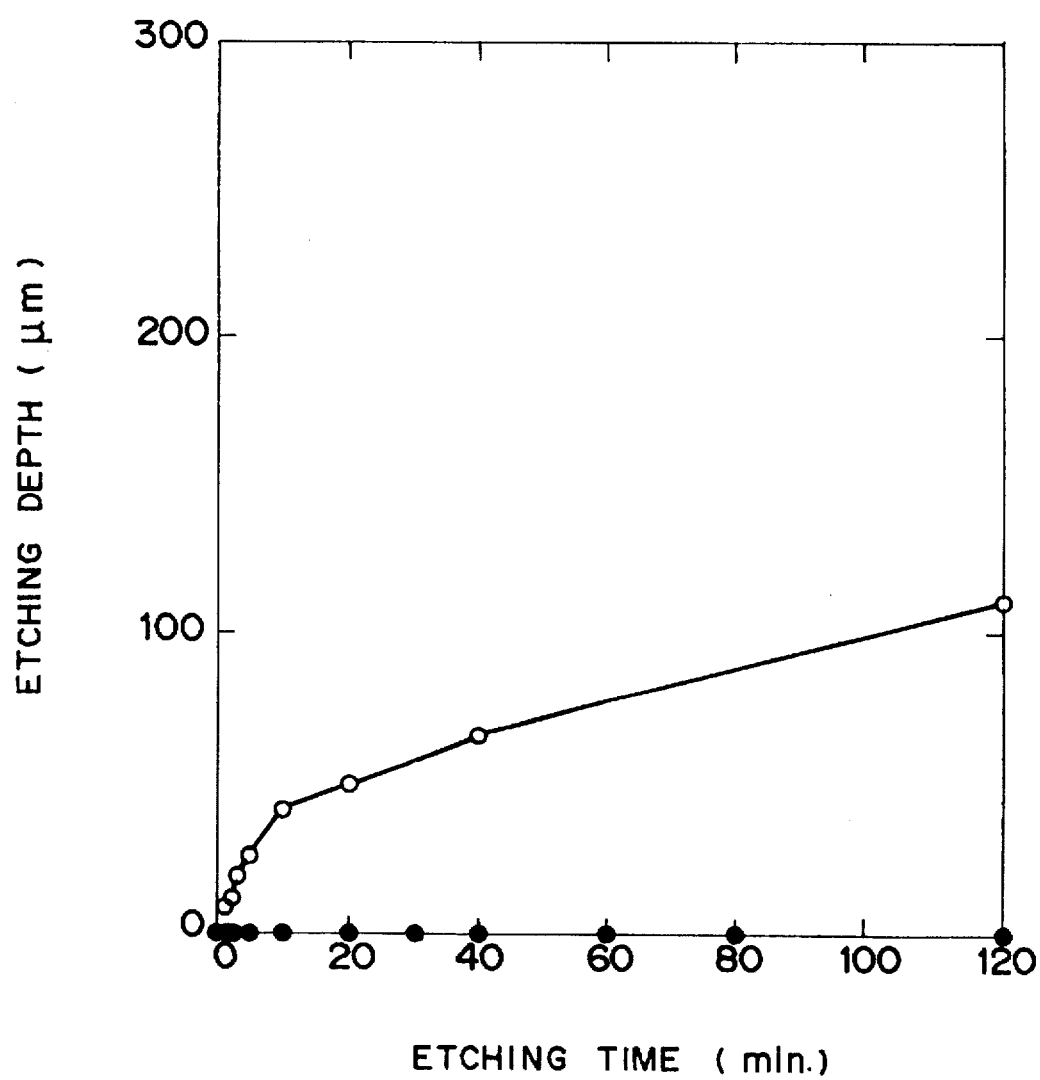

The reduction in the thickness of porous Si was measured with respect to the sample processed by being immersed in the mixture of buffered hydrofluoric acid and an alcohol (10:1) without stirring (white circles in FIG. 35). It was found that porous Si was etched rapidly, that is, it was uniformly etched to 67 µm in about 40 minutes and to 112 µm in 120 minutes while having an improved surface property.

Figure 36:
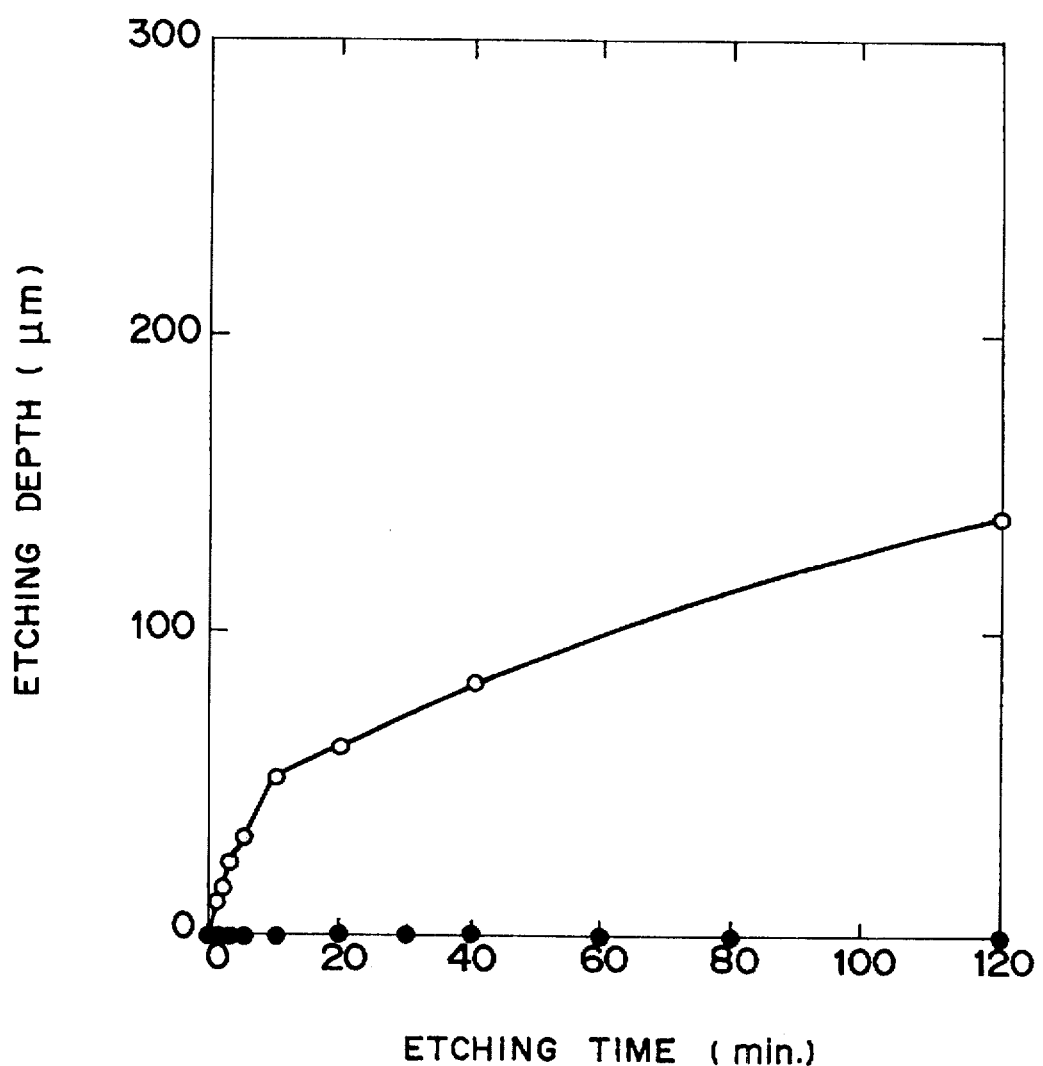

The reduction in the thickness of porous Si was measured with respect to the sample processed by being immersed in the mixture of buffered hydrofluoric acid, an alcohol and hydrogen peroxide solution (10:6:50) without agitating the liquid (white dots in FIG. 36). It was found that porous Si was etched rapidly, that is, it was uniformly etched to 83 µm in about 40 minutes and to 140 µm in 120 minutes while having an improved surface property.

The concentration of hydrogen peroxide solution was 30% in this example. However, it is set to a level such that there is practically no difficulty in performing the manufacturing process while the effect of the addition of hydrogen peroxide solution described below is ensured. As buffered hydrofluoric acid, aqueous solution of 36.2% ammonium fluoride ($NH_4F$) water solution and 4.46% hydrogen fluoride (HF) is used.

The etching rate depends upon the concentrations of hydrofluoric acid, buffered hydrofluoric acid and hydrogen peroxide solution and the temperature. The addition of hydrogen peroxide solution enables an increase in the silicon oxidation rate and, hence, an increase in the reaction rate in comparison with an etching liquid containing no hydrogen peroxide solution. It is also possible to change the reaction rate by changing the proportion of hydrogen peroxide solution. The addition of alcohol enables bubbles of a reactive gas generated by etching to be instantly removed from the etched surface without stirring and also enables porous Si to be uniformly etched at a high efficiency.

The concentration and temperature conditions of the etchant are selected to set the etching rate to a level such that there is practically no difficulty in performing the manufacturing process while the effects of hydrofluoric acid, buffered hydrofluoric aced, hydrogen peroxide solution and alcohol are ensured.

The above-mentioned solution concentrations and room temperature are selected by way of example, and the present invention is not limited to these conditions.

The HF concentration in the buffered hydrofluoric acid is set in the range of, preferably 1 to 95%, more preferably 1 to 85% and most preferably 1 to 70% based on the etching solution. The $NH_4F$ concentration in the buffered hydrofluoric acid is set in the range of, preferably 1 to 95%, more preferably 5 to 90% and most preferably 5 to 80% based on the etching solution.

The HF concentration is set in the range of, preferably 1 to 95%, more preferably 5 to 90% and most preferably 5 to 80% based on the etching solution.

The $H_2O_2$ concentration is set to, preferably 1 to 95%, more preferably 5 to 90% and most preferably 10 to 80% based on the etching solution and in a range such that the above-described effect of hydrogen peroxide solution is obtained.

The alcohol concentration is set to, preferably 80% or less, more preferably 60% or less and most preferably 40% or less based on the etching solution and in a range such that the above-described effect of alcohol is obtained.

The temperature is set in the range of, preferably 0° to 100°, more preferably 5° to 80° and most preferably 5° to 60°.

As an alcohol used in accordance with the present invention, alcohols such as ethyl alcohol, isopropyl alcohol or the like which are capable of achieving the above-described effect of the addition of alcohol and have no difficulty in performing the manufacturing process in practice may be used.

Also, non-porous Si having a thickness of 500 µm was immersed in the above-described various etchants at room temperature. Thereafter, the reduction in the thickness of the non-porous Si was measured. The non-porous Si was etched to an extent of 100 Å or less even after treatment for 120 minutes.

After etching, the porous Si and the non-porous Si were washed with water, and the surfaces thereof were analyzed in a microanalysis manner by using secondary ions. No impurities were thereby detected.

Embodiment 15

Figure 15:
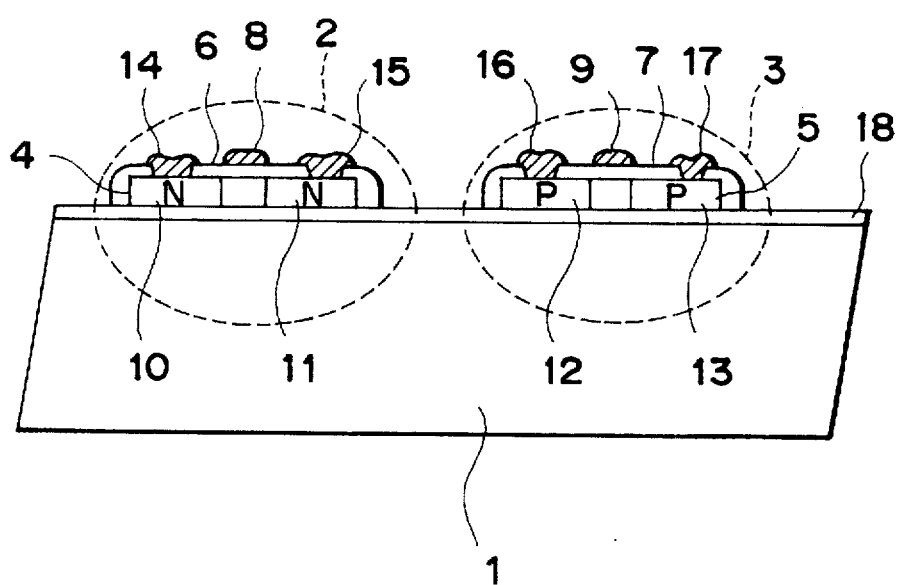

FIG. 15 is a schematic illustration of an example of the semiconductor device in accordance with the present invention. The complementary field effect type semiconductor device shown in FIG. 15 has generally the same construction as the complementary field effect type semiconductor device shown in FIG. 14 except that a silicon substrate 1 having $SiO_2$ layer (18 in FIG. 15) formed on its surface by selectively removing porous Si is used.

The steps of forming the monocrystalline semiconductor layer of the semiconductor device shown in FIG. 15 on an insulating substrate will be described below with reference to FIGS. 2A to 2D and FIGS. 7A to 7C.

FIGS. 2A to 2D and FIGS. 7A to 7C are schematic sectional views of steps of the process for manufacturing a semiconductor substrate in accordance with the present invention.

The steps shown in FIGS. 7A to 7C will first be described below.

As shown in FIG. 7A, a silicon monocrystal substrate is first prepared and is made porous to form a porous Si monocrystal substrate 41, and epitaxial growth is effected by any of various growing methods on the surface of the substrate which has been made porous to form a thin-film monocrystalline layer 42. The Si substrate is made porous by anodization method using an HF solution.

Next, as shown in FIG. 7B, a substrate 43 having an insulating layer 44 on its surface is prepared, the surface of the monocrystalline Si layer on the porous Si substrate is oxidized, and the insulating substrate 43 is thereafter bonded to the oxidized layer 45. This oxidized layer has an important role in forming the device. That is, with respect to the interface level generated at the subbing interface of the Si active layer, the interface level of the oxide film interface in accordance with the present invention can be lower than that of the directly-bonded interface, so that the characteristics of the electronic device can be greatly improved. After bonding, the porous Si substrate 41 is entirely removed by a means such as etching, so that the monocrystalline solution layer 42 formed as a thin film is left on the insulating substrate 43.

FIG. 7C shows a semiconductor substrate obtained in accordance with the present invention. That is, monocrystalline Si layer 42 equivalent to a silicon wafer in crystallinity is formed as a flat and uniform thin layer on insulating substrate 43. Use of the semiconductor substrate obtained in this manner is advantageous in terms of manufacture of dielectric-isolated electronic devices as well.

Another example will be described below with reference to FIGS. 2A to 2D.

First, as shown in FIG. 2A, a low-impurity-density layer 122 is formed on a high-density silicon monocrystal substrate 121 by epitaxial growth based on any of various thin-film growth methods. Alternatively, protons are implanted into the surface of a P-type monocrystal substrate 121 to form an N-type monocrystal layer 122.

Next, as shown in FIG. 2B, the P-type Si monocrystalline substrate 121 is processed on the reverse side by an anodization method using an HF solution to be changed into a porous Si substrate 123.

Next, as shown in FIG. 2C, an insulating substrate 124 having an insulating layer 125 formed on its surface is prepared and bonded to the surface of the monocrystalline Si layer on the porous Si substrate. As shown in FIGS. 2C, the porous Si substrate 123 is etched and removed, so that monocrystalline silicon layer formed as a thin film is left on the insulating substrate.

Figure 2D:
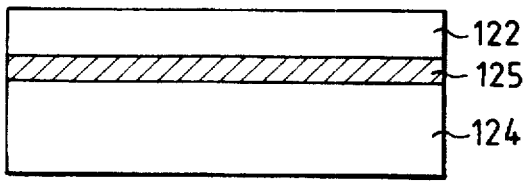

FIG. 2D shows a semiconductor substrate formed by the present invention. That is, monocrystalline Si layer 122 equivalent to a silicon wafer in crystallinity is formed as a flat and uniform thin layer on the insulating substrate 124 over a large area of the whole wafer region.

Use of the semiconductor substrate obtained in this manner is advantageous in terms of manufacture of dielectric-isolated electronic elements as well.

Next, the monocrystalline thin layer on the surface of the insulating substrate formed in this manner is separated into islands by partial oxidation or etching, as shown in FIG. 15. P-type impurity ions and N-type impurity ions are independently implanted into the monocrystalline silicon island (4 in FIG. 15) for forming an N-channel transistor (2 in FIG. 15) and the monocrystalline silicon island (5 in FIG. 15) for forming a P-channel transistor (3 in FIG. 15), respectively.

Then, gate insulating film (6 and 7 in FIG. 15) is formed on each separated monocrystalline silicon layer (4 and 5 in FIG. 15), and polycrystalline silicon gate electrodes (8 and 9 in FIG. 15) are formed by patterning.

Source and drain regions are formed by using the polycrystalline silicon gate electrodes as a mask and implanting impurity ions in a self alignment manner. N-type impurity ions are implanted with respect to the N-channel transistor (2 in FIG. 15) to form a source region (10 in FIG. 15) and drain region (11 in FIG. 15), and P-type impurity ions are implanted with respect to the P-channel transistor (3 in FIG. 15) to form a source region (12 in FIG. 15) and a drain region (13 in FIG. 15). Source and drain electrodes (14, 15, 16, and 17 in FIG. 15) are formed by metallic film deposition and patterning, thereby completing devices. The devices are connected by thin-film electrodes to form a complementary field effect transistor.

Embodiment 16

Figure 16:
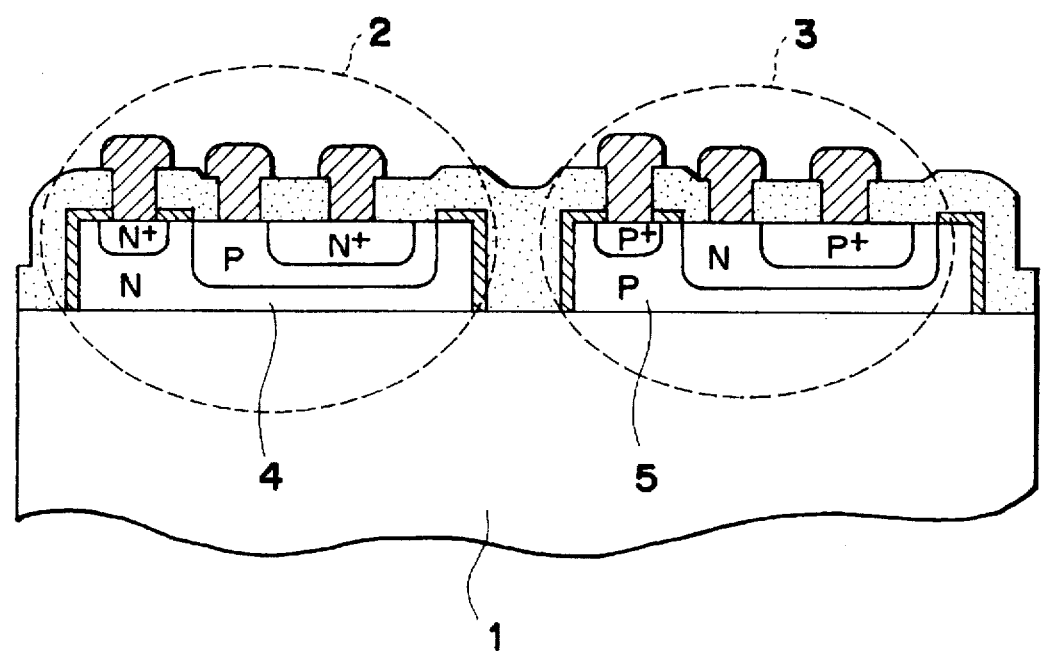

FIG. 16 is a schematic illustration of one example of the semiconductor device in accordance with the present invention.

A substrate 1 shown in FIG. 16 is a light-transmissive substrate composed of $SiO_2$ by selectively removing porous Si, and an NPN-type bipolar transistor 2 and a PNP-type bipolar transistor 3 are formed on the substrate 1.

By suitably combining both devices, a preferred semiconductor device is manufactured. The bipolar transistor as shown in FIG. 16 is of a planar type, but the bipolar transistor of the present invention may be a different type of bipolar transistor such as a lateral type transistor.

The process for manufacturing the semiconductor device shown in FIG. 16 will be described below. In the semiconductor device shown in FIG. 16, Si monocrystal semiconductor regions 4 and 5 are formed on silicon substrate 1. The Si monocrystal layer including these Si monocrystal regions is formed on the substrate 1 by the above-described process for manufacturing the semiconductor member in accordance with the present invention.

Next, the monocrystalline thin layer on the surface of the light-transmissive substrate formed in the manufacturing process is separated into islands by particle oxidation or etching, as shown in FIG. 16. N-type impurity ions and P-type impurity ions are independently implanted into the monocrystalline silicon island (4 in FIG. 16) for forming an NPN-type transistor (2 in FIG. 16) and the monocrystalline silicon island (5 in FIG. 16) for forming a PNP-type transistor (3 in FIG. 16), respectively.

Figure 17A:
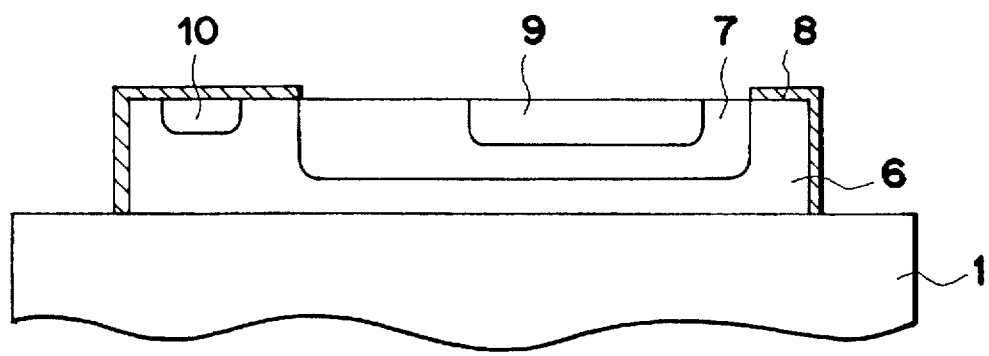
FIGS. 17A and 17B are schematic illustrations showing one example of the steps for forming the semiconductor device of the present invention.

Next, as shown in FIG. 17A, an oxide film 8 is formed on the surface of the Si monocrystal region by dry oxidation, pyrogenic wet oxidation or the like. Then, the oxide film is partially removed by photolithography or the like, and impurities different from those in the collector region are diffused into a part of a collection region 6 by an ion implantation method and a thermal diffusion method or the like to form a base region 7. Then, by ion implantation with a mask pattern formed of a photoresist, an emitter region 9 and a collector contact region 10 are doped with impurities at a high density such as to be of the same type as the collector region.

Figure 17B:
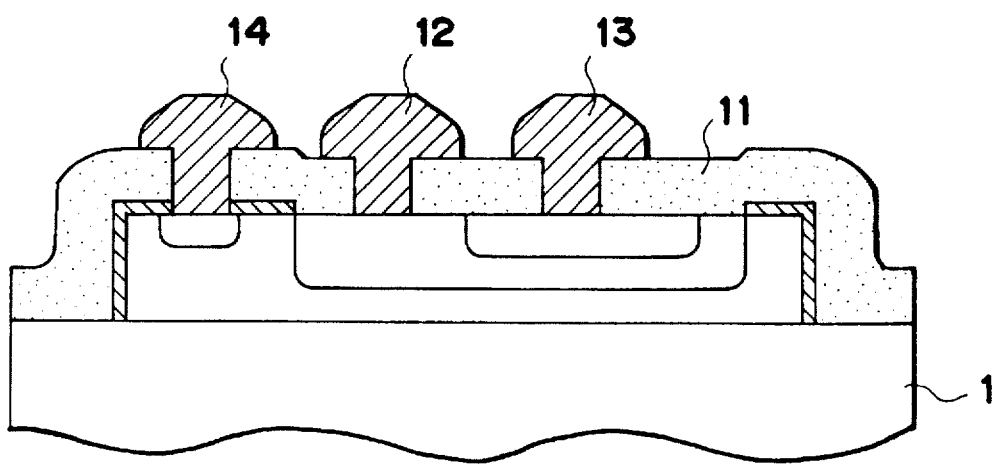

Next, as shown in FIG. 17B, an inter-layer insulating layer 11 is formed by deposition based on a CVD method, a bias sputtering method or the like. Further, contact holes are formed by photolithography and etching. Thereafter, electrodes 12, 13, and 14 to be provided for the base region 7, the emitter region 9 and the connector region 10, respectively, are formed of Al, Al-Si, W, Mo, W silicide, Ti, Ti silicide or the like, thereby obtaining a bipolar transistor in accordance of this embodiment. An integrated circuit can be manufactured by forming devices in this manner and connecting the devices by thin-film metal wiring or the like. The kind of integrated circuit is not particularly limited.

The bipolar transistor in accordance with this embodiment is formed on a Si monocrystal layer having a high degree of flatness over a large area and very small amount of defects. The bipolar transistor can therefore constitute a semiconductor device having a reduced capacitance between the substrate and the collector, capable of high-speed operation and having improved radiation resistance characteristics such as to be free from soft errors caused by alpha rays or the like.

Embodiment 17

Figure 18:
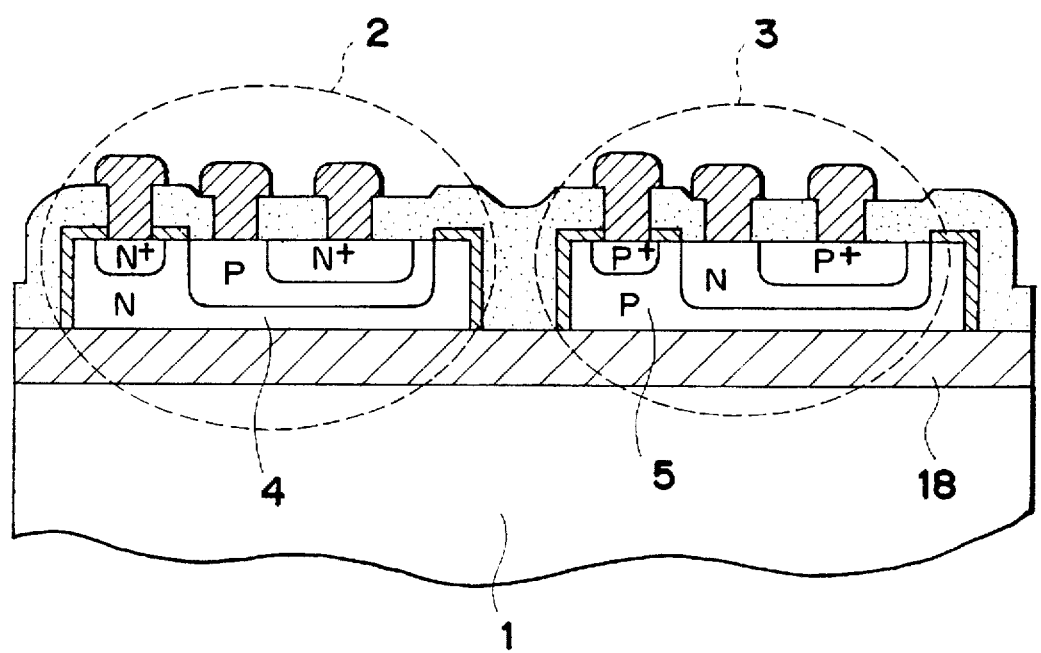
FIG. 18 is a schematic illustration showing one example of the semiconductor device of the present invention.

FIG. 18 is a schematic illustration of one example of the semiconductor device in accordance with the present invention. The bipolar transistor shown in FIG. 18 has the same construction as that of the bipolar transistor shown in FIG. 16, except that a silicon substrate having an $SiO_2$ layer (18 in FIG. 18) formed on its surface by selectively removing porous Si is used as substrate 1.

The process for manufacturing the semiconductor device shown in FIG. 18 will be described below. In the semiconductor device shown in FIG. 18, Si monocrystal semiconductor regions 4 and 5 are formed on silicon substrate 1 with $SiO_2$ layer 18 interposed therebetween.

The Si monocrystal layer including these Si monocrystal regions is formed on the $SiO_2$ layer 18 by the above-described process for manufacturing the semiconductor member in accordance with the present invention.

Next, the monocrystalline thin layer formed on the insulating substrate surface by this manufacturing process is separated into islands by partial oxidation or etching, as shown in FIG. 18. N-type impurity ions and P-type impurity ions are independently implanted into the monocrystalline silicon island (4 in FIG. 18) for forming an NPN-type transistor (2 in FIG. 18) and the monocrystalline silicon island (5 in FIG. 18) for forming a PNP-type transistor (3 in FIG. 18), respectfully, to form collector regions.

Figure 19A:
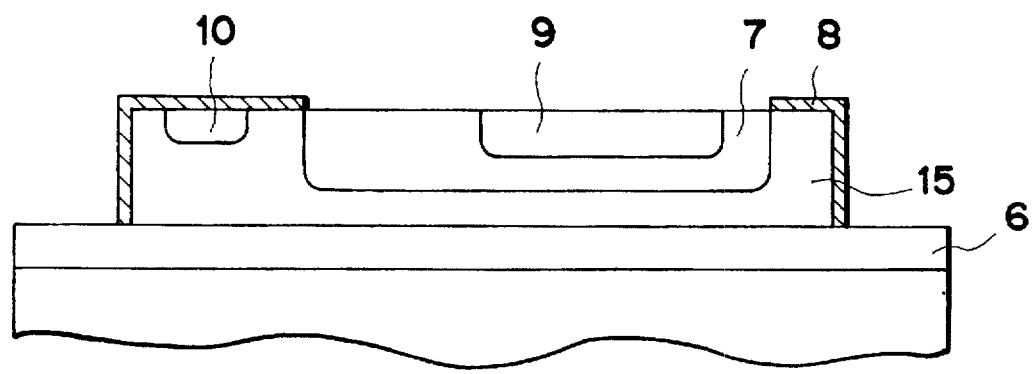
FIGS. 19A and 19B are schematic illustrations showing one example of the steps for forming the semiconductor device of the present invention.

Next, as shown in FIG. 19A, an oxide film 8 is formed on the surface of the Si monocrystal region by dry oxidation, pyrogenic wet oxidation or the like. Then, the oxide film is partially removed by photolithography or the like, and impurities different from those in the collector region are diffused into a part of a collector region 15 by an ion implantation method and a thermal diffusion method or the like to form a base region 7. Then, by ion implantation with a mask pattern formed of a photoresist, an emitter region 9 and a collector contact region 10 are doped with impurities at a high density such as to be of the same type as the collector region.

Figure 19B:
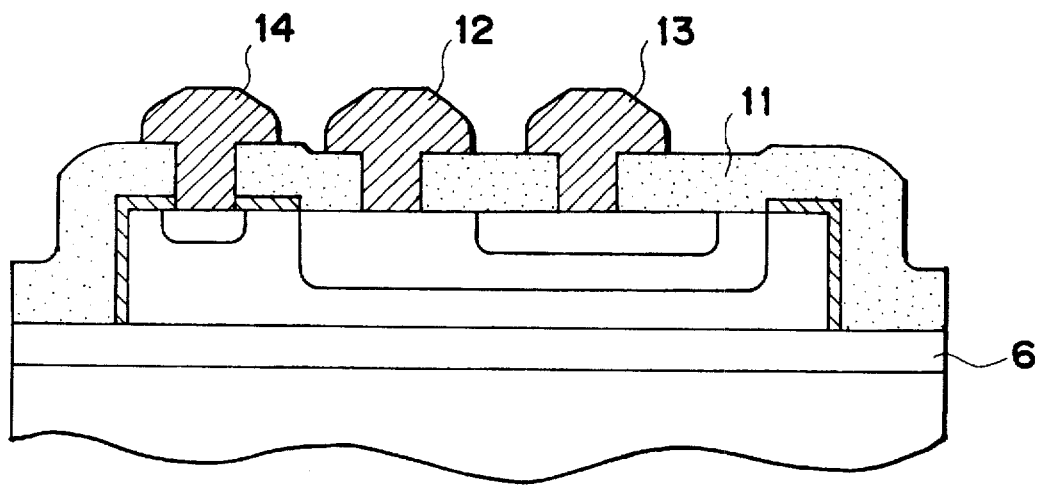

Next, as shown in FIG. 19B, an inter-layer insulating layer 11 is formed by deposition based on a CVD method, a bias sputtering method or the like. Further, contact holes are formed by photolithography and etching. Thereafter, electrodes 12, 13, and 14 to be provided for the base region 7, the emitter region 9 and the connector region 10, respectively, are formed of Al, Al-Si, W, Mo, W silicide, Ti, Ti silicide or the like, thereby obtaining a bipolar transistor in accordance of this embodiment. An integrated circuit can be manufactured by forming devices in this manner and connecting the devices by thin-film metal wiring or the like. The kind of integrated circuit is not particularly limited.

Embodiment 18

Figure 20:
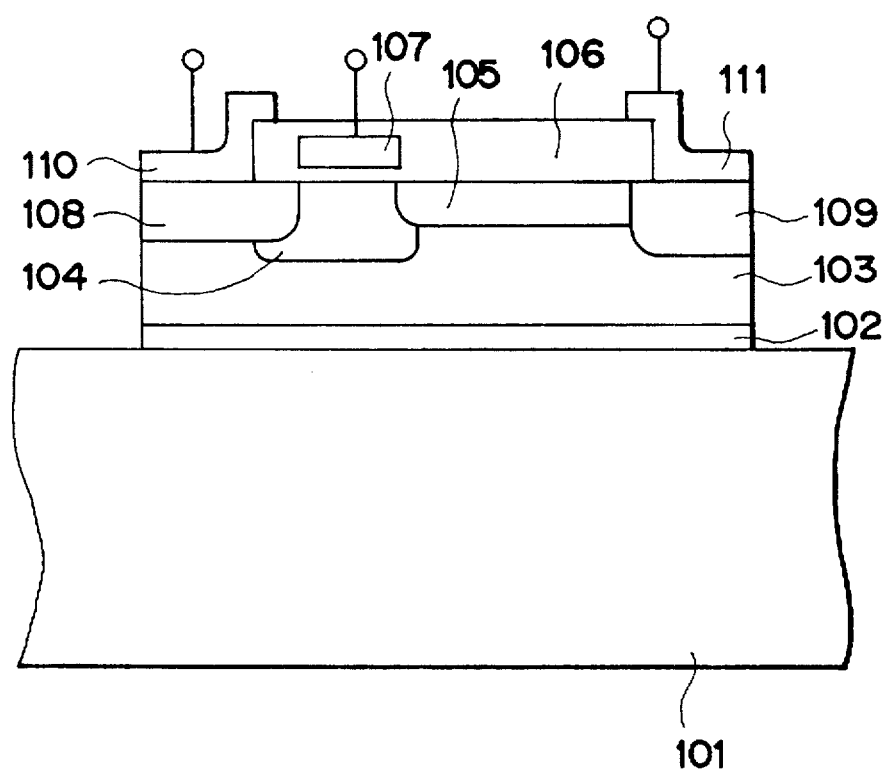
FIGS. 20 through 23, 24A, and 24B, 25, 26, 27A, 27B and 28 are schematic illustrations showing examples of the semiconductor device of the present invention.

FIG. 20 is a schematic illustration of one example of the semiconductor device in accordance with the present invention. A substrate 101 shown in FIG. 20 is a light-transmissive substrate formed of $SiO_2$ by selectively removing porous Si, and an N-channel field effect transistor is formed as a power transistor on this substrate.

The power transistor shown in FIG. 20 is manufactured by a process described below.

A monocrystal layer 102 on the light-transmissive substrate 101 is formed by the above-described process for manufacturing the semiconductor member in accordance with the present invention.

The monocrystalline layer 102 thereby formed on the surface of the light-transmissive substrate 101 is separated into islands by partial oxidation or etching, as shown in FIG. 20.

Thereafter, a monocrystalline Si layer 103 having a thickness sufficient for forming a power transistor is grown by epitaxial growth at least on a region where the power transistor is to be formed.

Then, P-type impurity ions are implanted into the monocrystalline silicon island 104 for forming an N-channel insulated gate type field effect transistor as a power transistor.

Further, to achieve a high withstand voltage, N-type impurity ions are implanted between the P-type ion implanted region and a region in which a drain will be finally formed, thereby forming a drift region 105.

Gate insulating film 106 is formed on each monocrystalline silicon layer, and a gate electrode 107 of polycrystalline silicon is formed by patterning.

A source region 108 and a drain region 109 are formed by using the polycrystalline silicon gate electrode as a mask and implanting impurity ions in a self alignment manner.

With respect to the N-channel transistor, N-type impurity ions are implanted to form the source and drain regions.

A source electrode 110 and a drain electrode 111 are formed by deposition and patterning of a metallic thin film, thereby completing the device.

An integrated circuit can be manufactured by forming devices in this manner and connecting the devices by thin-film electrodes.

A P-channel insulated gate type field effect transistor may be formed by using the same process as the above-described process for manufacturing an N-channel insulated gate type field effect transistor while replacing the P- and N-types of impurities with each other.

Embodiment 19

Figure 21:
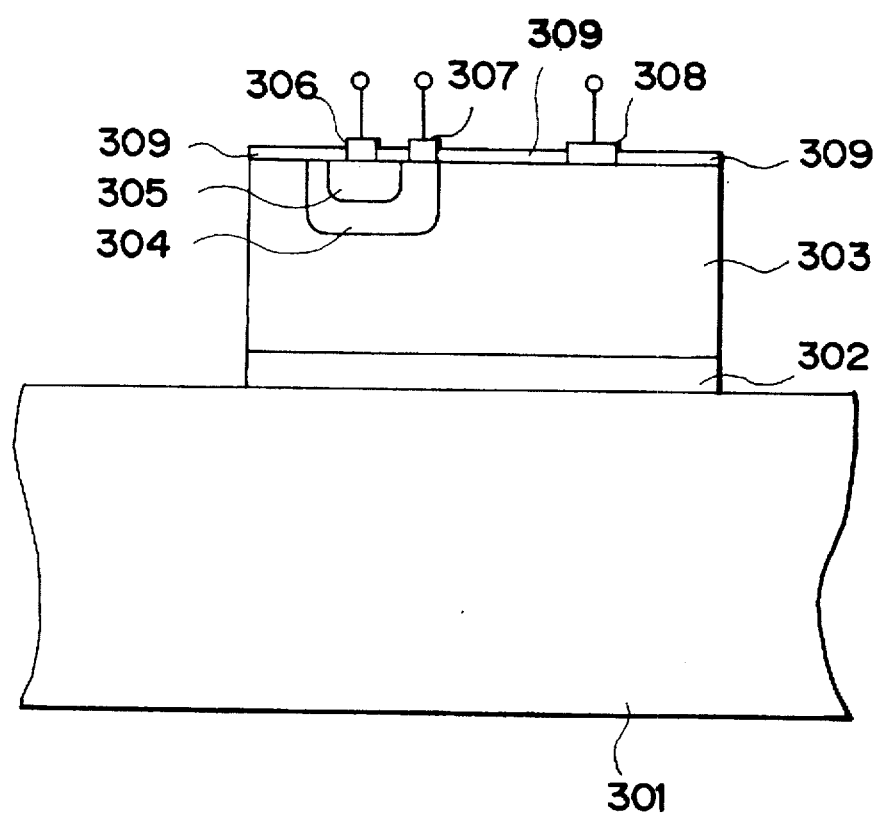

FIG. 21 is a schematic illustration of one example of the semiconductor device in accordance with the present invention. A substrate 301 shown in FIG. 21 is a light-transmissive substrate formed of $SiO_2$ by selectively removing porous Si, and an NPN-type bipolar transistor is formed as a power transistor on this substrate.

The power transistor shown in FIG. 21 is manufactured by a process described below.

A monocrystal layer 302 on the light transmissive substrate 301 is formed by the above-described process for manufacturing the semiconductor member in accordance with the present invention.

The monocrystalline layer 302 thereby formed on the surface of the light-transmissive substrate 301 is separated into islands by partial oxidation or etching, as shown in FIG. 21.

Thereafter, an N-type monocrystalline Si layer (collector region) 303 having a thickness sufficient for forming a power transistor is grown by epitaxial growth at least on a region where the power transistor is to be formed.

Then, P-type impurity ions are implanted to form a base region 304.

Further, N-type impurity ions are implanted into a portion of the base region to form an emitter region 305.

Emitter, base and collector electrodes (306, 307 and 308 respectively) are formed by deposition and patterning of a metallic thin film, thereby completing the device.

A PNP-type bipolar transistor may be formed by using the same process as the above-described process for manufacturing the NPN-type transistor while replacing the P- and N-types of impurities with each other.

Embodiment 20

Figure 22:
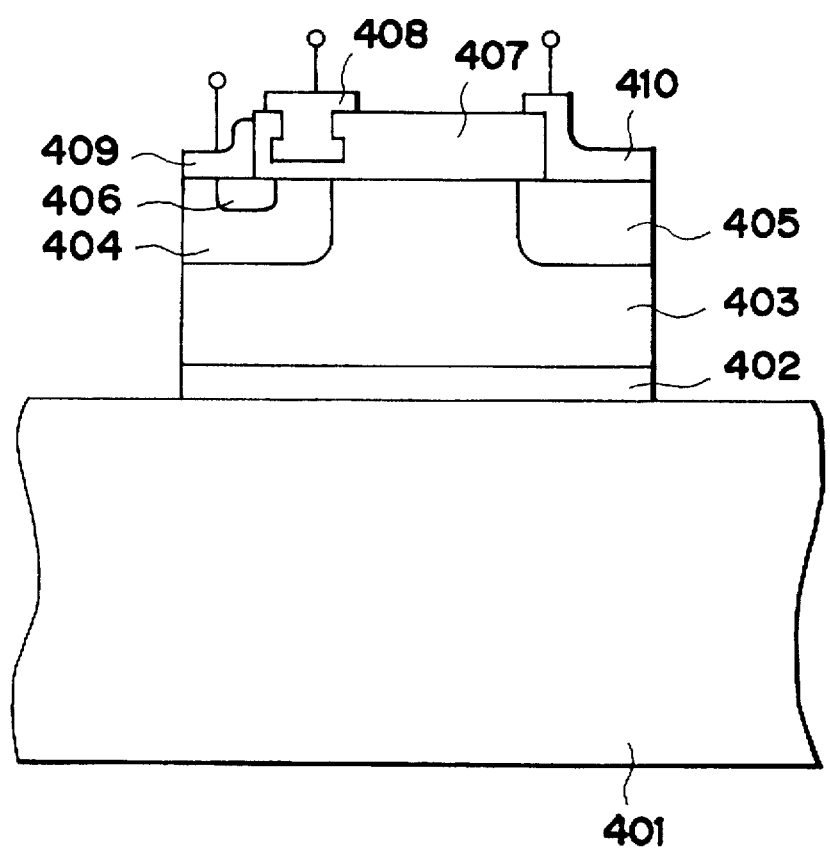

FIG. 22 is a schematic illustration of one example of the semiconductor device in accordance with the present invention. A substrate 401 shown in FIG. 21 is a light-transmissive substrate formed of SiO₂ by selectively removing porous Si, and an N-channel insulated gate type bipolar transistor is formed as a power transistor on this substrate.

The power transistor shown in FIG. 22 is manufactured by a process described below.

A monocrystal layer 402 on the light-transmissive substrate 401 is formed by the above-described process for manufacturing the semiconductor member in accordance with the present invention.

The monocrystalline layer 402 thereby formed on the surface of the light-transmissive substrate 401 is separated into islands by partial oxidation or etching.

Thereafter, an N-type monocrystalline Si layer 403 having a thickness sufficient for forming a power transistor is grown by epitaxial growth at least on a region where the power transistor is to be formed.

Then, P-type impurity ions are implanted to form a channel region 404 and a collector region 405. Further, N-type impurity ions are implanted into a portion of the channel region to form an emitter region 406.

A gate insulating film 407 is then formed on the channel, and a polycrystalline silicon gate electrode 408 is formed by patterning.

Emitter and collector electrodes (409 and 419 respectively) are formed by deposition and patterning of a metallic thin film, thereby completing the device.

A P-channel insulated gate type bipolar transistor may be formed by using the same process as the above-described process for manufacturing the N-channel insulated gate type bipolar transistor while replacing the P- and N-types of impurities with each other.

In the power transistors described above as Embodiments 18 to 20, each device is formed on a Si monocrystal layer having uniformity and flatness over a large area, excellent crystallinity, and very small amount of defects. The device can therefore be used as high-withstand-voltage transistor and can provide a semiconductor device and a circuit free from a latch-up phenomenon or the like and having improved radiation resistance characteristics.

The device can also be formed together with a low-withstand-voltage CMOS transistor on one substrate to form an intelligent power IC, because complete dielectric isolation is possible.

Further, the device can be formed together with a sensor or a projection type liquid crystal display on one substrate, because it can be formed on a light-transmissive substrate.

Embodiments 21 to 23

It is also possible to form power transistors by the same processes as those described above with respect to Embodiments 18 to 20 while using a substrate having an SiO₂ layer formed on the surface of the Si monocrystal layer on each of the light-transmissive substrate 101 shown in FIG. 20, the light-transmissive substrate 301 shown in FIG. 21 and the light-transmissive substrate 401 shown in FIG. 22.

Embodiment 24

Figure 23:
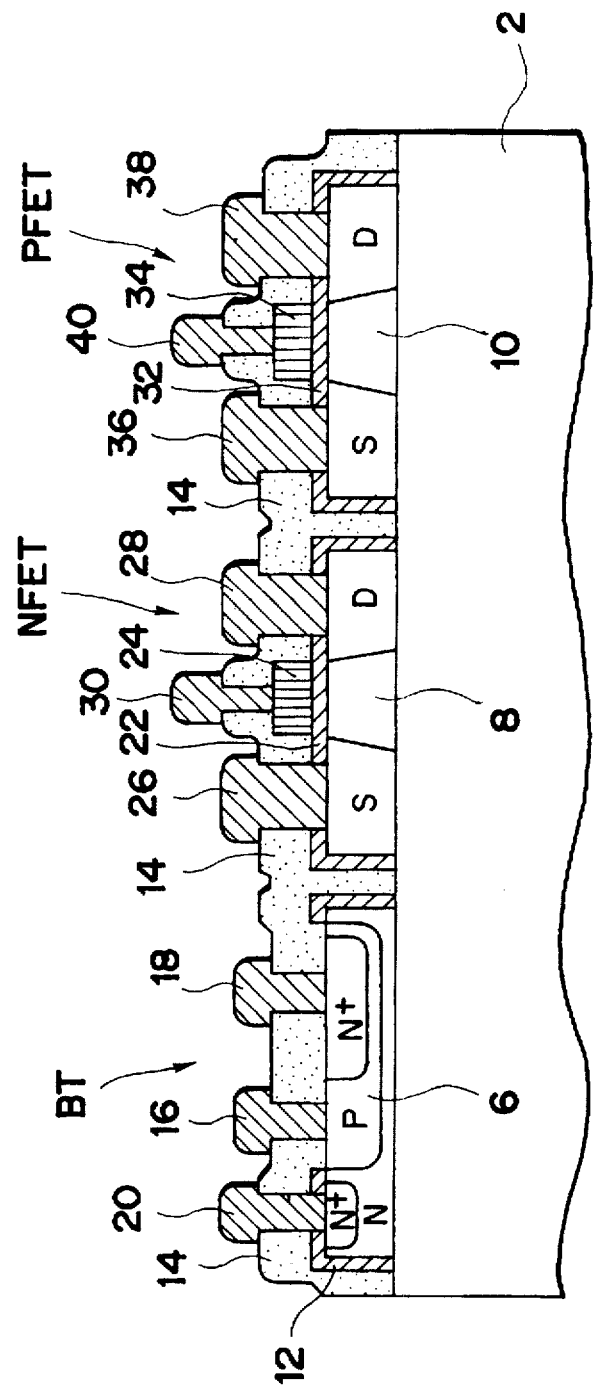

FIG. 23 is a schematic illustration of one example of the semiconductor device in accordance with the present invention. A numeral 2 shown in FIG. 23 is an SiO₂ glass substrate having a light-transmissive property. Three Si monocrystal layer islands 6, 8 and 10 are formed on this substrate.

The Si monocrystal layer containing the monocrystalline layer islands 6, 8 and 10 formed on the SiO₂ glass substrate 2 is formed by the above-described process for manufacturing the semiconductor member in accordance with the present invention.

In the semiconductor device shown in FIG. 23, the monocrystalline layer island 6 is sectioned with respect to conductive types in a suitable pattern, and a Si oxide layer 12, an insulating layer 14, a base electrode 16, emitter electrode 18 and a collector electrode 20 are formed on the monocrystalline layer island 6 to form an NPN-type bipolar transistor BT. The bipolar transistor shown in FIG. 23 is of a planar type, but a different type of bipolar transistor, such as a lateral type transistor, may be formed.

The monocrystalline layer island 8 is sectioned with respect to conductive types in a suitable pattern to form a source region S and a drain region D, and a gate oxide layer 22, a gate 24, an insulating layer 14, a source electrode 26, a drain electrode 28 and a gate electrode 30 are formed on the monocrystalline layer island 8 to form an N-channel field effect transistor NFET.

The monocrystalline layer island 10 is sectioned with respect to conduction types in a suitable pattern to form a source region S and a drain region D, and a gate oxide layer 32, a gate 34, an insulating layer 14, a source electrode 36, a drain electrode 38 and a gate electrode 40 are formed on the monocrystalline layer island 10 to form a P-channel field effect transistor PFET.

The NPN-type bipolar transistor BT shown in FIG. 23 can be formed by the same process as described above with respect to Embodiment 16. A PNP-type bipolar transistor can also be formed in the same manner while changing the conductive type of impurities.

The steps for forming the N-channel field effect transistor NFET and the P-channel field effect transistor PFET shown in FIG. 23 will be described below with reference to FIGS. 24A and 24B.

Figure 24A:
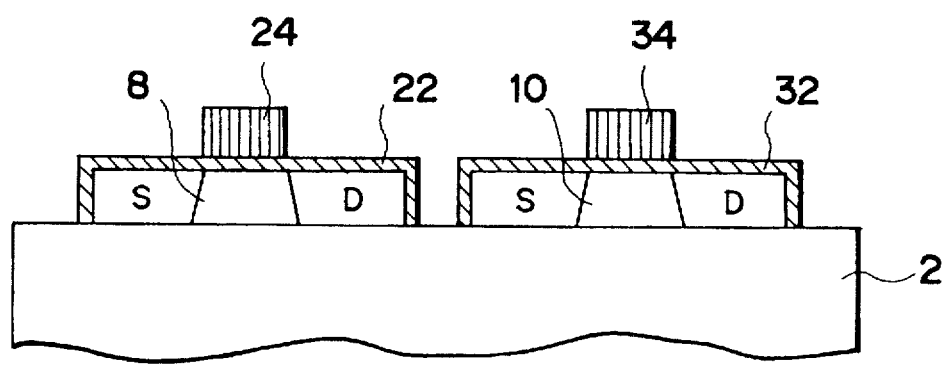

First, as shown in FIG. 24A, P-type impurity ions and N-type impurity ions are independently implanted into the monocrystalline layer islands 8 and 10, respectively. Then, gate insulating films 22 and 32 are formed on the monocrystalline layer islands, and polycrystalline silicon gates 24 and 34 are formed by patterning. Impurity ions are implanted in a self alignment manner by using the polycrystalline silicon gates as masks, thereby forming source region S and drain region D. At this time, N-type impurity ions are implanted to the NFET to form source region S and drain region D, while P-type impurity ions are implanted to the PFET to form source region S and drain region D.

Figure 24B:
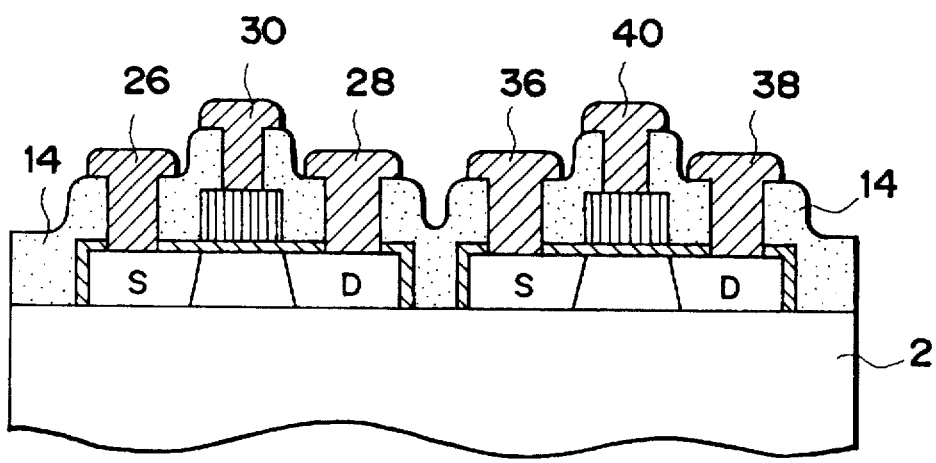

Next, as shown in FIG. 24B, insulating layer 14 is formed, contact holes are then formed, and source electrodes 26 and 36, drain electrodes 28 and 38 and gate electrodes 30 and 40 are thereafter formed to obtain the N-channel and P-channel field effect transistors.

Figure 25:
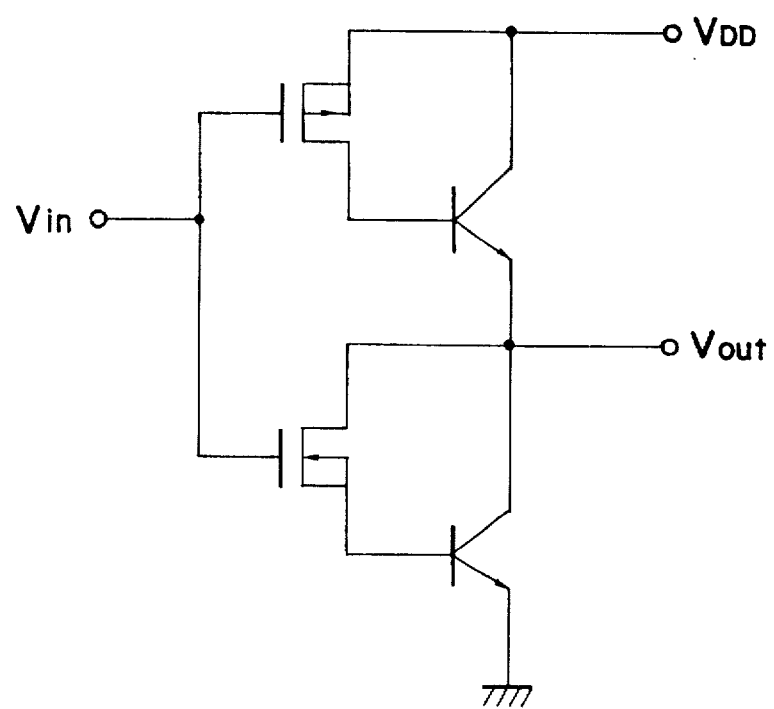

An integrated circuit may be formed by using the bipolar transistor and the field effect transistors obtained in this manner and by connecting the electrodes thereof, for example, by thin-film metal wiring so as to form a circuit such as that shown in FIG. 25.

The semiconductor device in accordance with this embodiment can include a bipolar transistor having a smaller capacitance between the substrate and the collector and an insulated gate type field effect transistor having a smaller stray capacity between the source and the drain, because they are formed by using a Si monocrystal layer being uniform and flat over a large area, having improved crystallinity, and having very small amount of defects. It is therefore possible to provide a circuit capable of high-speed operation, free from a latch-up effect and having improved radiation resistance characteristics such as to be free from soft errors caused by alpha rays.

Embodiment 25

Figure 26:
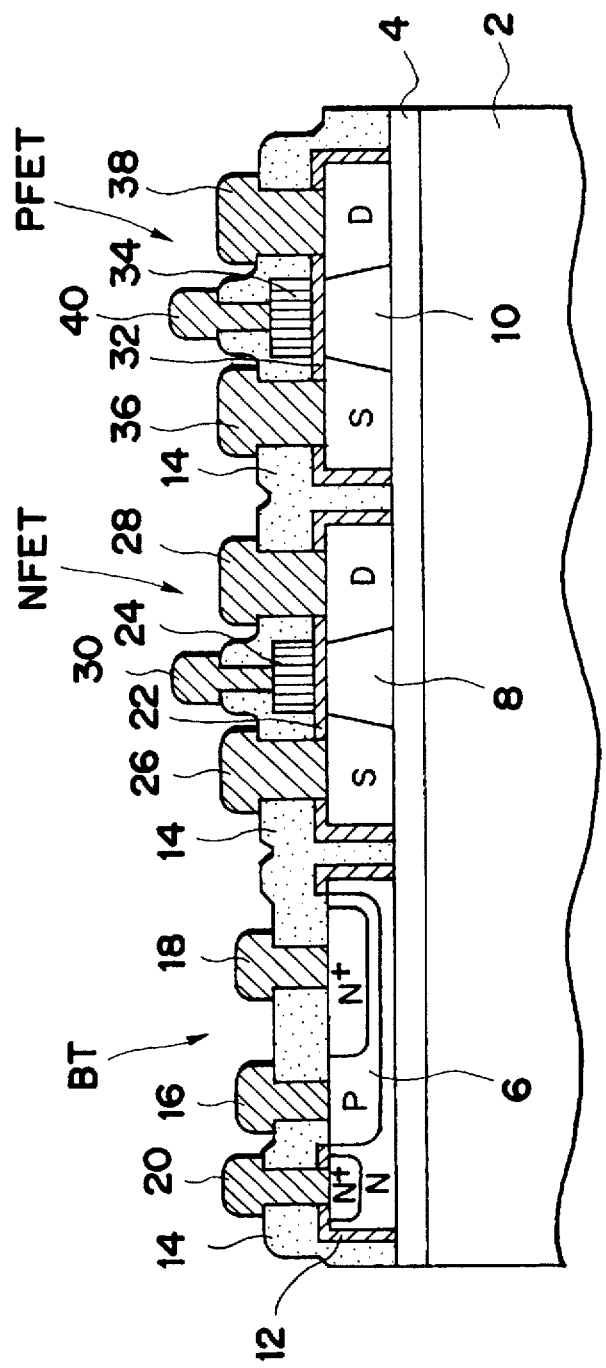

FIG. 26 is a schematic illustration of one example of the semiconductor device in accordance with the present invention. A numeral 2 shown in FIG. 26 is a Si substrate, and 4 is an insulating material layer consisting of a Si oxide film formed on the surface of the Si substrate. Three Si monocrystal layer islands 6, 8, and 10 are formed on the insulating material layer 4.

The Si monocrystal layer containing the monocrystalline layer islands 6, 8, and 10 formed on the Si substrate 2 having the insulating material layer 4 formed thereon is formed by the above-described process for manufacturing the semiconductor member in accordance with the present invention. The semiconductor device shown in FIG. 26 has the same construction as that of the semiconductor device shown in FIG. 23, except that Si substrate 2 having the insulating material layer 4 on its surface is used in place of the $SiO_2$ glass substrate 2 of the semiconductor device shown in FIG. 23.

In the semiconductor device shown in FIG. 26, the monocrystalline layer island 6 is sectioned with respect to conductive types in a suitable pattern, and a Si oxide layer 12, an insulating layer 14, a base electrode 16, emitter electrode 18 and a collector electrode 20 are formed on the monocrystalline layer island 6 to form an NPN-type bipolar transistor BT. The bipolar transistor shown in FIG. 26 is of a planar type, but a different type of bipolar transistor, such as a lateral type transistor, may be formed.

The monocrystalline layer island 8 is sectioned with respect to conductive types in a suitable pattern to form a source region S and a drain region D, and a gate oxide layer 22, a gate 24, an insulating layer 14, a source electrode 26, a drain electrode 28 and a gate electrode 30 are formed on the monocrystalline layer island 8 to form an N-channel field effect transistor NFET.

The monocrystalline layer island 10 is sectioned with respect to conductive types in a suitable pattern to form a source region S and a drain region D, and a gate oxide layer 32, a gate 34, an insulating layer 14, a source electrode 36, a drain electrode 38 and a gate electrode 40 are formed on the monocrystalline layer island 10 to form a P-channel field effect transistor PFET.

The NPN-type bipolar transistor BT shown in FIG. 26 can be formed by the same process as described above with respect to Embodiment 17. A PNP-type bipolar transistor can also be formed in the same manner while changing the conductive type of impurities.

A process for forming the N-type field effect transistor NFET and the P-channel field effect transistor PFET shown in FIG. 26 will be described below with reference to FIG. 27.

Figure 27A:
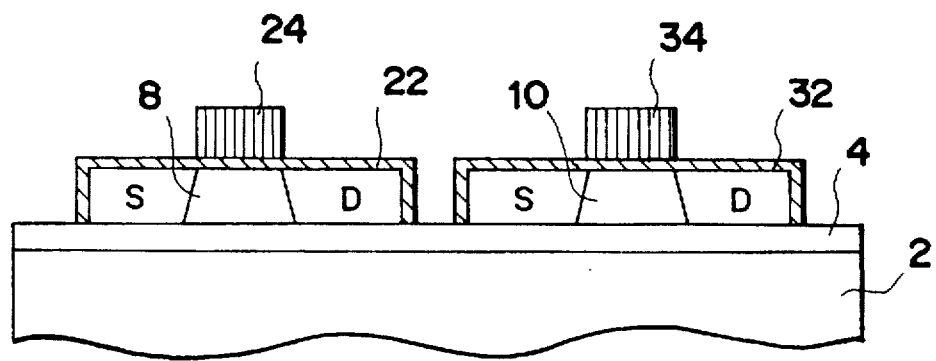

First, as shown in FIG. 27A, P-type impurity ions and N-type impurity ions are independently implanted into the monocrystalline layer islands 8 and 10, respectively. Then, gate insulating films 22 and 32 are formed on the monocrystalline layer islands, and polycrystalline silicon gates 24 and 34 are formed by patterning. Impurity ions are implanted in a self alignment manner by using the polycrystalline silicon gates as masks, thereby forming source region S and drain region D. At this time, N-type impurity ions are implanted for the NFET to form source region S and drain region D, while P-type impurity ions are implanted for the PFET to form source region S and drain region D.

Figure 27B:
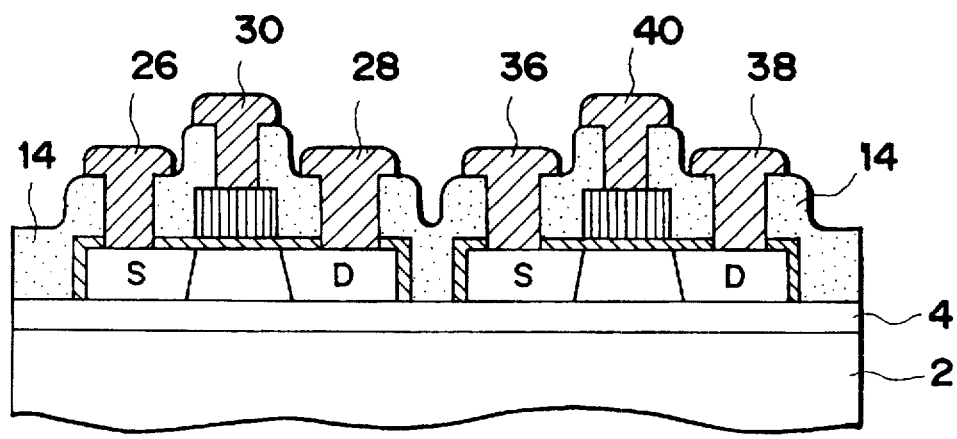

Next, as shown in FIG. 27B, insulating layer 14 is formed, contact holes are then formed, and source electrodes 26 and 36, drain electrodes 28 and 38 and gate electrodes 30 and 40 are thereafter formed to obtain the N-channel and P-channel field effect transistors.

An integrated circuit may be formed by using the bipolar transistor and the field effect transistors obtained in this manner and by connection the electrodes thereof, for example, by thin-film metal wiring so as to form a circuit such as that shown in FIG. 25.

Embodiment 26

For example, like the field transistor shown in FIG. 14, the bipolar transistor shown in FIG. 16 can be used as semiconductor active devices for use in a circuit for driving a liquid crystal display by being formed by the above described process.

Figure 28:
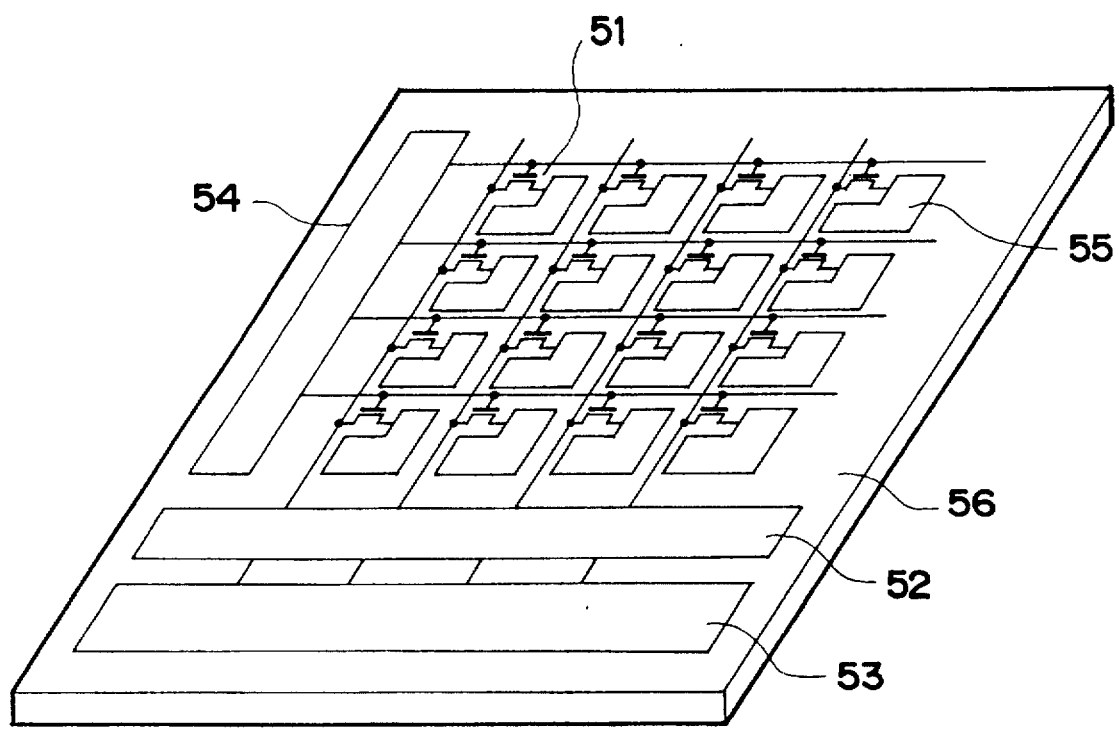

FIG. 28 shows a block diagram of a circuit for driving an active matrix type liquid crystal display device.

These semiconductor devices are combined to form circuits for the liquid crystal display device, i.e., a drive circuit buffer 52, a horizontal shift register 53 and a vertical shift register 54 shown in FIG. 28. Thereafter, a cover glass member on which a black matrix and a color filter are formed and which is processed to be oriented is attached to the liquid crystal display device with a seal member interposed therebetween. A liquid crystal is finally injected to complete the liquid crystal display device. In FIG. 28, numbers 51, 55, and 56 designate a pixel switch, a liquid crystal pixel, and a transparent substrate, respectively.

EXAMPLE 1

A P-type (100) monocrystalline Si substrate (Si wafer) having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate 21 was grown in Si epitaxial layer to a thickness of 0.5 microns by the MBE (Molecular Beam Epitaxy) method. The deposition conditions are as follows:

Temperature: 700° C.

Pressure: 1×10$^{-9}$ Torr

Growth Rate: 0.1 μm/sec.

Next, on the surface of the epitaxial layer 21 was superposed another Si substrate 23 with an oxidized layer of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal relative to hydrofluoric acid-nitric acid-acetic acid solution is about a little lower than 1 micron per minute (hydrofluoric acid-nitric acid-acetic acid solution, 1:3:8), but the chemical etching rate of a porous layer is accelerated by about 100-fold thereof. That is, the Si substrate 21 made porous having a thickness of 200 microns was removed in 2 minutes.

Thus, monocrystalline Si layer 22 having a thickness of 0.5 μm could be formed on the SiO$_2$ layer 24.

Also the thickness of the monocrystalline Si layer obtained was examined by use of Scanning Ellipsometer.

Specifically, the whole surface of the 3 inches of wafer was scanned for the measurement. As the result, within the plane of the 3 inches of wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.0 \times 10^{-3}$ sec. was exhibited.

EXAMPLE 2

A P-type (100) monocrystalline Si substrate having diameter of 4 inches and a thickness of 500 microns was anodized in a 50% HF solution. The current density at this time was 100 mA/cm². The porous structure formation rate at this time was 8.4 µm/min. and the P-type (100) Si substrate having a thickness of 500 microns as a whole was made porous in 60 minutes.

On the P-type (100) porous Si substrate 21 was grown at low temperature a Si epitaxial layer 22 to a thickness of 0.5 microns by the plasma CVD method. The deposition conditions are as follows:

Gas: SiH₄
Radio frequency power: 100 W
Temperature: 800° C.
Pressure: $1 \times 10^{-2}$ Torr
Growth rate: 2.5 nm/sec.

Next, on the surface of the epitaxial layer 22 was superposed another Si substrate 23 with an oxidized layer 24 of 5000 angstroms formed on the surface, and by heating in a nitrogen atmosphere at 700° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal relative to hydrofluoric acid-nitric acid-acetic acid solution is about a little lower than 1 micron per minute (hydrofluoric acid-nitric acid-acetic acid solution, 1:3:8), but the chemical etching rate of a porous layer is accelerated by about 100-fold thereof. That is, the Si substrate 21 made porous having a thickness of 500 microns was removed in 5 minutes.

Thus, a monocrystalline Si layer having a thickness of 0.5 µm could be formed on the SiO₂ layer 24.

Also the thickness of the monocrystalline Si layer obtained was examined by use of Scanning Ellipsometer. Specifically, the whole surface of the 4 inches of wafer was scanned for the measurement. As the result, within the plane of the 4 inches of wafer, the difference between the maximum value and the minimum value of the thickness of the monocrystalline Si layer was found to be suppressed 7% or less relative to the maximum value of the thickness. As the result of plan view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the lift time of minority carriers was measured for the monocrystalline Si layer by use of the MOS C-t method, a high value of $2.0 \times 10^{-3}$ sec. was exhibited.

EXAMPLE 3

A P-type (100) monocrystalline Si substrate (Si wafer) having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes. On the P-type (100) porous Si substrate 21 was grown a Si epitaxial layer 22 to a thickness of 0.5 microns by the bias sputtering method. The deposition conditions are as follows:

RF frequency: 100 MHz
Radio frequency power: 600 W
Temperature: 300° C.
Ar gas pressure: $8 \times 10^{-3}$ Torr
Growth time: 60 minutes
Target direct current bias: −200 V
Substrate direct current bias: +5 V Next, on the surface of the epitaxial layer 22 was superposed another Si substrate 23 with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal to hydrofluoric acid-nitric acid-acetic acid solution is about a little lower than 1 micron per minute (hydrofluoric acid-nitric acid-acetic acid solution, 1:3:8), but the chemical etching rate of a porous layer is accelerated by about 100-fold thereof. That is, the Si substrate 21 made porous having a thickness of 200 microns was removed in 2 minutes.

Thus, a monocrystalline Si layer having a thickness of 0.5 µm could be formed on the SiO₂ layer 24.

EXAMPLE 4

A P-type (100) monocrystalline Si substrate having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes.

On the P-type (100) porous Si substrate 21 was grown a Si epitaxial layer 22 to a thickness of 0.5 microns by liquid phase growth method. The growth conditions are as follows:

Solvent: Sn
Growth temperature: 900° C.
Growth atmosphere: H₂
Growth time: 10 minutes Next, on the surface of the epitaxial layer 22 was superposed another Si substrate 23 with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8). As the result, the Si substrate 21 made porous having a thickness of 200 microns was removed in 2 minutes.

Thus, a monocrystalline Si layer 22 having a thickness of 0.5 µm could be formed on the SiO₂ layer 24.

EXAMPLE 5

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 21 was grown a Si epitaxial layer 22 to a thickness of 0.5 microns by the low pressure CVD method. The disposition conditions are as follows:

Source gas: SiH$_4$

Carrier gas: H$_2$

Temperature: 850° C.

Pressure: 1×10$^{-2}$ Torr

Growth rate: 3.3 nm/sec.

Next, on the surface of the epitaxial layer 22 was superposed another Si substrate with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8). As the result, the Si substrate 21 made porous having a thickness of 200 microns was removed in 2 minutes.

Thus, a monocrystalline Si layer having a thickness of 0.5 µm could be formed on the SiO$_2$ layer 24. When SiH$_2$Cl$_2$ was employed as the source gas, although it was necessary to elevate the growth temperature by some ten degrees, the accelerated etching characteristics inherent in the porous substrate were maintained.

EXAMPLE 6

On a P-type (100) Si substrate 121 having a diameter of 3 inches and a thickness of 200 microns was grown a Si epitaxial layer 122 with a thickness of 1 micron by the CVD method. The deposition conditions are as follows:

Reactive gas flow rate: SiH$_2$Cl$_2$—1000 SCCM H$_2$—230 l/min.

Temperature: 1080° C.

Pressure: 80 Torr

Time: 2 min.

The substrate 121 was anodized in a 50% HF solution. The current density at this time was 100 mA/cm$^2$. The porous structure formation rate at this time was 8.4 µm/min. and the P-type (100) Si substrate 121 having a thickness of 200 microns as a whole was made porous in 24 minutes. In this anodization, only the P-type (100) Si substrate 121 was made porous, and there was no change in the Si epitaxial layer 122.

Next, on the surface of the epitaxial layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed 1×10$^3$/cm$^2$ or less, whereby it could be confirmed that no new crystal defect had been introduced in the monocrystalline Si layer formation step to maintain good crystallinity. When the life time of minority carriers was measured for the monocrystalline Si layer by use of the microwave reflection method, a high value of 2.0×10$^{-3}$ sec. was exhibited.

EXAMPLE 7

On a P-type (100) Si substrate having a diameter of 3 inches and a thickness of 200 microns was grown a Si epitaxial layer 122 with a thickness of 0.5 micron by the CVD method. The deposition conditions are as follows:

Reactive gas flow rate: SiH$_2$Cl$_2$—1000 SCCM H$_2$—230 l/min.

Temperature: 1080° C.

Pressure: 80 Torr

Time: 1 min.

The substrate was anodized in a 50% HF solution. The current density at this time was 100 mA/cm$^2$. The porous structure formation rate at this time was 8.4 µm/min. and the P-type (100) Si substrate 121 having a thickness of 200 microns as a whole was made porous in 24 minutes. In this anodization, only the P-type (100) Si substrate was made porous, and there was no change in the Si epitaxial layer 122.

Next, on the surface of the epitaxial layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

As the result of cross-sectional observation by transmission electron microscopy, it could be confirmed that no new crystal defect had ben introduced in the Si layer 122 to maintain good crystallinity.

EXAMPLE 8

On a surface of a P-type (100) Si substrate 121 having a diameter of 3 inches and a thickness of 200 microns was formed an N-type Si layer 122 to a thickness of 1 micron by ion implantation of protons into the surface. The amount of H$^+$ implanted was found to be 5×10$^{15}$ (ions/cm$^2$). The substrate 121 was anodized in a 50% HF solution. The current density at this time was 100 mA/cm$^2$. The porous structure formation rate at this time was 8.4 µm/min. and the P-type (100) Si substrate 121 having a thickness of 200 microns as a whole was made porous in 24 minutes. As described above, in this anodization, only the P-type (100) Si substrate 121 was made porous, and there was no change in the N-type Si layer 122.

Next, on the surface of the N-type Si layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

As the result of cross-sectional observation by transmission electron microscopy, it could be confirmed that no new crystal defect had been introduced in the Si layer 122 to maintaining good crystallinity.

EXAMPLE 9

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate 11 was grown a Si epitaxial layer 12 to a thickness of 0.5 microns by the MBE (Molecular Beam Epitaxy) method. The deposition conditions are as follows:

Temperature: 700° C.

Pressure: 1×10$^{-9}$ Torr

Growth Rate: 0.1 nm/sec.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently Si$_3$N$_4$ was coated on the bonded substrate by the low pressure CVD method to a thickness of 0.1 µm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the Si$_3$N$_4$ layer 15, a substrate having a monocrystalline Si layer having a thickness of 0.5 µm on the SiO$_2$ layer 14 could be formed.

As the result of cross-sectional observation by transmission electron microscopy, it could be confirmed that no new crystal defect had ben introduced in the Si layer to maintain good crystallinity.

EXAMPLE 10

A P-type (100) monocrystalline Si substrate having diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate 11 was grown a Si epitaxial layer 12 to a thickness of 0.5 microns by the plasma CVD method. The deposition conditions are as follows:

Gas: SiH$_4$

Radio frequency power: 100 W

Temperature: 800° C.

Pressure: 1×10$^{-2}$ Torr

Growth rate: 2.5 nm/sec.

Next, on the surface of the epitaxial layer 12 was superposed another Si substrate with an oxidized layer 14 of 5000 angstroms formed on the surface, and by heating in a nitrogen atmosphere at 800° C. for 0.5 hour, the two Si substrates were bonded firmly together. Subsequently Si$_3$N$_4$ was coated on the bonded substrate by the low pressure CVD method to a thickness of 0.1 µm. Thereafter, only the silicon nitride film on the porous substrate 11 was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the Si$_3$N$_4$ layer 15, a substrate having a monocrystalline Si layer 12 having a thickness of 0.5 µm on the SiO$_2$ layer could be formed.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less relative to the maximum value of the thickness. As the result of observation by defect delineation etching by use of Sirtle etching, the dislocation defect density was found to be suppressed 1×10$^3$/cm$^2$ or less, whereby it could be confirmed that no new crystal defect had been introduced in the monocrystalline Si layer formation step to maintain good crystallinity. When the lift time of minority carriers was measured for the monocrystalline Si layer by use of the MOS C-t method, a high value of 2.0×10$^{-3}$ sec. was exhibited.

EXAMPLE 11

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 11 was grown a Si epitaxial layer 12 to a thickness of 0.5 microns by the bias sputtering method. The deposition conditions are as follows:

RF frequency: 100 MHz

Radio frequency power: 600 W

Temperature: 300° C.

Ar gas pressure: 8×10$^{-3}$ Torr

Growth time: 60 min.

Target direct current bias: −200 V

Substrate direct current bias: +5 V

Next, on the surface of the epitaxial layer 12 was superposed another Si substrate with an oxidized layer 14 of 5000 angstroms formed on the surface, and by heating in a nitrogen atmosphere at 800° C. for 0.5 hour, the two Si substrates were bonded firmly together. Subsequently Si$_3$N$_4$ was coated on the bonded substrate by the low pressure CVD method to a thickness of 0.1 µm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the Si$_3$N$_4$ layer 15, a substrate having a monocrystalline Si layer having a thickness of 0.5 µm on the SiO$_2$ layer 14 could be formed.

Also, the same effect was obtained when Apiezon Wax was coated in place of the Si$_3$N$_4$ layer, and only the Si substrate made porous could be completely removed.

EXAMPLE 12

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 11 was grown an Si epitaxial layer 12 to a thickness of 0.5 microns by the liquid phase growth method. The growth conditions are as follows:

Solvent: Sn
Growth temperature: 900° C.
Growth atmosphere: $H_2$
Growth time: 10 min.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer 12 having a thickness of 0.5 μm on the $SiO_2$ layer 14 could be formed.

Also, the same effect was obtained when Apiezon Wax was coated in place of the $Si_3N_4$ layer, and only the Si substrate made porous could be completely removed.

EXAMPLE 13

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 11 was grown a Si epitaxial layer 12 to a thickness of 0.5 microns by the low pressure CVD method. The disposition conditions are as follows:

Source gas: $SiH_4$
Carrier gas: $H_2$
Temperature: 850° C.
Pressure: $1 \times 10^{-2}$ Torr
Growth rate: 3.3 nm/sec.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently $Si_3N_4$ was coated on the bonded substrate by the low pressure CVD method to a thickness of 0.1 μm. Thereafter, only the silicon nitride film 15 on the porous substrate 11 was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer having a thickness of 0.5 μm on the SiO, layer 14 could be formed.

When $SiH_2Cl_2$ was employed as the source gas, although it was required to elevate the growth temperature by some ten degrees, the accelerated etching characteristics inherent in the porous substrate could be maintained.

EXAMPLE 14

On a P-type (100) Si substrate 111 having a diameter of 3 inches and a thickness of 200 microns was grown a Si epitaxial layer 112 with a thickness of 1 micron by the CVD method. The deposition conditions are as follows:

Reactive gas flow rate: $SiH_2Cl_2$—1000 SCCM $H_2$—230 l/min.
Temperature: 1080° C.
Pressure: 80 Torr
Time: 2 min.

The substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. In this anodization, only the P-type (100) Si substrate 111 was made porous, and there was no change in the Si epitaxial layer 112. Next, on the surface of the epitaxial layer 112 was superposed another Si substrate 114 with an oxidized layer of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 μm. Thereafter, only the nitride film on the porous substrate was removed by reactive ion etching. Then, the porous Si substrate 113 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 1 μm could be formed on the $SiO_2$.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed $1 \times 10^3$/cm$^2$ or less, whereby it could be confirmed that no new crystal defect had been introduced in the monocrystalline Si layer formation step to maintain good crystallinity. When the life time of minority carriers was measured for the monocrystalline Si layer by use of the microwave reflection method, a high value of $2.0 \times 10^{-3}$ sec. was exhibited.

EXAMPLE 15

On a P-type (100) Si substrate 111 having a diameter of 3 inches and a thickness of 200 microns was grown a Si epitaxial layer 112 with a thickness of 0.5 micron by the CVD method. The deposition conditions are as follows:

Reactive gas flow rate: $SiH_2Cl_2$—1000 SCCM $H_2$—230 l/min.
Temperature: 1080° C.
Pressure: 80 Torr
Time: 1 min.

The substrate was anodized in a 50% HF solution. The current density at this time was 100 mA/cm$^2$. The porous structure formation rate at this time was 8.4 μm/min. and the P-type (100) Si substrate 111 having a thickness of 200 microns as a whole was made porous in 24 minutes. In this anodization, only the P-type (100) Si substrate 111 was made porous, and there was no change in the Si epitaxial layer 112.

Next, on the surface of the epitaxial layer 112 was superposed a Si substrate 114 with an oxidized layer of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 μm. Thereafter, only the silicon nitride film 116 on the porous substrate 113 was removed by reactive ion etching. Then, the porous Si substrate 113 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 0.5 μm could be formed on the $SiO_2$ layer 115. As the result of cross-sectional observation by transmission electron microscopy, it could be confirmed that no new crystal defect had been introduced in the Si layer to maintain good crystallinity.

EXAMPLE 16

On a surface of a P-type (100) Si substrate 111 having a diameter of 3 inches and a thickness of 200 microns was formed an N-type Si layer 112 to a thickness of 1 micron by ion implantation of protons into the surface.

The amount of $H^+$ implanted was found to be $5 \times 10^{15}$ (ions/$cm^2$). The substrate was anodized in a 50% HF solution. The current density at this time was 100 mA/$cm^2$. The porous structure formation rate at this time was 8.4 μm/min. and the P-type (100) Si substrate 111 having a thickness of 200 microns as a whole was made porous in 24 minutes. In this anodization, only the P-type (100) Si substrate 111 was made porous, and there was no change in the N-type Si layer 112. Next, on the surface of the N-type Si layer 112 was superposed another Si substrate 114 with an oxidized layer 115 of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 113 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 1.0 μm could be formed on the $SiO_2$. As the result of cross-sectional observation by transmission electron microscopy, it could be confirmed that no new crystal defect had been introduced in the Si layer to maintain good crystallinity.

EXAMPLE 17

A P-type (100) monocrystalline Si substrate having a diameter of 3 inches and a thickness of 200 microns was anodized in a 50% HF solution. The current density at this time was 100 mA/$cm^2$. The porous structure formation rate at this time was 8.4 μm/min. and the P-type (100) Si substrate having a thickness of 200 microns as a whole was made porous in 24 minutes.

On the P-type (100) porous Si substrate 31 was grown a Si epitaxial layer 32 to a thickness of 0.5 microns by the MBE (Molecular Beam Epitaxy) method. The deposition conditions are as follows:

Temperature: 700° C.
Pressure: $1 \times 10^{-9}$ Torr
Growth Rate: 0.1 nm/sec.

Next, on the surface of the epitaxial layer 32 was formed an oxide layer 36 with a thickness of 1000 angstroms. Then, another Si substrate having an oxide layer 34 of 5000 angstroms formed on the surface was superposed on the above oxide layer 36, and by heating in a nitrogen atmosphere at 800° C. for 0.5 hour, the two Si substrates were bonded firmly together. $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 31 was chemically etched away by use of hydrofluoric acid-nitric acid-acetic acid solution (1:3:8). As the result, the Si substrate 31 made porous having a thickness of 200 microns was removed in 2 minutes. After removal of the $Si_3N_4$ layer 35, a substrate having thin film monocrystalline Si layer 32 could be formed on the $SiO_2$. As the result of cross-sectional observation by transmission electron microscopy, it could be confirmed that no new crystal defect had been introduced in the Si layer to maintain good crystallinity.

EXAMPLE 18

A P-type (100) monocrystalline Si substrate having diameter of 3 inches and a thickness of 200 microns was anodized in a 50% HF solution. The current density at this time was 100 mA/$cm^2$. The porous structure formation rate at this time was 8.4 μm/min. and the P-type (100) Si substrate having a thickness of 200 microns as a whole was made porous in 24 minutes. On the P-type (100) porous Si substrate 31 was grown a Si epitaxial layer 32 to a thickness of 5 microns according to the plasma CVD method. The deposition conditions are as follows:

Gas: $SiH_4$
Radio frequency power: 100 W
Temperature: 800° C.
Pressure: $1 \times 10^{-2}$ Torr
Growth rate: 2.5 nm/sec.

Next, on the surface of the epitaxial layer 32 was formed an oxide layer 36 of 1000 angstroms. Then, on another Si substrate 33 having an oxide layer 34 of 5000 angstroms formed on the surface was superposed the above oxide layer 36, and by heating in a nitrogen atmosphere at 800° C. for 0.5 hour, both layers were bonded together. $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 31 was chemically etched away by use of a KOH solution (6M). As the result, the Si substrate 31 made porous having a thickness of 200 microns was removed in 2 minutes. After removal of the $Si_3N_4$ layer, a substrate having a monocrystalline Si layer 32 with good crystallinity could be formed on the $SiO_2$ layer.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less relative to the maximum value of the thickness. As the result of plain view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0 \times 10^{-3}$ sec. was exhibited.

EXAMPLE 19

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 31 was grown a Si epitaxial layer 32 to a thickness of 1 micron according the bias sputtering method. The deposition conditions are as follows:

RF frequency: 100 MHz

Radio frequency power: 600 W

Temperature: 800° C.

Ar gas pressure: 8×10⁻³ Torr

Growth time: 120 min.

Target direct current bias: −200 V

Substrate direct current bias: +5 V

Next, on the surface of the epitaxial layer 32 was formed an oxide layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 800° C. for 0.5 hour, both layers were bonded firmly together. $Si_3N_4$ was coated on the bonded substrate by the low pressure CVD method to a thickness of 0.1 μm. Thereafter, only the nitride film on the porous substrate 31 was removed by reactive ion etching. Then, the porous Si substrate 31 was chemically etched away by use of hydrofluoric acid-nitric acid-acetic acid solution (1:3:8). As the result, the Si substrate 31 made porous having a thickness of 200 microns was removed in 2 minutes. After removal of the $Si_3N_4$ layer, a substrate having a monocrystalline Si layer 32 with good crystallinity could be formed on the $SiO_2$ layer.

The same effect was obtained also when Apiezon Wax was coated in place of the $Si_3N_4$ layer 35, whereby only the Si substrate 31 made porous could be completely removed.

EXAMPLE 20

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 31 was grown a Si epitaxial layer 32 to a thickness of 5 microns by the liquid phase growth method. The growth conditions are as follows:

Solvent: Sn

Growth temperature: 900° C.

Growth atmosphere: $H_2$

Growth time: 10 min.

Next, on the surface of the epitaxial layer 32 was formed an oxide layer 36 with a thickness of 1000 angstroms. Then, another Si substrate 33 having an oxide layer 34 of 5000 angstroms formed on the surface was superposed on the above oxide layer 36, and by heating in a nitrogen atmosphere at 700° C. for 0.5 hour, the two were bonded firmly together. $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 31 was chemically etched away by use of hydrofluoric acid-nitric acid-acetic acid solution (1:3:8). As the result, the Si substrate 31 made porous having a thickness of 200 microns was removed in 2 minutes. After removal of the $Si_3N_4$ layer 35, a substrate having a monocrystalline Si layer 32 could be formed on the $SiO_2$. The same effect was obtained when Apiezon Wax was coated in place of the $Si_3N_4$ layer, and whereby only the Si substrate made porous could be completely removed.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed 1×10³/cm² or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of 2.0×10⁻³ sec. was exhibited.

EXAMPLE 21

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 31 was grown a Si epitaxial layer 32 to a thickness of 1.0 micron at low temperature by the low pressure CVD method. The disposition conditions are as follows:

Source gas: $SiH_4$

Carrier gas: $H_2$

Temperature: 850° C.

Pressure: 1×10⁻² Torr

Growth rate: 3.3 nm/sec.

Next, on the surface of the epitaxial layer 32 was formed an oxide layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 700° C. for 0.5 hour, the two were bonded firmly together. $SI_3N_4$ was coated on the bonded substrate by the low pressure CVD method to a thickness of 0.1 μm. Thereafter, only the silicon nitride film 35 on the porous substrate 31 was removed by reactive ion etching. Then, the porous Si substrate 31 was chemically etched away by use of hydrofluoric acid-nitric acid-acetic acid solution (1:3:8). As the result, the Si substrate 31 made porous having a thickness of 200 microns was removed in 2 minutes. After removal of the $Si_3N_4$ layer 35, a substrate having a monocrystalline Si layer 32 could be formed on the $SiO_2$ layer.

When $SiH_2Cl_2$ was employed as the source gas, although the growth temperature was required to be elevated by some ten degrees, the accelerated etching characteristics inherent in the porous substrate could be maintained.

EXAMPLE 22

On a P-type (100) Si substrate 131 having a diameter of 3 inches and a thickness of 200 microns was grown a Si epitaxial layer 132 with a thickness of 1 micron by the CVD method. The deposition conditions are as follows:

Reactive gas flow rate: $SiH_2Cl_2$—1000 SCCM $H_2$—230 l/min.

Temperature: 1080° C.

Pressure: 80 Torr

Time: 2 min.

The substrate was anodized in a 50% HF solution. The current density at this time was 100 mA/cm$^2$. The porous structure formation rate at this time was 8.4 μm/min. and the P-type (100) Si substrate 131 having a thickness of 200 microns as a whole was made porous in 24 minutes. As described above, only the P-type (100) Si substrate 131 was made porous, and there was no change in the Si epitaxial layer 132. Next, on the surface of the epitaxial layer 132 was formed and oxidized layer 137, another Si substrate 134 having an oxidized layer 135 of 5000 angstroms formed on the surface was superposed on the above oxidized layer 137, and the two Si substrates were bonded together firmly by heating at 800° C. for 0.5 hour in a nitrogen atmosphere. By the low pressure CVD method, $Si_3N_4$ was coated with a thickness of 0.1 μm on the bonded substrate. Then only the silicon nitride film on the porous substrate was removed by reactive ion etching. Subsequently, the porous Si substrate 133 was chemically etched away by use of hydrofluoric acid-nitric acid-acetic acid solution (1:3:8). As the result, the Si substrate 133 made porous having a thickness of 200 microns was removed in 2 minutes. After removal of the $Si_3N_4$ layer 136, a substrate having the monocrystalline Si layer 132 having a thickness of 1 μm could be formed on $SiO_2$.

As the result of cross-sectional observation by transmission electron microscopy, it could be confirmed that no new crystal defect had been introduced in the Si layer to maintain good crystallinity.

EXAMPLE 23

On a P-type (100) Si substrate 131 having a diameter of 4 inches and a thickness of 500 microns was grown a Si epitaxial layer 132 with a thickness of 0.5 micron by the CVD method. The deposition conditions are as follows:

Reactive gas flow rate: $SiH_2Cl_2$—1000 SCCM $H_2$—230 l/min.

Temperature: 1080° C.

Pressure: 80 Torr

Time: 1 min.

The substrate was anodized in a 50% HF solution. The current density at this time was 100 mA/cm$^2$. The porous structure formation rate at this time was 8.4 μm/min. and the P-type (100) Si substrate 131 having a thickness of 500 microns as a whole was made porous. Only the P-type (100) Si substrate 131 was made porous in this anodization, and there was no change in the Si epitaxial layer 132.

Next, on the surface of the epitaxial layer 132 was formed and oxidized layer 137 with a thickness of 1000 angstroms. Then, another Si substrate 134 having an oxidized layer 135 of 5000 angstroms formed on the surface was adhered on the above oxidized layer 137, and the two were bonded together firmly by heating at 700° C. for 0.5 hour in a nitrogen atmosphere. By the low pressure CVD method, $Si_3N_4$ was coated with a thickness of 0.1 μm on the bonded substrate, and only the silicon nitride film on the porous substrate 133 was removed by reactive ion etching. Then, the porous Si substrate was chemically etched away by use of hydrofluoric acid-nitric acid-acetic acid solution (1:3:8). As the result, the Si substrate made porous having a thickness of 500 microns was removed in 5 minutes. After removal of the $Si_3N_4$ layer 136, a substrate having the monocrystalline Si layer 132 could be formed on $SiO_2$.

Also the thickness of the monocrystalline Si layer obtained was examined by use of Scanning Ellipsometer. As the result, within the plane of the 4 inches of wafer, the difference between the maximum value and the minimum value of the thickness of the monocrystalline Si layer was found to be suppressed 8% or less relative to the maximum value of the thickness. As the result of plan view observation of the monocrystalline Si layer by transmission electron microscopy, the dislocation defect density was found to be suppressed $1 \times 10^3 / cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.1 \times 10^{-3}$ sec. was exhibited.

EXAMPLE 24

On the surface of a P-type (100) Si substrate 131 having a diameter of 3 inches and a thickness of 200 microns was formed N-type Si layer 132 with a thickness of 1 micron by ion implantation of protons. The amount of H$^+$ implanted was $5 \times 10^{15}$ (ions/cm$^2$). The substrate was anodized in a 50% HF solution. The current density at this time was 100 mA/cm$^2$. The porous structure formation rate at this time was 8.4 μm/min. and the P-type (100) Si substrate 131 having a thickness of 200 microns was a whole was made porous in 24 minutes. Only the P-type (100) Si substrate 131 was made porous in this anodization, and there was no change in the N-type Si layer 132. Next, on the surface of the epitaxial layer 132 was formed an oxidized layer 137 with a thickness of 1000 angstroms. Then, another Si substrate 134 having an oxidized layer 135 of 5000 angstroms formed on the surface was adhered on the above oxidized layer 137, and the two Si substrates were bonded together firmly by heating at 700° C. for 0.5 hour. By the low pressure CVD method, $Si_3N_4$ was coated with a thickness of 0.1 μm on the bonded substrate. Then, only the silicon nitride film on the porous substrate was removed by reactive ion etching. Subsequently, the porous Si substrate 133 was chemically etched away by use of hydrofluoric acid-nitric acid-acetic acid solution (1:3:8). As the result, the Si substrate made porous having a thickness of 200 microns was removed in 2 minutes. After removal of the $Si_3H_4$ layer 136, a substrate having the monocrystalline Si layer 132 could be formed on $SiO_2$. as the result of cross-sectional observation by transmission electron microscopy, it was confirmed that no new crystalline defect had been introduced in the Si layer to maintain good crystallinity.

EXAMPLE 25

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate 41 was grown a Si epitaxial layer 42 to a thickness of 0.5 microns by the MBE (Molecular Beam Epitaxy) method. The deposition conditions are as follows:

Temperature: 700° C.

Pressure: 1×10⁻⁹ Torr

Growth Rate: 0.1 nm/sec.

Next, on the surface of the epitaxial layer 42 was formed an oxide layer 45 with a thickness of 1000 angstroms. Then, another Si substrate 43 with an oxidized layer 44 of 5000 angstroms formed on the surface was superposed on the above oxide layer 45, and by heating in a nitrogen atmosphere at 800° C. for 0.5 hour, the two Si substrates were bonded firmly together. Then, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus, a substrate having thin film monocrystalline Si layer 42 could be formed on the $SiO_2$. As the result of cross-sectional observation by transmission electron microscopy, it could be confirmed that no new crystal defect had been introduced in the Si layer to maintain good crystallinity.

EXAMPLE 26

A P-type (100) monocrystalline Si substrate having diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes. On the P-type (100) porous Si substrate 41 was grown a Si epitaxial layer 42 to a thickness of 5 microns by the plasma CVD method. The deposition conditions are as follows:

Gas: $SiH_4$

Radio frequency power: 100 W

Temperature: 800° C.

Pressure: 1×10⁻² Torr

Growth rate: 2.5 nm/sec.

Next, on the surface of the epitaxial layer 42 was formed an oxidized layer 45 with a thickness of 1000 angstroms. Then, another Si substrate 43 with an oxide layer 44 of 5000 angstroms formed on the surface was superposed on the above oxide layer 45, and by heating in a nitrogen atmosphere at 800° C. for 0.5 hour, the two Si substrates were bonded firmly together. Then, the porous Si substrate 41 was chemically etched away by use of a KOH solution of 6M.

As described above, ordinary chemical etching rate of Si monocrystal relative to 6M KOH solution is about a little lower than 1 micron per minute, but the chemical etching rate of a porous layer is accelerated by about 100-fold thereof. Then, the Si substrate made porous having a thickness of 200 microns was removed in 2 minutes.

Thus, the monocrystalline Si layer having good crystallinity could be formed on the $SiO_2$.

EXAMPLE 27

A P-type (100) monocrystalline Si substrate having a diameter of 5 inches and a thickness of 600 microns was anodized in a 50% HF solution. The current density at this time was 100 mA/cm². The porous structure formation rate at this time was 8.4 µm/min. and the P-type (100) Si substrate having a thickness of 600 microns as a whole was made porous in 70 minutes. On the P-type (100) porous Si substrate 41 was grown a Si epitaxial layer 42 to a thickness of 1 micron by the bias sputtering method. The deposition conditions are as follows:

RF frequency: 100 MHz

Radio frequency power: 600 W

Temperature: 300° C.

Ar gas pressure: 8×10⁻³ Torr

Growth time: 120 min.

Target direct current bias: −200 V

Substrate direct current bias: +5 V

Next, on the surface of the epitaxial layer 42 was formed an oxidized layer 45 with a thickness of 1000 angstroms. Then, on another Si substrate 43 having an oxide layer 44 of 5000 angstroms formed on the surface was superposed the above oxide layer 45, and by heating in a nitrogen atmosphere at 800° C. for 0.5 hour, the two Si substrates were bonded firmly together. Then, the porous Si substrate 41 was chemically etched away by use of hydrofluoric acid-nitric acid-acetic acid solution (1:3:8). As the result, the Si substrate 41 made porous having a thickness of 600 microns was removed in 7 minutes.

Thus, a substrate having a monocrystalline Si layer 42 with good crystallinity could be formed on the $SiO_2$.

Also the thickness of the monocrystalline Si layer obtained was examined by use of Scanning Ellipsometer. As the result, within the plane of the 5 inches of wafer, the difference between the maximum value and the minimum value of the thickness of the monocrystalline Si layer was found to be suppressed 8% or less based on the maximum value of the thickness. As the result of plain view observation of the monocrystalline Si layer by transmission electron microscopy, the dislocation defect density was found to be suppressed 1×10³/cm² or less, whereby it could be confirmed that no new crystal defect had been introduced in the monocrystalline Si layer formation process to maintain good crystallinity.

When the life time of minority carriers was measured for the monocrystalline Si layer by use of the MOS C-t method, a high value of 2.1×10⁻³ sec. was exhibited.

EXAMPLE 28

A P-type (100) monocrystalline Si substrate having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes. On the P-type (100) porous Si substrate 41 was grown a Si epitaxial layer 42 to a thickness of 5 microns by the liquid phase growth method. The growth conditions are as follows:

Solvent: Sn

Growth temperature: 900° C.

Growth atmosphere: $H_2$

Growth time: 10 min.

Next, on the surface of the epitaxial layer 42 was formed an oxidized layer 45 with a thickness of 1000 angstroms. Then, another Si substrate 43 having an oxidized layer 44 of 5000 angstroms formed on the surface was closely contacted, and by heating in a nitrogen atmosphere at 700° C. for 0.5 hour, the two substrates were bonded firmly together. Then, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus, a substrate having a monocrystalline Si layer could be formed on the $SiO^2$.

EXAMPLE 29

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 42 was grown a Si epitaxial layer 42 to a thickness of 1.0 microns by to the low pressure CVD method. The disposition conditions are as follows:

Source gas: SiH$_4$
Carrier gas: H$_2$
Temperature: 850° C.
Pressure: 1×10$^{-2}$ Torr
Growth rate: 3.3 nm/sec.

Next. on the surface of the epitaxial layer 42 was formed an oxidized layer 45 with a thickness of 1000 angstroms. Then. another Si substrate 43 having an oxidized layer 44 of 5000 angstroms on the surface was closely contacted. and by heating in a nitrogen atmosphere at 700° C. for 0.5 hour, the two Si substrates were bonded firmly together. Subsequently, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus. a substrate having a monocrystalline Si layer on SiO$_2$ could be formed. When SiH$_2$C$_2$ was employed. although it was necessary to elevate the growth temperature by some ten degrees, the accelerated etching characteristics inherent in the porous substrate could be maintained.

EXAMPLE 30

On a P-type (100) Si substrate 141 having a diameter of 3 inches and a thickness of 200 microns was grown a Si epitaxial layer 142 with a thickness of 1 micron by the CVD method. The deposition conditions are as follows:

Reactive gas flow rate: SiH$_2$Cl$_2$—1000 SCCM H$_2$—230 l/min.
Temperature: 1080° C.
Pressure: 80 Torr
Time: 2 min.

The substrate was anodized in a 50% HF solution. The current density at this time was 100 mA/cm$^2$. The porous structure formation rate at this time was 8.4 µm/min. and the P-type (100) Si substrate having a thickness of 200 microns as a whole was made porous. Only the P-type (100) Si substrate 141 was made porous in this anodization, and there was no change in the Si epitaxial layer 142. Next, on the surface of the epitaxial layer 142 was superposed another Si substrate 144 having an oxidized layer 145 of 5000 angstroms formed on the surface, and two Si substrates were bonded together firmly by heating at 800° C. for 0.5 hour in a nitrogen atmosphere. Subsequently, the porous Si substrate was chemically etched away by use of hydrofluoric acid-nitric acid-acetic acid solution (1:3:8). As the result, the Si substrate made porous having a thickness of 200 microns was removed in 2 minutes.

Thus. a substrate having the monocrystalline layer 142 with a thickness of 1 µm on SiO$_2$ could be formed. As the result of cross-sectional observation by transmission electron microscopy, it was confirmed that no new crystal defect had been introduced in the Si layer to maintain good crystallinity.

EXAMPLE 31

On a P-type (100) Si substrate 141 having a diameter of 3 inches and a thickness of 200 microns was grown a Si epitaxial layer 142 with a thickness of 0.5 micron by the CVD method. The deposition conditions are as follows:

Reactive gas flow rate: SiH$_2$Cl$_2$—1000 SCCM H$_2$—230 l/min.
Temperature: 1080° C.
Pressure: 80 Torr
Time: 1 min.

The substrate was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. Only the P-type (100) Si substrate 141 was made porous in this anodization, and there was no change in the Si epitaxial layer 142.

Next. on the surface of the epitaxial layer 142 was formed an oxidized layer 146 with a thickness of 1000 angstroms. Then. another Si substrate having an oxidized layer 145 of 5000 angstroms formed on the surface was closely contacted, and two Si substrates were bonded together firmly by heating at 700° C. for 0.5 hour. Then, the porous Si substrate was chemically etched away by use of hydrofluoric acid-nitric acid-acetic acid solution (1:3:8). As the result, the Si substrate made porous having a thickness of 200 microns was removed in 2 minutes.

Thus. a substrate having the monocrystalline layer on SiO$_2$ could be formed. As the result of cross-sectional observation by transmission electron microscopy, it was confirmed that no new crystal defect had been introduced in the Si layer to maintain good crystallinity.

EXAMPLE 32

On a surface of a P-type (100) Si substrate 141 having a diameter of 3 inches and a thickness of 200 microns was formed an N-type Si layer 142 with a thickness of 1 micron by ion implantation of protons. The amount of H$^+$ implanted was found to be 5×10$^{15}$ (ions/cm$^2$). The substrate was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. Only the P-type (100) Si substrate 141 was made porous in this anodization, and there was no change in the N-type Si layer 142.

Next, on the surface of the epitaxial layer 142 was formed oxidized layer 146 with a thickness of 1000 angstroms. Then. another Si substrate having an oxidized layer 145 of 5000 angstroms formed on the surface was closely contacted with the above oxidized layer 146, and the two Si substrates were bonded together firmly by heating at 700° C. for 0.5 hour. Subsequently, the porous Si substrate was chemically etched away by use of hydrofluoric acid-nitric acid-acetic acid solution (1:3:8). As the result, the Si substrate made porous having a thickness of 200 microns was removed in 2 minutes.

A substrate having a monocrystalline Si layer on SiO$_2$ could be formed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less based on the maximum value of the thickness. As the result of plan-view observation of the monocrystalline Si layer by transmission electron microscopy, the dislocation defect density was found to be suppressed $1 \times 10^3/\text{cm}^2$ or less, whereby it could be confirmed that no new crystal defect had been introduced in the monocrystalline Si layer formation step to maintain good crystallinity. When the life time of minority carriers was measured for the monocrystalline layer by use of the MOS C-t method, a high value of $2.2 \times 10^{-3}$ sec. was exhibited.

EXAMPLE 33

A P-type (100) monocrystalline Si substrate having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes.

On the P-type (100) porous Si substrate 51 was grown a Si epitaxial layer 52 to a thickness of 0.5 microns at a low temperature by the MBE method. The deposition conditions are as follows:

Temperature: 700° C.

Pressure: $1 \times 10^{-9}$ Torr

Growth rate: 0.1 nm/sec.

Next, on the surface of the epitaxial layer 52 was superposed a fused silica substrate applied with optical polishing, and by heating in a nitrogen atmosphere at 800° C. for 0.5 hour, the two substrates were bonded firmly together. By the low pressure CVD method, $Si_3N_4$ was coated on the bonded substrate with a thickness of 0.1 µm. Subsequently, only the nitride film 54 on the porous substrate 51 was removed by reactive ion etching. Then, the porous Si substrate 51 was chemically etched away by use of hydrofluoric acid-nitric acid-acetic acid solution (1:3:8). As the result, the Si substrate 51 made porous having a thickness of 200 microns was removed in 2 minutes. After removal of the $Si_3N_4$ layer 54, a substrate having the monocrystalline Si layer 52 with a thickness of 0.5 µm on the fused silica 53 could be obtained.

As the result of cross-sectional observation by transmission electron microscopy, it was confirmed that no new crystal defect had been introduced in the Si layer to maintain good crystallinity.

EXAMPLE 34

A P-type (100) monocrystalline Si substrate having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes. On the P-type (100) porous Si substrate 51 was grown a Si epitaxial layer 52 to a thickness of 5 microns by the plasma CVD method. The deposition conditions are as follows:

Gas: $SiH_4$

Radio frequency power: 100W

Temperature: 800° C.

Pressure: $1 \times 10^{-2}$ Torr

Growth rate: 2.5 nm/sec.

Next, on the surface of the epitaxial layer 52 was superposed a glass substrate having a softening point around 500° C. applied with optical polishing, and by heating in a nitrogen atmosphere at 450° C. for 0.5 hour, the two substrates were bonded firmly together. By the low pressure CVD method, $Si_3N_4$ was coated on the bonded substrate with a thickness of 0.1 µm. Subsequently, only the nitride film 54 on the porous substrate 51 was removed by reactive ion etching. Then, the porous Si substrate was chemically etched away by use of 6M KOH solution. As the result, the Si substrate made porous having a thickness of 200 microns was removed in 2 minutes. After removal of the $Si_3N_4$ layer, the monocrystalline layer 52 with a thickness of 5 µm on the low softening glass substrate 53 could be obtained.

EXAMPLE 35

A P-type (100) monocrystalline Si substrate having a diameter of 3 inches and a thickness of 200 microns was anodized in a 50% HF solution. The current density at this time was 100 mA/cm². The porous structure formation rate at this time was 8.4 µm/min. and the P-type (100) Si substrate having a thickness of 200 microns as a whole was made porous in 24 minutes. On the P-type (100) porous Si substrate 51 was grown a Si epitaxial layer to a thickness of 1.0 micron by the bias sputtering method. The deposition conditions are as follows:

RF frequency: 100 MHz

Radio frequency power: 600W

Temperature: 300° C.

Ar gas pressure: $8 \times 10^{-3}$ Torr

Growth rate: 120 minutes

Target direct current bias: −200 V

Substrate direct current bias: +5 V.

Next, on the surface of the epitaxial layer 52 was superposed a glass substrate 53 having a softening point around 500° C. applied with optical polishing, and by heating in a nitrogen atmosphere at 450° C. for 0.5 hour, the two substrate were bonded firmly together. By the low pressure CVD method, $Si_3N_4$ was coated on the bonded substrate with a thickness of 0.1 µm. Subsequently, only the nitride film on the porous substrate was removed by reactive ion etching. Then, the porous Si substrate was chemically etched away by use of hydrofluoric acid-nitric acid-acetic acid solution (1:3:8). AS the result, the Si substrate 51 made porous having a thickness of 200 microns was removed in 2 minutes. After removal of the $Si_3N_4$ layer 54, a substrate having the monocrystalline layer 52 with a thickness of 1.0 µm on the low melting point glass could be obtained. The same effect cold be also obtained when Apiezon Wax was coated in place of the $Si_3N_4$ layer, and only the Si substrate 51 made porous could be removed.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less based on the maximum value of the thickness. As the result of plan-view observation of the monocrystalline Si layer by a transmission electron microscopy, the dislocation defect density was found to be suppressed $1 \times 10^3/\text{cm}^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.0 \times 10^{-3}$ sec. was exhibited.

EXAMPLE 36

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 51 was grown a Si epitaxial layer to a thickness of 10 microns by the liquid phase growth method. The growth conditions are as follows:

Solvent: Sn

Growth temperature: 900° C.

Growth atmosphere: H$_2$

Growth time: 20 minutes.

Next, on the surface of the epitaxial layer 52 was superposed a glass substrate 53 having a softening point around 800° C. applied with optical polishing, and by heating in a nitrogen atmosphere at 750° C. for 0.5 hour, the two substrates were bonded firmly together. By the low pressure CVD method, Si$_3$N$_4$ was coated on the bonded substrate with a thickness of 0.1 μm. Subsequently, only the nitride film on the porous substrate was removed by reactive ion etching. Then, the porous Si substrate was chemically etched away by use of hydrofluoric acid-nitric acid-acetic acid solution (1:3:8). As the result, the Si substrate 51 made porous having a thickness of 200 microns was removed in 2 minutes. After removal of the Si$_3$N$_4$ layer 54, a substrate having the monocrystalline Si layer 52 with a thickness of 10 μm on the glass 53 could be obtained. The same effect could be also obtained when Apiezon Wax was coated in place of the Si$_3$N$_4$ layer, and only the Si substrate made porous could be completely removed.

EXAMPLE 37

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 51 was grown a Si epitaxial layer 52 to a thickness of 1.0 micron by the low pressure CVD method. The deposition conditions are as follows:

Source gas: SiH$_4$ 800 SCCM

Carrier gas: H$_2$ 150 l/min.

Temperature: 850° C.

Pressure: 1×10$^{-2}$ Torr

Growth rate: 3.3 nm/sec.

Next, on the surface of the epitaxial layer 52 was superposed a fused silica substrate 53 applied with optical polishing, and by heating in a nitrogen atmosphere at 800° C. for 0.5 hour, the two Si substrates were bonded firmly together.

By the low pressure CVD method, Si$_3$N$_4$ was coated on the bonded substrate with a thickness of 0.1 μm. Subsequently, only the nitride film on the porous substrate was removed by reactive ion etching. Then, the porous Si substrate 51 was chemically etched away by use of hydrofluoric acid-nitric acid-acetic acid solution. As the result, the Si substrate 51 made porous having a thickness of 200 microns was removed in 2 minutes. After removal of the Si$_3$N$_4$ layer, a substrate having the monocrystalline Si layer 52 with a thickness of 1.0 μm on the fused silica substrate 53 could be formed.

When SiH$_2$Cl$_2$ as the source gas was employed, although it was necessary to elevate the growth temperature by some ten degrees, the accelerated chemical etching characteristics inherent in the porous substrate were maintained.

EXAMPLE 38

On a P-type (100) Si substrate 151 having a diameter of 4 inches and a thickness of 300 microns was grown a Si epitaxial layer 152 with a thickness of 1 micron by the CVD method. The deposition conditions are as follows:

Reactive gas flow rate: SiH$_2$Cl$_2$—1000 SCCM H$_2$—230 l/min.

Temperature: 1080° C.

Pressure: 80 Torr

Time: 2 min.

The substrate was anodized in a 50% HF solution. The current density at this time was 100 mA/cm$^2$. The porous structure formation rate at this time was 8.4 μm/min. and the P-type (100) Si substrate 151 having a thickness of 300 microns as a whole was made porous in 36 minutes. As described above, only the P-type (100) Si substrate 151 was made porous in this anodization, and there was no change in the Si epitaxial layer 152. Next, on the surface of the epitaxial layer 152 was superposed a fused silica substrate 154 applied with optical polishing, and the two substrates were bonded together firmly by heating at 800° C. for 0.5 hour in a nitrogen atmosphere. By the low pressure CVD method, Si$_3$N$_4$ was deposited with a thickness of 0.1 μm to be coated on the bonded substrate. Subsequently the nitride film 155 on the porous substrate 153 was removed by reactive ion etching. Then, the porous Si substrate was chemically etched away by use of hydrofluoric acid-nitric acid-acetic acid solution (1:3:8). As the result, the Si substrate 153 made porous having a thickness of 300 microns was removed in 4 minutes. After removal of the Si$_3$N$_4$ layer 155, a substrate having the monocrystalline Si layer 152 having a thickness of 1 μm on the fused silica substrate 154 could be formed.

As the result of cross-sectional observation by transmission electron microscopy, it was confirmed that no new crystal defect had been introduced in the Si layer to maintain good crystallinity.

EXAMPLE 39

On a P-type (100) Si substrate 151 having a diameter of 3 inches and a thickness of 200 microns was grown a Si epitaxial layer 152 with a thickness of 0.5 micron by the CVD method. The deposition conditions are as follows:

Reactive gas flow rate: SiH$_2$Cl$_2$—1000 SCCM H$_2$—230 l/min.

Temperature: 1080° C.

Pressure: 80 Torr

Time: 1 min.

The substrate was anodized in a 50% HF solution. The current density at this time was 100 mA/cm$^2$. The porous structure formation rate at this time was 8.4 μm/min. and the P-type (100) Si substrate 151 having a thickness of 200 microns as a whole was made porous in 24 minutes. Only the P-type (100) Si substrate was made porous in this anodization, and there was no change in the Si epitaxial layer 152.

Next, on the surface of the epitaxial layer 152 was superposed a fused silica substrate 154 applied with optical polishing, and the two substrates were bonded together firmly by heating at 800° C. for 0.5 hour. By the low pressure CVD method, Si$_3$N$_4$ was deposited with a thickness of 0.1 μm to be coated on the bonded substrate. Subsequently the nitride film 155 on the porous substrate 153 was removed by reactive ion etching. Then, the porous Si substrate was chemically etched away by use of hydrofluoric acid-nitric acid-acetic acid solution (1:3:8). As the result, the Si substrate 153 made porous having a thickness of 200 microns was removed in 2 minutes. After removal of the $Si_3N_4$ layer 155, a substrate having the monocrystalline Si layer 152 having a thickness of 0.5 µm on the fused silica 154 could be formed. As the result of cross-sectional observation by transmission electron microscopy, it was confirmed that no new crystal defect had been introduced in the Si layer to maintain good crystallinity.

EXAMPLE 40

On the surface of a P-type (100) Si substrate 151 having a diameter of 4 inches and a thickness of 300 microns was formed an N-type Si layer 152 with a thickness of 1 micron by ion implantation of protons.

The amount of $H^+$ implanted was $5 \times 10^{15}$ (ions/cm$^2$). The substrate was anodized in a 50% HF solution. The current density at this time was 100 mA/cm$^2$. The porous structure formation rate at this time was 8.4 µm/min. and the P-type (100) Si substrate 151 having a thickness of 300 microns as a whole was made porous in 37 minutes. Only the P-type (100) Si substrate was made porous in this anodization, and there was no change in the N-type Si layer 152. Next, on the surface of the N-type Si layer 152 was superposed a fused silica substrate 154 with optical polishing, and the two substrates were bonded together firmly by heating at 800° C. for 0.5 hour in a nitrogen atmosphere. By the low pressure CVD method, $Si_3N_4$ was deposited to a thickness of 0.1 µm to be coated on the bonded substrate. Subsequently, only the nitride film 155 on the porous substrate 153 was removed by reactive ion etching. Then, the porous Si substrate was chemically etched away by use of hydrofluoric acid-nitric acid-acetic acid solution. As the result, the Si substrate 151 made porous having a thickness of 300 microns was removed in 4 minutes. After removal of the $Si_3N_4$ layer 155, a substrate having the monocrystalline Si layer 152 with a thickness of 1.0 µm on the fused silica 154 could be formed.

Also the thickness of the monocrystalline Si layer obtained was examined by use of Scanning Ellipsometer. As the result, within the plane of the 4 inches of wafer, the difference between the maximum value and the minimum value of the thickness of the monocrystalline Si layer was found to be suppressed 6% or less based on the maximum value of the thickness. As the result of plan-view observation of the monocrystalline Si layer by a transmission electron microscopy, the dislocation defect density was found to be suppressed $1 \times 10^3$/cm$^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.2 \times 10^{-3}$ sec. was exhibited.

Shortly speaking, according to the present invention, in obtaining a Si crystalline layer excellent in crystallinity equal to monocrystalline Si wafer also on a light-transparent insulating material substrate represented by glass, a process for forming a semiconductor substrate excellent in aspects of productivity, uniformity, controllability, and economy can be provided. Further, according to the present invention, there can be provided a process for forming a semiconductor substrate broad in scope of application which can make use of the advantages of the SOI device of the prior.

EXAMPLE 41

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate 61 was grown a Si epitaxial layer 62 to a thickness of 0.5 microns by the MBE method. The deposition conditions are as follows:

Temperature: 700° C.

Pressure: $1 \times 10^{-9}$ Torr

Growth rate: 0.1 nm/sec.

Next, on the surface of the epitaxial layer 62 was superposed a fused silica substrate 63 applied with optical polishing, and by heating in a nitrogen atmosphere at 800° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 0.5 µm on the fused silica 63 could be obtained. As the result of cross-sectional observation by transmission electron microscopy, it was confirmed that no new crystal defect had been introduced in the Si layer to maintain good crystallinity.

EXAMPLE 42

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as whole was made porous in 24 minutes. On the P-type (100) porous Si substrate 61 was grown a Si epitaxial layer 62 to a thickness of 5 microns by the plasma CVD method. The deposition conditions are as follows:

Gas: $SiH_4$

Radio frequency power: 100W

Temperature: 800° C.

Pressure: $1 \times 10^{-2}$ Torr

Growth rate: 2.5 nm/sec.

Next, on the surface of the epitaxial layer 62 was superposed a glass substrate having a softening point around 500° C. applied with optical polishing, and by heating in a nitrogen atmosphere at 450° C. for 0.5 hour, the two substrates were bonded firmly together. Then, the porous Si substrate 61 was chemically etched away by use of 6M KOH solution. As the result, the Si substrate 61 made porous having a thickness of 200 microns was removed in 2 minutes. A substrate having the monocrystalline Si layer 62 with a thickness of 5 µm on the low softening point glass 63 could be obtained.

EXAMPLE 43

A P-type (100) monocrystalline Si substrate having a diameter of 3 inches and a thickness of 200 microns was anodized in a 50% HF solution. The current density at this time was 100 mA/cm$^2$. The porous structure formation rate at this time as 8.4 µm/min. and the P-type (100) Si substrate having a thickness of 200 microns as a whole was made porous in 24 minutes. On the P-type (100) porous Si substrate 61 was grown a Si epitaxial layer 62 to a thickness of 1.0 micron by the bias sputtering method. The deposition conditions are as follows:

FR frequency: 100 MHz
Radio frequency power: 600W
Temperature: 300° C.
Ar gas pressure: $8 \times 10^{-3}$ Torr
Growth rate: 120 minutes
Target direct current bias: −200 V
Substrate direct current bias: +5 V.

Next, on the surface of the epitaxial layer 62 was superposed a glass substrate 63 having a softening point around 500° C. applied with optical polishing, and by heating in a nitrogen atmosphere at 450° C. for 0.5 hour, the two substrates were bonded firmly together. Then, the porous Si substrate 61 was chemically etched away by use of 7M NaOH solution.

As described above, the chemical etching rate of ordinary Si monocrystal relative to 7M NaOH solution is about a little less than 1 micron per minute, but the chemical etching rate of the porous layer is accelerated by about 100-fold thereof. That is, the Si substrate 61 made porous having a thickness of 200 microns was removed in 2 minutes. A substrate having the monocrystalline Si layer 62 with a thickness of 1.0 μm on the low melting point glass 63 could be formed.

Also the thickness of the monocrystalline Si layer obtained was examined by use of Scanning Ellipsometer. As the result, within the plane of the 3 inches of wafer, the difference between the maximum value and the minimum value of the thickness of the monocrystalline Si layer was found to be suppressed 5% or less based on the maximum value of the thickness. As the result of plan-view observation of the monocrystalline Si layer by a transmission electron microscopy, the dislocation defect density was found to be suppressed $1 \times 10^3/cm^2$ or less, whereby it could be confirmed that no new crystal effect had been introduced in the monocrystalline Si layer formation step to maintain good crystallinity. When the life time of minority carriers was measured for the monocrystalline layer by use of the MOS C-t method, a high value of $2.1 \times 10^{-3}$ sec. was exhibited.

EXAMPLE 44

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 61 was grown a Si epitaxial layer 62 to a thickness of 10 microns by the liquid phase growth method. The growth conditions are as follows:

Solvent: Sn
Growth temperature: 900° C.
Growth atmosphere: $H_2$
Growth time: 20 minutes Next, on the surface of the epitaxial layer 62 was superposed a glass substrate 63 having a softening point around 800° C. applied with optical polishing, and by heating in a nitrogen atmosphere at 750° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 10 μm on the glass 63 could be obtained.

EXAMPLE 45

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 61 was grown a Si epitaxial layer to a thickness of 1.0 micron by the low pressure CVD method. The deposition conditions are as follows:

Source gas: $SiH_4$ 800 SCCM
Carrier gas: $H_2$ 150 l/min.
Temperature: 850° C.
Pressure: $1 \times 10^{-2}$ Torr
Growth rate: 3.3 nm/sec.

Next, on the surface of the epitaxial layer 62 was superposed a fused silica substrate 63 applied with optical polishing, and by heating in a nitrogen atmosphere at 800° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 1.0 μm on the fused silica 63 could be formed. When $SiH_2Cl_2$ as the source gas was employed, although it was necessary to elevate the growth temperature by some ten degrees, the accelerated chemical etching characteristics inherent in the porous substrate were maintained.

EXAMPLE 46

On a P-type (100) Si substrate 161 having a diameter of 4 inches and a thickness of 300 microns was grown a Si epitaxial layer 162 with a thickness of 1 micron by the CVD method. The deposition conditions are as follows:

Reactive gas flow rate: $SiH_2Cl_2$—1000 SCCM $H_2$—230 l/min.
Temperature: 1080° C.
Pressure: 80 Torr
Time: 2 min.

The substrate was anodized in a 50% HF solution. The current density at this time was 100 mA/cm². The porous structure formation rate at this time was 8.4 μm/min. and the P-type (100) Si substrate 161 having a thickness of 300 microns as a whole was made porous in 37 minutes. Only the P-type (100) Si substrate 161 was made porous in this anodization, and there was no change in the Si epitaxial layer 162. Next, on the surface of the epitaxial layer was superposed an optical polished fused silica glass substrate 164 and the two substrates were bonded together firmly by heating at 800° C. for 0.5 hour in a nitrogen atmosphere. Then, the porous Si substrate 163 was chemically etched away by use of hydrofluoric acid-nitric acid-acetic acid solution (1:3:8). As the result, the Si substrate 163 made porous having a thickness of 300 microns was removed in 4 minutes. A substrate having the monocrystalline Si layer 162 having a thickness of 1 μm on the fused silica glass substrate 164 could be formed.

Also the thickness of the monocrystalline Si layer obtained was examined by use of Scanning Ellipsometer. As the result, within the plane of the 4 inches of wafer, the difference between the maximum value and the minimum value of the thickness of the monocrystalline Si layer was found to be suppressed 7% or less based on the maximum value of the thickness. As the result of plan-view observation of the monocrystalline Si layer by a transmission electron microscopy, the dislocation defect density was found to be suppressed $1 \times 10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0 \times 10^{-3}$ sec. was exhibited.

EXAMPLE 47

On a P-type (100) Si substrate 161 having a diameter of 3 inches and a thickness of 200 microns was grown a Si epitaxial layer 162 with a thickness of 0.5 micron by the CVD method. The deposition conditions are as follows:

Reactive gas flow rate: $SiH_2Cl_2$—1000 SCCM $H_2$—230 l/min.
Temperature: 1080° C.
Pressure: 80 Torr
Time: 2 min.

The substrate was anodized in a 50% HF solution. The current density at this time was 100 mA/cm². The porous structure formation rate at this time was 8.4 µm/min. and the P-type (100) Si substrate 161 having a thickness of 200 microns as a whole was made porous in 24 minutes. Only the P-type (100) Si substrate 161 was made porous in this anodization, and there was no change in the Si epitaxial layer 162.

Next, on the surface of the epitaxial layer 162 was superposed an optical polished fused silica glass substrate 164 and the two substrates were bonded together firmly by heating at 800° C. for 0.5 hour. Then, the porous Si substrate 163 was chemically etched away by use of hydrofluoric acid-nitric acid-acetic acid solution. As the result, the Si substrate made porous having a thickness of 200 microns was removed in 2 minutes. A monocrystalline Si layer having a thickness of 0.5 µm on the glass substrate could be formed. As the result of cross-sectional observation by transmission electron microscopy, it was confirmed that no new crystalline defect had been introduced in the Si layer to maintain good crystallinity.

EXAMPLE 48

On the surface of a P-type (100) Si substrate 161 having a diameter of 3 inches and a thickness of 200 microns was formed an N-type Si layer 162 with a thickness of 1 micron by ion implantation of protons. The amount of H⁺ implanted was $5 \times 10^{15}$ (ions/cm²). The substrate was anodized in a 50% HF solution. The current density at this time was 100 mA/cm². The porous structure formation rate at this time was 8.4 µm/min. and the P-type (100) Si substrate 161 having a thickness of 200 microns as a whole was made porous in 24 minutes. Only the P-type (100) Si substrate 161 was made porous in this anodization, and there was no change in the N-type Si layer 162. Next, on the surface of the epitaxial layer 162 was superposed an optical polished fused silica glass substrate 164 and the two substrates were bonded together firmly by heating at 800° C. for 0.5 hour. Then, the porous Si substrate 163 was chemically etched away by use of hydrofluoric acid-nitric acid-acetic acid solution (1:3:8). As the result, the Si substrate 163 made porous having a thickness of 200 microns was removed in 4 minutes. A monocrystalline Si layer 162 with a thickness of 1.0 µm on the glass substrate 164 could be formed. As the result of cross-sectional observation by transmission electron microscopy, it was confirmed that no new crystal defect had been introduced in the Si layer to maintain good crystallinity.

EXAMPLE 49

A P-type (100) monocrystalline Si substrate having a diameter of 6 inches and a thickness of 600 microns was anodized in a 50% HF solution. The current density at this time was 10 mA/cm². In 10 minutes, a porous layer having a thickness of 20 microns was formed on the surface. On the P-type (100) porous Si substrate was grown a Si epitaxial layer to a thickness of 0.5 micron by the low pressure CVD method. The deposition conditions are as follows:

Gas: $SiH_2Cl_2$ (0.6 l/min.), $H_2$ (100 l/min.)
Temperature: 850° C.
Pressure: 50 Torr
Growth rate: 0.1 µm/min.

Next, the surface of the epitaxial layer was thermally oxidized to 50 nm. On the thus obtained thermally oxidized film was superposed another silicon substrate having an oxidized layer of 0.8 micron on the surface, and by heating in nitrogen atmosphere at 900° C. for 1.5 hours, the two substrates were firmly bonded together.

Thereafter, grinding of 585 microns was applied from the back side of the silicon substrate to have the porous layer exposed.

By the plasma CVD method, $Si_3N_4$ was deposited to a thickness of 0.1 µm to be coated on the bonded substrate. Subsequently, only the silicon nitride film on the porous substrate was removed by reactive ion etching.

Then, the bonded substrate was subjected to chemically selective etching by use of a hydrofluoric acid-nitric acid-acetic acid solution. After 15 minutes, the porous Si layer was chemically selectively etched to be completely removed, and only the monocrystalline Si layer as the etch-stop material remained without being chemically etched.

The chemical etching rate of non-porous Si monocrystalline relative to the etchant is very low as about 40 angstroms even after 15 minutes, whereby the selective ratio of the etching rate between the non-porous layer and the porous layer is very large and the etched amount in the non-porous Si layer was practically negligible. After removal of the $Si_3N_4$ layer, a monocrystalline Si layer having an insulating layer on the surface could be formed.

The same effect was also obtained when Apiezon Wax or Electron Wax was coated in place of the $Si_3N_4$, and only the Si layer made porous could be completely removed.

Also the thickness of the monocrystalline Si layer obtained was examined by use of Scanning Ellipsometer. As the result, within the plane of the 6 inches of wafer, the difference between the maximum value and the minimum value of the thickness of the monocrystalline Si layer was found to be suppressed 10% or less based on the maximum value of the thickness. As the result of plan view observation of the monocrystalline layer by a transmission electron microscopy, the dislocation defect density was found to be suppressed $1 \times 10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0 \times 10^{-3}$ sec. was exhibited.

EXAMPLE 50

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.
Pressure: 1×10$^{-9}$ Torr
Growth rate: 0.1 nm/sec

Then, the surface of the epitaxial layer was thermally oxidized to 50 nm. thickness. On the surface of the thermally oxidized layer was superposed a fused silica glass substrate, which had been optically polished, and they were heated at 800° C. for 0.5 hour in an oxygen atmosphere, so that the two substrates were bonded firmly together.

Then, an SI$_3$N$_4$ layer was deposited to a thickness of 0.1 μm by the low pressure CVD method to cover the bonded two substrates, and then only the Si$_3$N$_4$ layer on the porous substrate was removed by reactive ion etching.

Then, the bonded substrates were selectively etched in a mixture solution (10:6:50) of a 49% hydrofluoric acid, alcohol and hydrogen peroxide solution without stirring. A monocrystalline Si layer was left from etching after 65 minutes had passed, and the porous Si substrate was selectively etched and completely removed while using the monocrystalline Si layer as the etch-stop material.

The cross section of the monocrystalline Si layer was observed by a transmission electron microscope, resulting in no new crystal defect to be introduced into the Si layer, whereby it could be confirmed that good crystallinity can be maintained.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 51

A P-type (100) monocrystalline Si substrate having a thickness of 200 microns was anodized in a 50% HF solution. The current density at this time was 100 mA/cm$^2$. The porous structure formation rate at this time was 8.4 μn/min. and the P-type (100) Si substrate having a thickness of 200 microns as a whole was made porous in 24 minutes. On the P-type (100) porous Si substrate was grown a Si epitaxial layer to a thickness of 5 microns at a low temperature by the plasma CVD method. The deposition conditions are as follows:

Gas: SiH$_4$
Radio frequency power: 100W
Temperature: 800° C.
Pressure: 1×10$^{-2}$ Torr
Growth rate: 2.5 nm/sec.

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in an oxygen atmosphere, so that the two substrates were bonded firmly together.

Then, an Si$_3$N$_4$ layer was deposited to a thickness of 0.1 μm by the plasma CVD method to cover the bonded two substrates, and then only the Si$_3$N$_4$ layer on the porous substrate was removed by reactive ion etching.

Then, the bonded substrates were selectively etched in a mixture solution (10:6:50) of a 49% hydrofluoric acid, alcohol and hydrogen peroxide solution without stirring. A monocrystalline Si layer was left from etching after 65 minutes had passed, and the porous Si substrate was selectively etched and completely removed while using the monocrystalline Si layer as the etch-stop material.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 52

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate was grown a Si epitaxial layer to a thickness of 5 microns at a low temperature by the low pressure CVD method. The deposition conditions are as follows:

Gas: SiH$_2$Cl$_2$ (0.6 l/min) H$_2$ (100 l/min)
Temperature: 850° C.
Pressure: 50 Torr
Growth rate: 0.1 μm/min.

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in an oxygen atmosphere, so that the two substrates were bonded firmly together.

Then, an Si$_3$N$_4$ layer was deposited to a thickness of 0.1 μm by the plasma CVD method to cover the bonded two substrates, and then only the Si$_3$N$_4$ layer on the porous substrate was removed by reactive ion etching.

Then, the porous Si substrate was removed by etching in the same manner as Example 50, so that a monocrystalline Si layer having a thickness of 5 μm was formed on the low melting point glass substrate.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 53

A P-type (100) monocrystalline Si substrate having a thickness of 200 microns was anodized in a 50% HF solution.

The current density at this time was 100 mA/cm$^2$. The porous structure formation rate at this time 8.4 μm/min. and the P-type (100) Si substrate having a thickness of 200 microns as a whole was made porous in 24 minutes. On the P-type (100) porous Si substrate was grown a Si epitaxial layer to a thickness of 1.0 micron at a low temperature by the bias sputtering method. The deposition conditions are as follows:

RF frequency: 100 MHz

Radio frequency power: 600W

Temperature: 300° C.

Pressure: $8 \times 10^{-3}$ Torr

Growth time: 120 minutes

Target DC bias: −200V

Substrate DC bias: +5V

Then, the surface of the epitaxial layer was thermally oxidized to 50 nm. On the surface of the thermally oxidized layer was superposed a glass substrate having a softening point of about 500° C. and polished optically and a Si substrate, and they were heated at 450° C. for 0.5 hour in an oxygen atmosphere, so that the two substrates were bonded firmly together.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 50, so that a monocrystalline Si layer having a thickness of 1.0 μm wa formed on the low melting point glass substrate. Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 54

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as whole was made porous in 24 minutes. On the P-type (100) porous Si substrate was grown a Si epitaxial layer to a thickness of 10 microns at a low temperature by the liquid phase growth method. The deposition conditions are as follows:

Solvent: Sn

Growth temperature: 900° C.

Ambience for growing: $H_2$

Growth time: 20 minutes

Then, the surface of the epitaxial layer was thermally oxidized to 50 nm. On the surface of the thermally oxidized layer was superposed a glass substrate having a softening point of about 800° C. and polished optically and a Si substrate, and they were heated at 750° C. for 0.5 hour in an oxygen atmosphere, so that the two substrates were bonded firmly together.

Then, an $Si_3N_4$ layer was deposited to a thickness of 0.1 μm by the low pressure CVD method to cover the bonded two substrates, and then only the $Si_3N_4$ layer on the porous substrate was removed by reactive ion etching.

Then, the porous Si substrate was removed by etching in the same manner as in Example 50, so that a monocrystalline Si layer having a thickness of 10 μm was formed on the glass substrate.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 55

A Si epitaxial layer was grown on a P-type (100) Si substrate having a thickness of 200 microns to have a thickness of 0.5 microns. The deposition conditions are as follows:

Reactive gas flow rate: $SiH_2Cl_2$—1000 SCCM $H_2$—230 1/min.

Temperature: 1080° C.

Pressure: 80 Torr

Time: 1 min.

The aforesaid substrate was anodized in a 50% HF solution. The current density at this time was 100 mA/cm². The porous structure formation rate at this time was 8.4 μm/min. and the P-type (100) Si substrate having a thickness of 200 microns as whole was made porous in 24 minutes. As described above, only the P-type (100) Si substrate was made porous and the Si epitaxial layer was not changed by the anodization.

Then, the surface of the epitaxial layer was thermally oxidized to 50 nm. On the surface of the thermally oxidized layer was superposed a fused silica glass substrate polished optically, and they were heated at 800° C. for 0.5 hour in an oxygen atmosphere, so that the two substrates were bonded firmly together.

Then, an $Si_3N_4$ layer deposited to a thickness of 0.1 μm by the low pressure CVD method to cover the bonded two substrates, and then only the nitride layer on the porous substrate was removed by reactive ion etching.

Then, the porous Si substrate was removed by etching in the same manner as in Example 50, so that a monocrystalline Si layer having a thickness of 0.5 μm was formed on the glass substrate.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 56

An N-type Si layer was formed to have a thickness of 1 micron on the surface of a P-type (100) Si substrate having a thickness of 200 microns by ion implantation of protons. The quantity of $H^+$ implantation was $5 \times 10^{15}$ (ions/cm²). The aforesaid substrate was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization. Then, the surface of the N-type monocrystalline layer was thermally oxidized to 50 nm. On the surface of the thermally oxidized layer was superposed a fused silica glass substrate polished optically, and they were heated at 800° C. for 0.5 hour in an oxygen atmosphere, so that the two substrates were bonded firmly together.

Then, an $Si_3N_4$ layer was deposited to a thickness of 0.1 μm by the low pressure CVD method to cover the bonded two substrates, and then only the $Si_3N_4$ layer on the porous substrate was removed by reactive ion etching.

Then, the porous Si substrate was removed in the same manner as in Example 50, so that a monocrystalline Si layer having a thickness of 1.0 μm was formed on the glass substrate.

Field effect transistors were so manufactured in the aforesaid monocrystalline silicon thin film by the method according to Embodiment 14 that they were mutually connected to each other. As a result, a completely device and its integrated circuit were manufactured. The semiconductor device thus obtained displayed significantly excellent characteristics.

EXAMPLE 57

A P-type (100) monocrystalline Si substrate having a thickness of 500 microns was anodized in a 50% HF solution. The current density at this time was 10 mA/cm$^2$. As a result, a porous layer having a thickness of 20 microns was formed in 10 minutes. On the P-type (100) porous Si substrate was grown a Si epitaxial layer to a thickness of 0.5 microns by the low pressure CVD method. The deposition conditions are as follows:

Gas: $SiH_2Cl_2$ (0.6 l/min) $H_2$ (100 l/min)

Temperature: 850° C.

Pressure: 50 Torr

Growth rate: 0.1 μm/min

Then, the surface of the epitaxial layer was thermally oxidized to 50 nm. On the surface of the thermally oxidized layer was superposed a fused silica glass substrate polished optically, and they were heated at 450° C. for 0.5 hour in an oxygen atmosphere, so that the two substrates were bonded firmly together.

The silicon substrate was polished to 490 microns from its reverse side, so that the porous layer was exposed.

Then, an $Si_3N_4$ layer was deposited to a thickness of 0.1 μm by the plasma CVD method to cover the bonded two substrates, and then only the nitride layer on the porous substrate was removed by reactive ion etching.

Then, the porous Si substrate was removed by etching in the same manner as in Example 50, so that a monocrystalline Si layer having a thickness of 0.5 μm was formed on the fused silica glass substrate.

Field effect transistors were so manufactured in the thus obtained monocrystalline silicon thin film by the method according to Embodiment 14 that they were mutually connected to each other as a result, a complementary device and its integrated circuit were manufactured. The semiconductor device thus obtained displayed significantly excellent characteristics.

EXAMPLE 58

A Si epitaxial layer was caused to grow to have a thickness of 1 micron on a P-type (100) Si substrate having a thickness of 200 microns by the CVD method. The deposition conditions are as follows:

Reactive gas flow rate: $SiH_2Cl_2$—1000 SCCM $H_2$—230 l/min.

Temperature: 1080° C.

Pressure: 80 Torr

Time: 2 min.

The substrate was anodized in a 50% HF solution. The current density at this time was 100 mA/cm$^2$. The porous structure formation rate at this time was 8.4 μm/min. and the P-type (100) Si substrate having a thickness of 200 microns as whole was made porous in 24 minutes. As described above, only the P-type (100) Si substrate was made porous and the Si epitaxial layer was not changed by the anodization.

Then, on the surface of the epitaxial layer was superposed a fused silica glass substrate polished optically, and they were heated at 800° C. for 0.5 hour in an oxygen atmosphere, so that the two substrates were bonded firmly together.

The, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 50, so that a monocrystalline Si layer having a thickness of 1 μm was formed on the silica glass substrate.

Field effect transistors were so manufactured in the aforesaid monocrystalline silicon thin film by the method according to Embodiment 14 that they were mutually connected to each other. As a result, a complementary device and its integrated circuit were manufactured. The semiconductor device thus obtained displayed significantly excellent characteristics.

EXAMPLE 59

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.

Pressure: 1×10$^{-9}$ Torr

Growth rate: 0.1 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the bonded substrates were selectively etched in a mixture solution (10:6:50) of a 49% hydrofluoric acid, alcohol and 30% hydrogen peroxide solution without stirring. A monocrystalline Si layer was left from etching after 65 minutes had passed, and the porous Si substrate was selectively etched and completely removed while using the monocrystalline Si layer as the etch-stop material.

As a result, a monocrystalline Si layer having a thickness of 0.5 μm could be formed on the $SiO_2$ layer.

The cross section was observed by a transmission electron microscope, resulting in no new crystal defect to be introduced into the Si layer, whereby it could be confirmed that good crystallinity can be maintained.

Field effect transistor were so manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 60

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by the plasma CVD method. The deposition conditions are as follows:

Gas: SiH$_4$

Radio frequency power: 100W

Temperature: 800° C.

Pressure: 1×10$^2$ Torr

Growth rate: 2.5 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 0.5 μm could be formed on the SiO$_2$ layer.

Field effect transistors were so manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 61

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by the bias sputtering method. The deposition conditions are as follows:

Radio frequency: 100 MHz

Radio frequency power: 600W

Temperature: 300° C.

Ar gas pressure: 8×10$^{-3}$ Torr

Growth period: 60 minutes

Target DC bias: −200V

Substrate DC bias: +5V

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 0.5 μm was formed on the SiO$_2$ layer.

Field effect transistors were so manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 62

A N-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56(%)

On the N-type (100) porous Si substrate was grown a Si epitaxial layer to a thickness of 5 microns at a low temperature by the liquid phase growth method. The growth conditions are as follows:

Solvent: Sn

Temperature: 900° C.

Ambience for growing: H$_2$

Growth period: 50 minutes

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 5 μm was formed on the SiO$_2$ layer.

Field effect transistors were os manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 63

A P-Type (100) monocrystalline Si substrate having a thickness of 200 microns was anodized in an HF solution. The anodization conditions are as follows:

Applied voltage: 2.6(V)

Current density: 30 (mA·cm$^{-2}$)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 1.0 microns at a low temperature by the low pressure CVD method. The deposition conditions are as follows:

Source gas: $SiH_4$

Carrier gas: $H_2$

Temperature: 850° C.

Pressure: $1 \times 10^{-2}$ Torr

Growth rate: 3.3 nm/sec

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 1.0 μm was formed on the $SiO_2$ layer.

Field effect transistors were so manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 64

A Si epitaxial layer was grown on a P-type (100) Si substrate having a thickness of 200 microns to have a thickness of 1 microns by the CVD method. The deposition conditions are as follows:

Reactive gas flow rate: $SiH_2Cl_2$—1000 SCCM $H_2$—230 1/min

Temperature: 1080° C.

Pressure: 80 Torr

Time: 2 min.

The substrate was anodized in a 50% HF solution. The current density at this time was 100 $mA/cm^2$. The porous structure formation rate at this time was 8.4 μm/min, and the P-type (100) Si substrate having a thickness of 200 microns as a whole was made porous in 24 minutes. As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 1.0 μm was formed on the $SiO_2$ layer.

Field effect transistors were so manufactured in the aforesaid monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 65

A Si epitaxial layer was grown on a P-type (100) Si substrate having at thickness of 200 microns to have a thickness of 5 microns by the atmospheric pressure CVD method. The deposition conditions are as follows:

Reactive gas flow rate: $SiH_2Cl_2$—1000 SCCM $H_2$—230 1/min

Temperature: 1080° C.

Pressure: 760 Torr

Time: 1 min.

The substrate was anodized in an HF solution. The anodization conditions are as follows:

Applied voltage: 2.6 (V)

Current density: 30 $(mA \cdot cm^{-2})$

Anodization solution: $HF:H_2O:C_2H_5OH=1:1:1$

Time: 1.6 (hours)

Thickness of porous Si layer: 200 (μm)

Porosity: 56 (%)

As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that a monocrystalline Si layer having a thickness of 5 μm was formed on the $SiO_2$ layer.

Field effect transistors were so manufactured in the aforesaid monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 66

A N-type Si layer was formed to have a thickness of 1 micron on the surface of a P-type (100) Si substrate having a thickness of 200 microns by ion implantation of protons. The quantity of $H^+$ implantation was $5 \times 10^{15}$ (ions/$cm^2$). The aforesaid substrates was anodized in a 50% HF solution. The current density at this time was 100 $mA/cm^2$. The porous structure formation rate at this time was 8.4 μm/min, and the P-type (100) Si substrate having a thickness of 200 microns as a whole was made porous in 24 minutes. As described above, only the P-type (100) Si substrate was made porous and the N-type (100) Si layer was not changed by the anodization. Then, on the surface of the N-type Si layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 59, so that monocrystalline Si layer having a thickness of 0.5 μm was formed on the $SiO_2$ layer.

Field effect transistors were so manufactured in the aforesaid monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 67 a P-type (100) monocrystalline Si substrate having a thickness of 500 microns was anodized in a 50% HF solution. The current density at this time was 10 mA/cm$^2$. As a result, a porous layer having a thickness of 20 microns was formed in 10 minutes. On the P-type (100) porous Si substrate was grown a Si epitaxial layer to a thickness of 0.5 microns by the low pressure CVD method. The deposition conditions are as follows:

Gas: $SiH_2Cl_2$ (0.6 l/min) $H_2$ (100 l/min)

Temperature: 850° C.

Pressure: 50 Torr

Growth rate: 0.1 μm/min

Then, the surface of the epitaxial layer was thermally oxidized to 50 nm. On the surface of the thermally oxidized layer was superposed a silicon substrate having an oxidized layer the thickness of which was 0.8 microns, and they were heated at 900° C. for 1.5 hours in an oxygen atmosphere, so that the two substrates were bonded firmly together.

The silicon substrate was polished to 490 microns from its reverse side, so that the porous layer was caused to appear outside.

Then, the porous Si substrate was removed by etching in the same manner as in Example 59, so that a monocrystalline Si layer having a thickness of 0.5 μm was formed on the $SiO_2$ layer.

Field effect transistors were so manufactured in the thus obtained monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 68

A Si epitaxial layer was grown on a P-type (100) Si substrate having thickness of 200 microns to have a thickness of 1 micron by the CVD method. The deposition conditions are as follows:

Reactive gas flow rate: $SiH_2C_2$—1000 SCCM $H_2$—230 l/min

Temperature: 1080° C.

Pressure: 80 Torr

Time: 2 min.

The aforesaid substrate was anodized in a 50% HF solution. The current density at this time was 100 mA/cm$^2$. The porous structure formation rate at this time was 8.4 μm/min. and the P-type (100) Si substrate having thickness of 200 microns as a whole was made porous in 24 minutes. As described above, only the P-type (100) Si substrate was made porous and the Si epitaxial layer was not changed by the anodization.

Then, on the surface of the epitaxial layer was superposed a silicon substrate having a 0.8 microns oxidized layer formed on the surface thereof, and then they were heated at 900° C. for 1.5 hours in a oxygen atmosphere, so that the two Si substrates were bonded firmly together.

Then, the porous Si substrate was removed by etching in the same manner as in Example 59, so that a monocrystalline Si layer having a thickness of 1.0 μm was formed on the $SiO_2$ layer.

Field effect transistors were so manufactured in the aforesaid monocrystalline silicon thin film by the method according to Embodiment 15 that they were mutually connected to each other. As a result, a complementary device and its integrated circuit were manufactured. The semiconductor device thus obtained displayed significantly excellent characteristics.

EXAMPLE 69

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si Substrate was grown a Si epitaxial layer to a thickness of 0.5 microns at a low temperature by the MBE (Molecular Beam Epitaxy) method. The deposition conditions are as follows:

Temperature: 700° C.

Pressure: 1×10$^{-9}$ Torr

Growth rate: 0.1 nm/sec.

Then, the surface of the epitaxial layer was thermally oxidized to 50 nm. On the surface of the thermally oxidized layer was superposed a fused silica glass substrate, which has been optically polished, and they were heated at 800° C. for 0.5 hour in an oxygen atmosphere, so that the two Si substrates were bonded firmly together.

Then, an $SI_3N_4$ layer was deposited to a thickness of 0.1 μm by the low pressure CVD method to cover the bonded two substrates, and then only the $SI_3N_4$ layer on the porous substrate was removed by reactive ion etching.

Then, the bonded substrates were selectively etched in a mixture solution (10:6:50) of a 49% hydrofluoric acid, alcohol and hydrogen peroxide solution without a stir. A monocrystalline Si layer was left from etching after 65 minutes had passed, and the porous Si substrate was selectively etched and completely removed while using the monocrystalline Si layer as the etch-stop material.

The cross section was observed by a transmission electron microscope, resulting in no new crystal defect to be introduced into the Si layer, whereby it could be confirmed that good crystallinity can be maintained.

As a result, a monocrystalline Si layer having a thickness of 0.5 μm was formed on the silica glass substrate.

An NPN bipolar transistor was manufactured in the thus obtained monocrystal silicon thin film by the method according to Embodiment 16, resulting in the capacity between collector substrates to be reduced to 3.4 fF which is substantially a quarter of that obtainable in a case where a similar device was manufactured on a monocrystalline substrate. A RAM (Random Access Memory) having the aforesaid transistor as the main component was manufactured so as to evaluate its electric characteristics by subjecting it to a comparison with those of the device on the monocrystalline substrate. As a result, the gate delay time could be shortened by about 13% and as well as the electric power consumption could be reduced by about 10%.

EXAMPLE 70

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate was grown a Si epitaxial layer to a thickness of 5 microns at a low temperature by the plasma CVD method. The deposition conditions are as follows:

Gas: $SiH_4$

Radio frequency power: 100W

Temperature: 800° C.

Pressure: $1 \times 10^{-2}$ Torr

Growth rate: 2.5 nm/sec.

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in any oxygen atmosphere, so that the two substrates were bonded firmly together.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 69, so that a monocrystalline Si layer having a thickness of 5 μm was formed on the low softening point glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 71

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 5 microns by the low pressure CVD method. The deposition conditions are as follows:

Gas: $SiH_2Cl_2$ (0.6 l/min.) $H_2$ (100 l/min.)

Temperature: 850° C.

Pressure: 50 Torr

Time: 0.1 μm/min.

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in an oxygen atmosphere, so that the two substrates were bonded firmly together.

Then, an $Si_3N_4$ layer was deposited to a thickness of 0.1 μm by the plasma CVD method to cover the bonded two substrates, and then only the $SI_3N_4$ layer on the porous substrate was removed by reactive ion etching.

Then, the porous Si substrate was removed by etching in the same manner as in Example 69, so that a monocrystalline Si layer having a thickness of 5 μm was formed on the low softening point glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 72

A P-Type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 1.0 micron by the bias sputtering method. The deposition conditions are as follows:

RF frequency: 100 MHz

Radio frequency power: 600W

Temperature: 300° C.

Ar gas pressure: $8 \times 10^{-3}$ Torr

Growth period: 120 minutes

Target DC bias: −200 V

Substrate DC bias: +5 V

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in an oxygen atmosphere, so that the two substrates were bonded firmly together.

Then, an $Si_3N_4$ layer was deposited by a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 69, so that a monocrystalline Si layer having a thickness of 1 μm was formed on the low softening point glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 73

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 10 microns by the liquid phase growth method. The growth conditions are as follows:

Solvent: Sn

Growth temperature: 900° C.

Ambience for growth: $H_2$

Growth period: 20 minutes

Then, the surface of the epitaxial layer was thermally oxidized to 50 nm. On the surface of the thermally oxidized layer was superposed a glass substrate having a softening point of about 800° C. and polished optically, and they were heated at 750° C. for 0.5 hour in an oxygen atmosphere, so that the two substrates were bonded firmly together.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 69, so that a monocrystalline Si layer having a thickness of 10 μm was formed on the glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 74

On a P-type (100) Si substrate was grown a Si epitaxial layer to a thickness of 0.5 microns by the CVD method. The deposition conditions are as follows:

Reactive gas flow rate: $SiH_2Cl_2$—1000 SCCM $H_2$—230 l/min

Temperature: 1080° C.

Pressure: 80 Torr

Time: 1 min.

The aforesaid substrate was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, the surface of the epitaxial layer was thermally oxidized to 50 nm. On the surface of the thermally oxidized layer was superposed a fused silica glass substrate polished optically, and they were heated at 800° C. for 0.5 hour in an oxygen atmosphere, so that the two substrates were bonded firmly together.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 69, so that a monocrystalline Si layer having a thickness of 0.5 μm was formed on the glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 75

A N-type Si layer was formed to have a thickness of 1 micron on the surface of a P-type (100) Si substrate having a thickness of 200 microns by ion implantation of protons. The quantity of $H^+$ implantation was $5\times10^{15}$ (ions/cm²). The aforesaid substrates was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. As described above, only the P-type (100) Si substrate was made porous and the N-type Si layer was not changed by the anodization. Then, the surface of the N-type monocrystalline layer was thermally oxidized to 50 nm. On the surface of the thermally oxidized layer was superposed a fused silica glass substrate polished optically, and they were heated at 800° C. for 0.5 hour in an oxygen atmosphere, so that the two substrates were bonded firmly together.

Then, an $Si_3N_4$ layer was deposited to a thickness of 0.1 μm by the plasma CVD method to cover the bonded two substrates, and then only the $SI_3N_4$ layer on the porous substrate was removed by reactive ion etching.

Then, the porous Si substrate was removed by etching in the same manner as in Example 69, so that a monocrystalline Si layer having a thickness of 1.0 μm was formed on the glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 76

A P-type (100) monocrystalline Si substrate having a thickness of 500 microns was anodized in a 50% HF solution. The current density at this time was 10 mA/cm². As a result, a porous layer having a thickness of 20 microns was formed on the surface of the substrate in 10 minutes. On the P-type (100) porous Si substrate was grown a Si epitaxial layer to a thickness of 0.5 microns by the low pressure CVD method. The deposition conditions are as follows:

Gas: $SiH_2Cl_2$ (0.6 l/min) $H_2$ (100 l/min)

Temperature: 850° C.

Pressure: 50 Torr

Growth rate: 0.1 μm/min

Then, the surface of the epitaxial layer was thermally oxidized to 50 nm. On the surface of the thermally oxidized layer was superposed a fused silica glass substrate polished optically, and they were heated at 450° C. for 0.5 hour in an oxygen atmosphere, so that the two substrates were bonded firmly together.

The silicon substrate was polished to 490 microns from its reverse side, so that the porous layer was caused to appear outside.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 69, so that a monocrystalline Si layer having a thickness of 0.5 μm was formed on the fused silica glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 77

A Si epitaxial layer was grown on a P-type (100) Si substrate having a thickness of 200 microns to have a thickness of 1 micron by the CVD method. The deposition conditions are as follows:

Reactive gas flow rate: $SiH_2Cl_2$—1000 SCCM $H_2$—230 l/min

Temperature: 1080° C.

Pressure: 80 Torr

Time: 2 min.

The aforesaid substrate was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, on the surface of the epitaxial layer was superposed a fused silica glass substrate polished optically, and then they were heated at 800° C. for 0.5 hour in an oxygen atmosphere, so that the two Si substrates were bonded firmly together.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching similarly to Embodiment 69, so that a monocrystalline Si layer having a thickness of 1 μm was formed on the silica glass substrate.

Bipolar transistors were so manufactured in the aforesaid monocrystalline silicon thin film by the method according to Embodiment 16 that they were mutually connected to each other to manufacture its integrated circuit. The semiconductor device thus obtained displayed significantly excellent characteristics.

EXAMPLE 78

A P-type (100) monocrystalline Si substrate having a thickness of 200 microns was anodized in an HF solution. The anodization conditions are as follows:

Applied voltage: 2.6 (V)

Current density: 30 (mA·cm⁻²)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.

Pressure: 1×10⁻⁹ Torr

Growth rate: 0.1 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the bonded substrates were selectively etched in a mixture solution (10:6:50) of a 49% hydrofluoric acid, alcohol and 30% hydrogen peroxide solution without stirring. Only the monocrystalline Si layer was left from etching after 65 minutes had passed, and the porous Si substrate was selectively etched and completely removed while using the monocrystalline Si layer as the etch-stop material.

As a result, a monocrystalline Si layer having a thickness of 0.5 μm could be formed on the $SiO_2$ layer.

The cross section was observed by a transmission electron microscope, resulting in no new crystal defect to be introduced into the Si layer, whereby it could be confirmed that good crystallinity can be maintained.

An NPN bipolar transistor was manufactured in the thus obtained monocrystalline silicon thin film by the method according to Embodiment 17, resulting in the capacity between collector substrates to be reduced to 3.4 fF which is substantially a quarter of that obtainable in a case where a similar device was manufactured on a monocrystalline substrate. A RAM (Random Access Memory) having the aforesaid transistor as the main component was manufactured so as to evaluate its electric characteristics by subjecting it to a comparison with those of the device on the monocrystalline substrate. As a result, the gate delay time could be shortened by about 13% and as well as the electric power consumption could be reduced by about 10%.

EXAMPLE 79

A P-type (100) monocrystalline Si substrate having a thickness of 200 microns was anodized in an HF solution. The anodization conditions are as follows:

Applied voltage: 2.6 (V)

Current density: 30 (mA·cm⁻²)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by the plasma CVD method. The deposition conditions are as follows:

Gas: $SiH_4$

Radio frequency power: 100W

Temperature: 800° C.

Pressure: 1×10⁻² Torr

Growth rate: 2.5 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 0.5 μm could be formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 80

A P-type (100) monocrystalline Si substrate having a thickness of 200 microns was anodized in an HF solution. The anodization conditions are as follows:

Applied voltage: 2.6 (V)

Current density: 30 (mA·cm⁻²)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by bias sputtering method. The deposition conditions are as follows:

RF frequency: 100 MHz
Radio frequency power: 600W
Temperature: 300° C.
Ar gas pressure: $8\times10^{-3}$ Torr
Growth period: 60 minutes
Target DC bias: $-200V$
Substrate DC bias: $+5V$ Then, on the surface of the epitaxial layer was formed an oxidized layer having a thickness of 1000 Å, and another si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 0.5 μm could be formed on the $SiO_2$ layer.

Bipolar transistors were so manufactured in the aforesaid monocrystalline silicon thin film by the method according to Embodiment 17 that they wee mutually connected to each other to manufacture its integrated circuit. The semiconductor device thus obtained displayed significantly excellent characteristics.

EXAMPLE 81

A N-type (100) monocrystalline Si substrate having a thickness of 200 microns was anodized in an HF solution. The anodization conditions are as follows:

Applied voltage: 2.6 (V)
Current density: 30 ($mA\cdot cm^{-2}$)
Anodization solution: $HF:H_2O:C_2H_5OH=1:1:1$
Time: 1.6 (hours)
Thickness of porous Si layer: 200 (μm)
Porosity: 56 (%)

On the N-type (100) porous Si substrate was grown a Si epitaxial layer to a thickness of 5 microns at a low temperature by the liquid phase growth method. The deposition conditions are as follows:

Solvent: Sn
Growth temperature: 900° C.
Ambience for growth: $H_2$
Growth period: 50 minutes Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 5 μm could be formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 82

A P-type (100) monocrystalline Si substrate having a thickness of 200 microns was anodized in an HF solution. The anodization conditions are as follows:

Applied voltage: 2.6 (V)
Current density: 30 ($mA\cdot cm^{-2}$)
Anodization solution: $HF:H_2O:C_2H_5OH=1:1:1$
Time: 2.6 (hours)
Thickness of porous Si layer: 200 (μm)
Porosity: 56 (%)

On the P-type (100) porous Si substrate was grown a Si epitaxial layer to a thickness of 1.0 micron at a low temperature by the low pressure CVD method. The deposition conditions are as follows:

Source gas: $SiH_4$
Carrier gas: $H_2$
Temperature: 850° C.
Pressure: $1\times10^{-2}$ Torr
Growth rate: 3.3 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 1 μm could be formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 83

A Si epitaxial layer was grown on a P-type (100) Si substrate having a thickness of 200 microns to have a thickness of 1 micron by the CVD method. The deposition conditions are as follows:

Reactive gas flow rate: $SiH_2Cl_2$—1000 SCCM $H_2$—230 l/min
Temperature: 1080° C.
Pressure: 80 Torr
Time: 2 min.

The aforesaid substrate was anodized in a 50% HF solution. The current density at this time was 100 $mA/cm^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 1.0 μm could be formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 84

A Si epitaxial layer was grown on a P-type (100) Si substrate having a thickness of 200 microns to have a thickness of 5 micron, by the atmospheric pressure CVD method. The deposition conditions are as follows:

Reactive gas flow rate: $SiH_2Cl_2$—1000 SCCM $H_2$—230 l/min
Temperature: 1080° C.
Pressure: 760 Torr
Time: 1 min.

The aforesaid Si substrate was anodized in an HF solution. The anodization conditions are as follows:

Applied voltage: 2.6 (V)
Current density: 30 ($mA \cdot cm^{-2}$)
Anodization solution: $HF:H_2O:C_2H_5OH=1:1:1$
Time: 1.6 (hours)
Thickness of porous Si layer: 200 (μm)
Porosity: 56 (%)

As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 5 μm could be formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 85

A N-type Si layer was formed to have a thickness of 1 micron on the surface of a P-type (100) Si substrate having a thickness of 200 microns by ion implantation of protons. The quantity of $H^+$ implantation was $5 \times 10^{15}$ (ions/$cm^2$). The aforesaid substrates was anodized in a 50% HF solution. The current density at this time was 100 mA/$cm^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the N-type Si layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 78, so that a monocrystalline Si layer having a thickness of 1.0 μm could be formed on the SiO, layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 86

A P-type (100) monocrystalline Si substrate having a thickness of 500 microns was anodized in a 50% HF solution. The current density at this time was 10 mA/$cm^2$. As a result, a porous layer having a thickness of 20 microns was formed in 10 minutes. On the P-type (100) porous Si substrate was grown a Si epitaxial layer to a thickness of 0.5 microns by the low pressure CVD method. The deposition conditions are as follows:

Gas: $SiH_2Cl_2$ (0.6 l/min) $H_2$ (100 l/min)
Temperature: 850° C.
Pressure: 50 Torr
Growth rate: 0.1 μm/min Then, the surface of the epitaxial layer was thermally oxidized to 50 nm. On the surface of the thermally oxidized layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

The silicon substrate was polished to 490 microns from its reverse side, so that the porous layer was caused to appear outside.

Then, an $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 78, so that a monocrystalline Si layer having a thickness of 0.5 μm was formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 87A

A Si epitaxial layer was grown on a P-type (100) Si substrate having a thickness of 200 microns to have a thickness of 1 micron by the CVD method. The deposition conditions are as follows:

Reactive gas flow rate: $SiH_2Cl_2$—1000 SCCM $H_2$—230 l/min
Temperature: 1080° C.
Pressure: 80 Torr
Time: 2 min.

The aforesaid substrate was anodized in a 50% HF solution. The current density at this time was 100 mA/$cm^2$. The porous structure formation rate at this time was 8.4 μm/min. and the P-type (100) Si substrate having a thickness of 200 microns a whole was made porous in 24 minutes. As described above, only the P-type (100) Si substrate was made porous and the Si epitaxial layer was not changed by the anodization.

On the surface of the epitaxial layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

Then, an $Si_3N_4$ layer was deposited by thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 78, so that a monocrystalline Si layer having a thickness of 1 μm was formed on the $SiO_2$ layer.

Bipolar transistors were so manufactured in the aforesaid monocrystalline silicon thin film by the method according to Embodiment 17 that they were mutually connected to each other to manufacture its integrated circuit. The semiconductor device thus obtained displayed significantly excellent characteristics.

EXAMPLE 87B

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.

Pressure: $1 \times 10^{-9}$ Torr

Growth rate: 0.1 nm/sec.

Then, the surface of the epitaxial layer was thermally oxidized to 50 nm. On the surface of the thermally oxidized layer was superposed a fused silica glass substrate, which has been optically polished, and they were heated at 800° C. for 0.5 hour in a oxygen atmosphere, so that the two Si substrates were bonded firmly together.

Then, an $Si^3N_4$ layer was deposited to a thickness of 0.1 μm by a pressure-reduced CVD method to cover the bonded two substrates, and then only the $Si_3N_4$ layer on the porous substrate was removed by reactive ion etching.

Then, the bonded substrates were selectively etched in a mixture solution (10:6:50) of a 49% hydrofluoric acid, alcohol and hydrogen peroxide solution without stirring. Only the monocrystalline Si layer was left from etching after 65 minutes had passed, and the porous Si substrate was selectively etched and completely removed while using the monocrystalline Si layer as the etch-stop material.

Then, the $Si_3N_4$ layer was removed, resulting in a monocrystalline Si layer having a thickness of 0.5 μm to be formed on the silica glass substrate.

The cross section was observed by a transmission electron microscope, resulting in no new crystal defect to be introduced into the Si layer, whereby it could be confirmed that good crystallinity can be maintained.

Then, an epitaxial layer was allowed to grow on the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured. As a result, the power transistor displayed a voltage resistance of 1000V.

EXAMPLE 88

A P-type (100) monocrystalline Si substrate having a thickness of 200 microns was anodized in a 50% HF solution.

The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate was grown a Si epitaxial layer to a thickness of 5 microns at a low temperature by the plasma CVD method. The deposition conditions are as follows:

Gas: $SiH_4$

Radio frequency power: 100W

Temperature: 800° C.

Pressure: $1 \times 10^{-2}$ Torr

Growth rate: 2.5 nm/sec.

Then, the surface of the epitaxial layer was thermally oxidized to 50 nm. On the surface of the thermally oxidized layer was superposed a fused silica glass substrate having a softening point of 500° C. and optically polished, and they were heated at 450° C. for 0.5 hour in an oxygen atmosphere, so that the two substrates were bonded firmly together.

Then, an $Si_3N_4$ layer was deposited to a thickness of 0.1 μm by the low pressure plasma CVD method to cover the bonded two substrates, and then only the $Si_3N_4$ layer on the porous substrate was removed by reactive ion etching.

Then, the porous Si substrate was removed by etching in the same manner as in Example 87B, so that a monocrystalline Si layer having a thickness of 5 μm was formed on the low softening point glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 89

A P-type (100) monocrystalline Si substrate having a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 5 microns at a low temperature by the low pressure CVD method. The deposition conditions are as follows:

Gas: $SiH_2Cl_2$ (0.6 l/min) $H_2$ (100 l/min)

Temperature: 850° C.

Pressure: 50 Torr

Growth rate: 0.1 μm/min

Then, the surface of the epitaxial layer was thermally oxidized to 50 nm. On the surface of the thermally oxidized layer was superposed a fused silica glass substrate having a softening point of about 500° C. and optically polished, and they were heated at 450° C. for 0.5 hour in an oxygen atmosphere, so that the two substrates were bonded firmly together.

Then, an $Si_3N_4$ layer was deposited to a thickness of 0.1 μm by the low pressure plasma CVD method to cover the bonded two substrates, and then only the $Si_3N_4$ layer on the porous substrate was removed by reactive ion etching.

Then, the porous Si substrate was removed by etching in the same manner as in Example 87B, so that a monocrystalline Si layer having a thickness of 5 μm was formed on the low melting point glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 90

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 1.0 micron at a low temperature by the bias sputtering method. The deposition conditions are as follows:

RF frequency: 100 MHz
Radio frequency power: 600W
Temperature: 300° C.
Ar gas pressure: 8×10$^{-3}$ Torr
Growth period: 120 minutes
Target DC bias: −200V
Substrate DC bias: +5V Then, the surface of the epitaxial layer was thermally oxidized to 50 nm. On the surface of the thermally oxidized layer was superposed a glass substrate having softening point of about 500° C. and optically polished, and they were heated at 450° C. for 0.5 hour in an oxygen atmosphere, so that the two substrates were bonded firmly together.

Then, an Si$_3$N$_4$ layer was deposited by a thickness of 0.1 μm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 87, so that a monocrystalline Si layer having a thickness of 1.0 μm was formed on the low melting point glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 91

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 10 microns at a low temperature by the liquid phase growth method. The growth conditions are as follows:

Solvent: Sn
Growth Temperature: 900° C.
Ambience for growth: H$_2$
Growth period: 20 minutes Then, the surface of the epitaxial layer was thermally oxidized to 50 nm. On the surface of the thermally oxidized layer was superposed a glass substrate having a softening point of about 800° C. and optically polished, and they were heated at 750° C. for 0.5 hour in an oxygen atmosphere, so that the two substrates were bonded firmly together.

Then, an Si$_3$N$_4$ layer was deposited by a thickness of 0.1 μm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 87B, so that a monocrystalline Si layer having a thickness of 10 μm was formed on the glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 92

A Si epitaxial layer was grown on a P-type (100) Si substrate having a thickness of 200 microns to have a thickness of 0.5 microns by the CVD method. The deposition conditions are as follows:

Reactive gas flow rate: SiH$_2$Cl$_2$—1000 SCCM H$_2$—230 1/min
Temperature: 1080° C.
Pressure: 80 Torr
Time: 1 min.

Then aforesaid substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, the surface of the epitaxial layer was thermally oxidized to 50 nm. On the surface of the thermally oxidized layer was superposed a fused silica glass substrate optically polished, and they were heated at 800° C. for 0.5 hour in an oxygen atmosphere, so that the two substrates were bonded firmly together.

Then, an Si$_3$N$_4$ layer was deposited to a thickness of 0.1 μm by the low pressure plasma CVD method to cover the bonded two substrates, and then only the SI$_3$N$_4$ layer on the porous substrate was removed by reactive ion etching.

Then, the porous Si substrate was removed by etching in the same manner as in Example 87B, so that a monocrystalline Si layer having a thickness of 0.5 μm was formed on the glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

EXAMPLE 93

A N-type Si layer was formed to have a thickness of 1 micron on the surface of a P-type (100) Si substrate having a thickness of 200 microns by ion implantation of protons. The quantity of H$^+$ implantation was $5 \times 10^{15}$ (ions/cm$^2$). The aforesaid substrate was anodized in 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. As described above, only the P-type Si layer was made porous and the N-type Si layer was not changed by the anodization.

Then, the surface of the epitaxial layer was thermally oxidized to 50 nm. On the surface of the thermally oxidized layer was superposed a fused silica glass substrate optically polished, and they were heated at 800° C. for 0.5 hour in an oxygen atmosphere, so that the two substrates were bonded firmly together.

Then, an Si$_3$N$_4$ layer was deposited to thickness of 0.1 µm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 87B, so that a monocrystalline Si layer having a thickness of 1.0 µm was formed on the glass substrate.

An epitaxial Si layer was allowed to grow in the thus obtained monocrystalline silicon layer, and, then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 94

A P-type (100) monocrystalline Si substrate having a thickness of 500 microns was anodized in a 50% HF solution. The current density at this time was 10 mA/cm$^2$. As a result, a porous layer having a thickness of 20 microns was formed in 10 minutes on the surface of the substrate.

On the P-type (100) porous Si substrate was grown a Si epitaxial layer to a thickness of 0.5 microns by the low pressure CVD method. The deposition conditions are as follows:

Gas: SiH$_2$Cl$_2$ (0.6 l/min) H$_2$ (100 l/min)

Temperature: 850° C.

Pressure: 50 Torr

Growth rate: 0.1 µm/min

Then, the surface of the epitaxial layer was thermally oxidized to 50 nm. On the surface of the thermally oxidized layer was superposed a fused silica glass substrate polished optically, and they were heated at 450° C. for 0.5 hour in an oxygen atmosphere, so that the two substrates were bonded firmly together.

The silicon substrate was polished to 490 microns from its reverse side, so that the porous layer was caused to appear outside.

Then, an Si$_3$N$_4$ layer was deposited to thickness of 0.1 µm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 87B, so that a monocrystalline Si layer having a thickness of 0.5 µm was formed on the fused silica glass substrate.

An epitaxial Si layer was allowed to grow in the thus obtained monocrystalline silicon layer, and then an insulating gate type field effect transistor, a bipolar transistor and an insulting gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 95

A Si epitaxial layer was grown on a P-type (100) Si substrate having a thickness of 200 microns to have a thickness of 1 micron by the CVD method. The deposition conditions are as follows:

Reactive gas flow rate: SiH$_2$Cl$_2$—1000 SCCM H$_2$—230 l/min

Temperature: 1080° C.

Pressure: 80 Torr

Time: 2 min.

The aforesaid substrate was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. As described above, only the P-type (100) Si substrate was made porous and the Si epitaxial layer was not changed by the anodization.

On the surface of the epitaxial layer was superposed a fused silica glass substrate polished optically, and they were heated at 800° C. for 0.5 hour in an oxygen atmosphere, so that the two substrates were bonded firmly together.

Then, an Si$_3$N$_4$ layer was deposited to a thickness of 0.1 µm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 87B, so that a monocrystalline Si layer having a thickness of 1 µm was formed on the silica glass substrate.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 96

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (µm)

Porosity: 56 (%)

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.
Pressure: $1 \times 10^{-9}$ Torr
Growth rate: 0.1 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the bonded substrates were selectively etched in a mixture solution (10:6:50) of a 49% hydrofluoric acid, alcohol and 30% hydrogen peroxide solution without stirring. A monocrystalline Si layer was left from etching after 65 minutes had passed, and the porous Si substrate was selectively etched and completely removed while using the monocrystalline Si layer as the etch-stop material.

As a result, a monocrystalline Si layer having a thickness of 0.5 μm could be formed on the $SiO_2$ layer.

The cross section was observed by a transmission electron microscope, resulting in no new crystal defect to be introduced into the Si layer, whereby it could be confirmed that good crystallinity can be maintained.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured. As a result, the power transistor displayed a voltage resistance of 1000V.

EXAMPLE 97

A P-type (100) monocrystalline Si substrate having a thickness of 200 microns was anodized in an HF solution. The anodization conditions are as follows:

Applied voltage: 2.6 (V)
Current density: 30 (mA·cm$^{-2}$)
Anodization solution: HF:$H_2O$:$C_2H_5OH$=1:1:1
Time: 1.6 (hours)
Thickness of porous Si layer: 200 (μm)
Porosity: 56 (%)

On the P-type (100) porous Si substrate was grown a Si epitaxial layer to a thickness of 0.5 microns at a low temperature by the plasma CVD method. The deposition conditions are as follows:

Gas: $SiH_4$
Radio frequency power: 100W
Temperature: 800° C.
Growth rate: 2.5 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 0.5 μm was formed on the $SiO_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 98

A P-type (100) monocrystalline Si substrate having a thickness of 200 microns was anodized in an HF solution. The anodization conditions are as follows:

Applied voltage: 2.6(V)
Current density: 30 (mA·cm$^{-2}$)
Anodization solution: HF:$H_2O$:$C_2H_5OH$=1:1:1
Time: 1.6 (hours)
Thickness of porous Si layer: 200 (μm)
Porosity: 56 (W)

On the P-type (100) porous Si substrate was grown a Si epitaxial layer to a thickness of 0.5 microns at a low temperature by the bias sputtering method. The deposition conditions are as follows:

RF frequency: 100 MHz
Radio frequency power: 600W
Temperature: 300° C.
Ar gas pressure: $8 \times 10^{-3}$ Torr
Growth time: 60 minutes
Target DC bias: −200V
Substrate DC bias: +5 V Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 0.5 μm was formed on the $SiO_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 99

An N-type (100) monocrystalline Si substrate having a thickness of 200 microns was anodized in an HF solution. The anodization conditions are as follows:

Applied voltage: 2.6 (V)
Current density: 30 mA·cm$^{-2}$)
Anodization solution: HF:$H_2O$:$C_2H_5OH$=1:1:1
Time: 1.6 (hours)
Thickness of porous Si layer: 200 (μm)
Porosity: 56 (%)

On the N-type (100) porous Si substrate was grown a Si epitaxial layer to a thickness of 5 microns at a low temperature by the liquid phase growth method. The growth conditions are as follows:

Solvent: Sn

Growth temperature: 900° C.

Ambience for growth: $H_2$

Growth period: 50 minutes

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 5 μm was formed on the $SiO_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 100

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 1.0 micron at a low temperature by the low pressure CVD method. The deposition conditions are as follows:

Source gas: $SiH_4$

Carrier gas: $H_2$

Temperature: 850° C.

Pressure: $1 \times 10^{-2}$ Torr

Growth rate: 3.3 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 1.0 μm was formed on the $SiO_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 101

A Si epitaxial layer was grown on a P-type (100) Si substrate having a thickness of 200 microns to have a thickness of 1 micron by the CVD method. The deposition conditions are as follows:

Reactive gas flow rate: $SiH_2Cl_2$—1000 SCCM $H_2$—230 l/min

Temperature: 1080° C.

Pressure: 80 Torr

Time: 2 min.

The aforesaid substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, on she surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner in Example 96, so that a monocrystalline Si layer having a thickness of 1.0 μm was formed on the $SiO_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 102

A Si epitaxial layer was grown on a P-type (100) Si substrate having a thickness of 200 microns to have a thickness of 1 micron by the atmospheric pressure CVD method. The deposition conditions are as follows:

Reactive gas flow rate: $SiH_2Cl_2$—1000 SCCM $H_2$—230 l/min

Temperature: 1080° C.

Pressure: 760 Torr

Time: 1 min.

The Si substrate was anodized in an HF solution. The anodization conditions are as follows:

Applied voltage: 2.6 (V)

Current density: 30 (mA·cm$^{-2}$)

Anodization solution: $HF:H_2O:C_2H_5OH=1:1:1$

Time: 1.6 (hours)

Thickness of porous Si layer: 200 (μm)

Porosity: 56 (%)

As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 5 μm was formed on the SiO$_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 103

A N-type Si layer was formed to have a thickness of 1 micron on the surface of a P-type (100) Si substrate having a thickness of 200 microns by ion implantation of protons. The quantity of H$^+$ implantation was 5×10$^{15}$ (ions/cm$^2$).

The aforesaid substrates was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the N-type Si layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 96, so that a monocrystalline Si layer having a thickness of 1.0 μm was formed on the SiO$_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 104

A P-type (100) monocrystalline Si substrate having a thickness of 500 microns was anodized in a 50% HF solution. The current density at this time was 10 mA/cm$^2$. As a result, a porous layer having a thickness of 20 microns was formed in 10 minutes on the surface on the substrate.

On the P-type (100) porous Si substrate was grown a Si epitaxial layer to a thickness of 0.5 microns by the low pressure CVD method. The deposition conditions are as follows:

Gas: SiH$_2$Cl$_2$(0.6 l/min) H$_2$ (100 l/min)
Temperature: 850°
Pressure: 50 Torr
Growth rate: 0.1 μm/min Then, the surface of the epitaxial layer was thermally oxidized to 50 nm. On the surface of the thermally oxidized layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

The silicon substrate was polished to 490 microns from its reverse side, so that the porous layer was caused to appear outside.

Then, an Si$_3$N$_4$ layer was deposited to a thickness of 0.1 μm by the plasma CVD method to cover the bonded two substrates, and then only the nitride layer on the porous substrate was removed by reactive ion etching.

Then, the porous Si substrate was removed by etching in the same manner as in Example 96, so that a monocrystalline Si layer having a thickness of 0.5 μm was formed on the SiO$_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 105

A Si epitaxial layer was grown on a P-type (100) Si substrate having a thickness of 200 microns to have a thickness of 1 micron by the CVD method. The deposition conditions are as follows:

Reactive gas flow rate: SiH$_2$Cl$_2$—1000 SCCM H$_2$—230 l/min

Temperature: 1080° C.
Pressure: 80 Torr
Time: 2 min.

The aforesaid substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

On the surface of the epitaxial layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

Then, a Si$_3$N$_4$ layer was deposited to a thickness of 0.1 μm by the plasma CVD method to cover the bonded two substrates, and then only the Si$_3$N$_4$ layer on the porous substrate was removed by reactive ion etching.

Then, the porous Si substrate was removed by etching in the same manner as in Example 96, so that a monocrystalline Si layer having a thickness of 1 μm was formed on the SiO$_2$ layer.

An epitaxial Si layer was allowed to grow in the thus obtained monocrystalline silicon layer, and then an insulating gate type field effect transistor, a bipolar transistor and an insulating gate type bipolar transistor were manufactured as the power transistor by the method according to Embodiments 18 to 20, and furthermore their integrated circuits were manufactured.

The semiconductor device thus obtained displayed significantly excellent characteristics.

EXAMPLE 106

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.

Pressure: 1×10$^{-9}$ Torr

Growth rate: 0.1 nm/sec.

Then, the surface of the epitaxial layer was thermally oxidized to 50 nm. On the surface of the thermally oxidized layer was superposed a fused silica glass substrate, which has been optically polished, and they were heated at 800° C. for 0.5 hour in an oxygen atmosphere, so that the two Si substrates were bonded firmly together.

Then, a Si$_3$N$_4$ layer was deposited to a thickness of 0.1 μm by the low pressure CVD method to cover the bonded two substrates, and then only the Si$_3$N$_4$ layer on the porous substrate was removed by reactive ion etching.

Then, the bonded substrates were selectively etched in a mixture solution (10:6:50) of a 49% hydrofluoric acid, alcohol and 30% hydrogen peroxide solution without stirring. Only the monocrystalline Si layer was left from etching after 65 minutes had passed, and the porous Si substrate was selectively etched and completely removed while using the monocrystalline Si layer as the etch-stop material.

Then, the Si$_3$N$_4$ layer was removed, resulting in a monocrystalline Si layer having a thickness of 0.5 μm to be formed on the silica glass substrate.

The cross section was observed by a transmission electron microscope, resulting in no new crystal defect to be introduced into the Si layer, whereby it could be confirmed that good crystallinity can be maintained.

An NPN-type bipolar transistor, an N-channel field effect transistor and a P-channel field effect transistor were manufactured in the thus obtained monocrystalline silicon layer so as to be connected mutually in the same method as that of Embodiment 24, so that an integrated circuit was manufactured.

The semiconductor device thus obtained displayed significantly excellent characteristics.

EXAMPLE 107

A P-type monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 5 microns at a low temperature by the plasma CVD method. The deposition conditions are as follows:

Gas: SiH$_4$

Radio frequency power: 100W

Temperature: 800° C.

Pressure: 1×10$^{-2}$ Torr

Growth rate: 2.5 nm/sec.

Then, the surface of the epitaxial layer was thermally oxidized to 50 nm. On the surface of the thermally oxidized layer was superposed a fused silica glass substrate having a softening point of 500° C. and optically polished, and they were heated at 450° C. for 0.5 hour in an oxygen atmosphere, so that the two substances were bonded firmly together.

Then, a Si$_3$N$_4$ layer was deposited by a thickness of 0.1 μm by the plasma CVD method to cover the bonded two substrates, and then only the Si$_3$N$_4$ layer on the porous substrate was removed by reactive ion etching.

Then, the porous Si substrate was removed by etching in the same manner as in Example 106, so that a monocrystalline Si layer having a thickness of 5 μm was formed on the low softening point glass substrate.

An NPN-type bipolar transistor, an N-channel field effect transistor and a P-channel field effect transistor were manufactured in the thus obtained monocrystalline silicon layer so as to be connected mutually by the same method as that of Embodiment 24, so that an integrated circuit was manufactured.

The semiconductor device thus obtained displayed significantly excellent characteristics.

EXAMPLE 108

A P-type (100) monocrystalline Si substrate having a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate was grown a Si epitaxial layer to a thickness of 5 microns at a low temperature by the low pressure CVD method. The deposition conditions are as follows:

Gas: SiH$_2$Cl$_2$—0.6 l/min.

H$_2$—100 l/min.

Temperature: 850° C.

Pressure: 50 Torr

Growth rate: 0.1 μm/min.

Then, the surface of the epitaxial layer was thermally oxidized to 50 nm. On the surface of the thermally oxidized layer was superposed a glass substrate having a softening point of about 500° C. and polished optically, and they were heated at 450° C. for 0.5 hour in an oxygen atmosphere, so that the two substrates were bonded firmly together.

Then, a Si$_3$N$_4$ layer was deposited to a thickness of 0.1 μm by the plasma CVD method to cover the bonded two substrates, and then only the Su$_3$N$_4$ layer on the porous substrate was removed by reactive ion etching.

Then, the porous Si substrate was removed by etching in the same manner as in Example 106, so that a monocrystalline Si layer having a thickness of 5 μm was formed on the low softening point glass substrate.

An NPN-type bipolar transistor, a n N-channel field effect transistor and a P-channel field effect transistor were manufactured in the thus obtained monocrystalline silicon layer so as to be connected mutually by the same method as that of Embodiment 24, so that an integrated circuit was manufactured.

The semiconductor device thus obtained displayed significantly excellent characteristics.

EXAMPLE 109

A P-type (100) monocrystalline Si substrate having a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate was grown a Si epitaxial layer to a thickness of 5 microns at a low temperature by the low pressure CVD method. The deposition conditions are as follows:

RF frequency: 100 MHz
Radio frequency power: 600W
Temperature: 800° C.
Pressure: 8×10$^{-3}$ Torr
Growth period: 120 minutes
Target DC bias: −200V
Substrate DC bias: +5V Then, the surface of the epitaxial layer was thermally oxidized to 50 nm. On the surface of the thermally oxidized layer was superposed a glass substrate having a softening point of about 500° C. and polished optically and a Si substrate, and they were heated at 450° C. for 0.5 hour in an oxygen atmosphere, so that the two substrates were bonded firmly together.

Then, a Si$_3$N$_4$ layer was deposited to a thickness of 0.1 µm by the plasma CVD method to cover the bonded two substrates, and then only the Si$_3$N$_4$ layer on the porous substrate was removed by reactive ion etching.

EXAMPLE 110

A P-type (100) monocrystalline Si substrate having a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate was grown a Si epitaxial layer to a thickness of 10 microns at a low temperature by the liquid growth method. The deposition conditions are as follows:

Solvent: Sn
Growth temperature: 900° C.
Ambience for growth: H$_2$
Growth period: 20 minutes Then, the surface of the epitaxial layer was thermally oxidized to 50 nm. On the surface of the thermally oxidized layer was superposed a glass substrate having a softening point of about 800° C. and optically polished, and they were heated at 750° C. for 0.5 hour in an oxygen atmosphere, so that the two substrates were bonded firmly together.

Then, a Si$_3$N$_4$ layer was deposited to a thickness of 0.1 µm by the low pressure plasma CVD method to cover the bonded two substrates, and then only the Si$_3$N$_4$ layer on the porous substrate was removed by reactive ion etching.

Then, the porous Si substrate was removed by etching in the same manner as in Example 106, so that a monocrystalline Si layer having a thickness of 1 µm was formed on the SiO$_2$ layer.

An NPN-type bipolar transistor, an N-channel field effect transistor and a P-channel field effect transistor were manufactured in the thus obtained monocrystalline silicon layer so as to be connected mutually by a method similar to that according to Embodiment 24, so that an integrated circuit was manufactured.

The semiconductor device thus obtained displayed significantly excellent characteristics.

EXAMPLE 111

A Si epitaxial layer was grown on a P-type (100) Si substrate having a thickness of 200 microns to have a thickness of 0.5 microns by the CVD method. The deposition conditions are as follows:

Reactive gas flow rate: SiH$_2$Cl$_2$—1000 SCCM H$_2$—230 l/min.
Temperature: 1080° C.
Pressure: 80 Torr
Time: 1 min.

The aforesaid substrate was anodized in a 50% HF solution. The current density at this time was 100 mA/cm$^2$. The porous structure formation rate at this time was 8.4 µm/min. and the P-type (100) Si substrate having a thickness of 200 microns as whole was made porous in 24 minutes. As described above, only the P-type (100) Si substrate was made porous and the Si epitaxial layer was not changed by the anodization.

Then, the surface of the epitaxial layer was thermally oxidized to 50 nm. On the surface of the thermally oxidized layer was superposed a fused silica glass substrate optically polished, and they were heated at 800° C. for 0.5 hour in an oxygen atmosphere, so that the two substrates were bonded firmly together.

Then, an Si$_3$N$_4$ layer was deposited to a thickness of 0.1 µm by the low pressure plasma CVD plasma CVD method to cover the bonded two substrates, and then only the Si$_3$N$_4$ layer on the porous substrate was removed by reactive ion etching.

Then, the porous Si substrate was removed by etching in the same manner as in Example 106, so that a monocrystalline Si layer having a thickness of 0.5 µm was formed on the silica glass substrate.

An NPN-type bipolar transistor, an N-channel field effect transistor and a P-channel field effect transistor were manufactured in the thus obtained single crystal silicon layer so as to be connected mutually by the same method as that of Embodiment 24, so that an integrated circuit was manufactured.

The semiconductor device thus obtained displayed significantly excellent characteristics.

EXAMPLE 112

A N-type Si layer was formed to have a thickness of 1 micron on the surface of a P-type (100) Si substrate having a thickness of 200 microns by ion implantation of protons. The quantity of H$^+$ implantation was 5×10$^5$ (ions/cm$^2$).

The aforesaid substrate was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. As described above, only the P-type (100) Si substrate was made porous and the N-type Si layer was not changed by the anodization.

Then, the surface of the epitaxial layer was thermally oxidized to 50 nm. On the surface of the thermally oxidized layer was superposed a fused silica glass substrate optically polished, and they were heated at 800° C. for 0.5 hour in an oxygen atmosphere, so that the two substrates were bonded firmly together.

Then, a Si$_3$N$_4$ layer was deposited to a thickness of 0.1 µm by the low pressure plasma CVD method to cover the bonded two substrates, and then only the $Si_3N_4$ layer on the porous substrate was removed by reactive ion etching.

Then, the porous Si substrate was removed by etching in the same manner as in Example 106, so that a monocrystalline Si layer having a thickness of 5 μm was formed on the low melting point glass substrate.

An NPN-type bipolar transistor, an N-channel field effect transistor and a P-channel field effect transistor were manufactured in the thus obtained monocrystalline silicon layer so as to be connected mutually by a method similar to that according to Embodiment 24, so that an integrated circuit was manufactured.

The semiconductor device thus obtained displayed significantly excellent characteristics.

EXAMPLE 113

A P-type (100) monocrystalline Si substrate having a thickness of 500 microns was anodized in a 50% HF solution. The current density at this time was 10 mA/cm$^2$. As a result, the porous layer having a thickness of 20 microns was formed 10 minutes. On the P-type (100) porous Si substrate was grown a Si epitaxial layer to a thickness of 0.5 microns by the low pressure CVD method. The deposition conditions are as follows:

Solvent: $SiH_2Cl_2$—0.6 l/min. $H_2$—100 l/min

Temperature: 850° C.

Pressure: 50 Torr

Growth rate: 0.1 μm/min

Then, the surface of the epitaxial layer was thermally oxidized to 50 nm. On the surface of the thermally oxidized layer was superposed a silicon substrate having an oxidized layer the thickness of which was 0.8 microns on the surface thereof, and they were heated at 450° C. for 0.5 hour in an oxygen atmosphere, so that the two substrates were bonded firmly together.

The silicon substrate was polished to 490 microns from its reverse side, so that the porous layer was caused to appear outside.

Then, a $Si_3N_4$ layer was deposited to a thickness of 0.1 μm by the plasma CVD method to cover the bonded two substrates, and then only the $Si_3N_4$ layer on the porous substrate was removed by reactive ion etching.

Then, the porous Si substrate was removed by etching in the same manner as in Example 106, so that a monocrystalline Si layer having a thickness of 5 μm was formed on the silica glass substrate.

An NPN-type bipolar transistor, an N-channel field effect transistor and a P-channel field effect transistor were manufactured in the thus obtained monocrystalline silicon layer so as to be connected mutually by the same method as that of Embodiment 24, so that an integrated circuit was manufactured.

The semiconductor device thus obtained displayed significantly excellent characteristics.

EXAMPLE 114

A Si epitaxial layer was grown on a P-type (100) Si substrate having a thickness of 200 microns to have a thickness of 1 micron by the CVD method. The deposition conditions are as follows:

Reactive gas flow rate: $SiH_2Cl_2$—1000 SCCM $H_2$—230 l/min.

Temperature: 1080° C.

Pressure: 80 Torr

Time: 2 min.

The aforesaid substrate was anodized in a 50% HF solution. The current density at this time was 100 mA/cm$^2$. The porous structure formation rate at this time was 8.4 μm/min, and the P-type (100) Si substrate having a thickness of 200 microns as a whole was made porous in 24 minutes. As described above, only the P-type (100) Si substrate was made porous and the Si epitaxial layer was not changed by the anodization.

On the surface of the epitaxial layer was superposed on a fused silica glass substrate polished optically, and they were heated at 800° C. for 0.5 hour in an oxygen atmosphere, so that the two substrates were bonded firmly together.

Then, an $Si_3N_4$ layer was deposited to a thickness of 0.1 μm by the plasma CVD plasma CVD method to cover the bonded two substrates, and then only the $Si_3N_4$ layer on the porous substrate was removed by reactive ion etching.

Then, the porous Si substrate was removed by etching in the same manner as in Example 106, so that a monocrystalline Si layer having a thickness of 1 μm was formed on the silica glass substrate.

An NPN-type bipolar transistor, an N-channel field effect transistor and a P-channel field effect transistor were manufactured in the thus obtained monocrystalline silicon layer so as to be connected mutually by the same method as that of Embodiment 24, so that an integrated circuit was manufactured.

The semiconductor device thus obtained displayed significantly excellent characteristics.

EMBODIMENT 115

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: $HF:H_2O:C_2H_5OH=1:1:1$

Time: 1.6 (hours)

Thickness of porous Si layer: 200 (μm)

Porosity: 56 (%)

On the P-type (100) porous Si substrate was grown a Si epitaxial layer to a thickness of 0.5 microns at a low temperature by MBE (Molecular Beam Epitaxy) method. The deposition conditions are as follows:

Temperature: 700° C.

Pressure: $1 \times 10^{-9}$ Torr

Growth rate: 0.1 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the bonded substrates were selectively etched in a mixture solution (10:6:50) of a 49% hydrofluoric acid, alcohol and 30% hydrogen peroxide solution without stirring. Only the monocrystalline Si layer was left from etching after 65 minutes had passed, and the porous Si substrate was selectively etched and completely removed while using the monocrystalline Si layer as the etch-stop material.

As a result, a monocrystalline Si layer having a thickness of 0.5 μm could be formed on the $SiO_2$ layer.

The cross section was observed by a transmission electron microscope, resulting in no new crystal defect to be introduced into the Si layer, whereby it could be confirmed that good crystallinity can be maintained.

An NPN-type bipolar transistor, an N-channel field effect transistor and a P-channel field effect transistor were manufactured in the thus obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 116

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56 (%)

On the P-type (100) porous Si substrate was grown a Si epitaxial layer to a thickness of 0.5 μm at a low temperature by the plasma CVD method. The deposition conditions are as follows:

Gas: SiH$_4$

Radio frequency power: 100W

Temperature: 800° C.

Pressure: 1×10$^{-2}$ Torr

Growth rate: 2.5 nm/sec.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 0.5 μm was formed on the SiO$_2$ layer.

An NPN-type bipolar transistor, an N-channel field effect transistor and a P-channel field effect transistor were manufactured in the thus obtained monocrystalline silicon layer so as to be connected mutually by the same method as that of Embodiment 25, so that an integrated circuit was manufactured.

The semiconductor device thus obtained displayed significantly excellent characteristics.

EXAMPLE 117

A P-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56 (%)

On the P-type (100) porous Si substrate was grown a Si epitaxial layer to a thickness of 0.5 micron by the bias sputtering method. The deposition conditions are as follows:

RF frequency: 100 MHz

Radio frequency power: 600W

Temperature: 300° C.

Pressure: 8×10$^{-3}$ Torr

Growth period: 60 minutes

Target DC bias: −200V

Substrate DC bias: +5V

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 0.5 μm was formed on the SiO$_2$ layer.

An NPN-type bipolar transistor, an N-channel field effect transistor and a P-channel field effect transistor were manufactured in the thus obtained monocrystalline silicon layer so as to be connected mutually by the same method as that of Embodiment 25, so that an integrated circuit was manufactured.

The semiconductor device thus obtained displayed significantly excellent characteristics.

EXAMPLE 118

An N-type (100) monocrystalline Si substrate having a thickness of 200 microns was anodized in an HF solution. The anodization conditions are as follows:

Applied voltage: 2.6 (V)

Current density: 30 (mA·cm$^{-2}$)

Anodization solution: HF:H$_2$O:C$_2$H$_5$OH=1:1:1

Time: 1.6 (hours)

Thickness of porous Si layer: 200 (μm)

Porosity: 56 (%)

On the N-type (100) porous Si substrate was grown a Si epitaxial layer to a thickness of 5 microns at a low temperature by the liquid growth method. The deposition conditions are as follows:

Solvent: Sn

Growth temperature: 900° C.

Ambient for growth: H$_2$

Growth period: 50 minutes

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 0.5 μm was formed on the SiO$_2$ layer substrate.

An NPN-type bipolar transistor, an N-channel field effect transistor and a P-channel field effect transistor were manufactured in the thus-obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 119

A P-type (100) monocrystalline Si substrate having a thickness of 200 microns was anodized in an HF solution. The anodization conditions are as follows:

Applied voltage: 2.6 (V)
Current density: 30 (mA·cm$^{-2}$)
Anodization solution: HF:H$_2$O:C$_2$H$_5$OH=1:1:1
Time: 1.6 (hours)
Thickness of porous Si layer: 200 (μm)
Porosity: 56 (%)

On the P-type (100) porous Si substrate was grown a Si epitaxial layer to a thickness of 1.0 microns at a low temperature by the low pressure CVD method. The deposition conditions are as follows:

Source gas: SiH$_4$
Carrier gas: H$_2$
Temperature: 850° C.
Pressure: 1×10$^{-2}$ Torr
Growth rate: 3.3 nm/sec Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 1.0 μm was formed on the SiO$_2$ layer.

An NPN-type bipolar transistor, an N-channel field effect transistor and a P-channel field effect transistor were manufactured in the thus-obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 120

A Si epitaxial layer was grown on a P-type (100) Si substrate having a thickness of 200 microns to have a thickness of 1 micron by the CVD method. The deposition conditions are as follows:

Reactive gas flow rate : SiH$_2$C$_2$—1000 SCCM H$^2$—230 l/min
Temperature: 1080° C.
Pressure: 80 Torr
Time: 2 min.

The aforesaid substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 0.5 μm was formed on the SiO$_2$ layer.

An NPN-type bipolar transistor, an N-channel field effect transistor and a P-channel field effect transistor were manufactured in the thus-obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 121

A Si epitaxial layer was grown on a P-type (100) Si substrate having a thickness of 200 microns to have a thickness of 5 microns by the CVD method. The deposition conditions are as follows:

Reactive gas flow rate : SiH$_2$Cl$_2$—1000 SCCM H$_2$—230 l/min
Temperature: 1080° C.
Pressure: 760 Torr
Time: 1 min.

The Si substrate was anodized in an HF solution. The anodization conditions are as follows:

Applied voltage: 2.6 (V)
Current density: 30 (mA·cm$^{-2}$)
Anodization solution: HF:H$_2$O:C$_2$H$_5$OH=1:1:1
Time: 1.6 (hours)
Thickness of porous Si layer: 200 (μm)
Porosity: 56 (%)

As described above, only the P-type (100) Si substrate was made porous and the Si epitaxial layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 5 μm was formed on the SiO$_2$ layer.

An NPN-type bipolar transistor, an N-channel field effect transistor and a P-channel field effect transistor were manufactured in the thus-obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 122

A N-type Si layer was formed to have a thickness of 1 micron on the surface of a P-type (100) Si substrate having a thickness of 200 microns by ion implantation of protons. The quantity of H$^+$ implantation was 5×10$^{15}$ (ions/cm$^2$).

The aforesaid substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

As described above, only the P-type (100) Si substrate was made porous and the N-type Si layer was not changed by the anodization.

Then, on the surface of the epitaxial layer was formed an oxidized layer having a thickness of 1000 Å, and another Si substrate on which an oxidized layer having a thickness of 5000 Å was formed was superposed on the surface of the oxidized layer thereof, and then they were heated at 800° C. for 0.5 hour in an oxygen atmosphere, so that the two Si substrates were bonded firmly together.

Then, the porous Si substrate was removed by etching in the same manner as in Example 115, so that a monocrystalline Si layer having a thickness of 1 µm was formed on the SiO$_2$ layer.

An NPN-type bipolar transistor, an N-channel field effect transistor and a P-channel field effect transistor were manufactured in the thus-obtained monocrystalline silicon layer so as to be connected mutually by the same method as that of Embodiment 25, as that an integrated circuit was manufactured.

The semiconductor device thus obtained displayed significantly excellent characteristics.

EXAMPLE 123

A P-type (100) monocrystalline Si substrate having a thickness of 500 microns was anodized in a 50% HF solution. The current density at this time was 10 mA/cm$^2$. As a result, a porous layer having a thickness of 20 microns was formed in 10 minutes. On the P-type (100) porous Si substrate was grown a Si epitaxial layer to a thickness of 0.5 microns by the low pressure CVD method. The deposition conditions are as follows:

Gas: SiH$_2$Cl$_2$—0.6 1/min H$^2$—100 1/min

Temperature: 850° C.

Pressure: 50 Torr

Growth rate: 0.1 µm/min

Then, the surface of the epitaxial layer was thermally oxidized to 50 nm. On the surface of the thermally oxidized layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

The silicon substrate was polished to 490 microns from its reverse side, so that the porous layer was caused to appear outside.

Then, the porous Si substrate was removed by etching in the same manner as in Example 115.

An NPN-type bipolar transistor, an N-channel field effect transistor and a P-channel field effect transistor were manufactured in the thus-obtained monocrystalline silicon layer so as to be connected mutually by a method similar to that according to Embodiment 25, so that an integrated circuit was manufactured.

The semiconductor device thus obtained displayed significantly excellent characteristics.

EXAMPLE 124

A Si epitaxial layer was grown on a P-type (100) Si substrate having a thickness of 200 microns to have a thickness of 0.5 microns by the CVD method. The deposition conditions are as follows:

Reactive gas flow rate:SiH$_2$Cl$_2$—1000 SCCM H$_2$—230 1/min

Temperature: 1080° C.

Pressure: 80 Torr

Time: 2 min.

The aforesaid substrate was anodized in a 50% HF solution. The current density at this time was 100 mA/cm$^2$.

The porous structure formation rate at this time was 8.4 µm/min. and the P-type (100) Si substrate having a thickness of 200 microns as a whole was made porous in 24 minutes. As described above, only the P-type (100) Si substrate was made porous and the Si epitaxial layer was not changed by the anodization.

On the surface of the thermally oxidized layer was superposed a silicon substrate having an oxidized layer the thickness of which was 0.8 microns on the surface thereof, and they were heated at 900° C. for 1.5 hours in an oxygen atmosphere, so that the two substrates were bonded firmly together.

Then, the porous Si substrate was removed by etching in the same manner as in Example 115, so that a monocrystalline Si layer having a thickness of 1 µm was formed on the SiO$_2$ layer.

An NPN-type bipolar transistor, an N-channel field effect transistor and a P-channel field effect transistor were manufactured in the thus-obtained monocrystalline silicon layer so as to be connected mutually by the same method as that of Embodiment 25, so that an integrated circuit was manufactured.

The semiconductor device thus obtained displayed significantly excellent characteristics.

EXAMPLE 125

A P-type (100) monocrystalline Si substrate having a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate was grown a Si epitaxial layer to a thickness of 0.5 microns at a low temperature by the MBE (Molecular Beam Epitaxy) method. The deposition conditions are as follows:

Temperature: 700° C.

Pressure: 1×10$^{-9}$ Torr

Growth rate: 0.1 nm/sec

Then, the surface of the epitaxial layer was thermally oxidized to 50 nm. On the surface of the thermally oxidized layer was superposed a fused silica glass substrate, which has been optically polished, and they were heated at 800° C. for 0.5 hour in an oxygen atmosphere, so that the two Si substrates were bonded firmly together.

Then, a Si$_3$N$_4$ layer was deposited to a thickness of 0.1 µm by a low pressure CVD method to cover the bonded two substrates, and then only the Si$_3$N$_4$ layer on the porous substrate was removed by reactive ion etching.

Then, the bonded substrates were selectively etched in a mixture solution (10:6:50) of a 49% hydrofluoric acid, alcohol and hydrogen peroxide solution without stirring. Only the monocrystalline Si layer was left from etching after 65 minutes had passed, and the porous Si substrate was selectively etched and completely removed while using the monocrystalline Si layer as the etch-stop material.

As a result, monocrystalline Si layer having a thickness of 0.5 µm could be formed on the silica glass substrate.

The cross section was observed by a transmission electron microscope, resulting in no new crystal defect to be introduced into the Si layer, whereby it could be confirmed that good crystallinity can be maintained.

Field effect transistors were so manufactured in the aforesaid monocrystalline silicon thin film by the method as described above that they were mutually connected to each other. As a result, a complementary device and its integrated circuit were manufactured.

The semiconductor active devices thus manufactured were combined to manufacture a pixel switch and a peripheral circuit as shown in FIG. 28. Furthermore, a liquid crystal layers were stacked so that a liquid crystal display device was manufactured on a transparent substrate.

The liquid crystal display device thus obtained displayed excellent characteristics, for example, high contrast and high response speed.

What is claimed is:

1. A method of manufacturing a semiconductor device comprising a substrate having a surface composed of an insulating material and a non-porous monocrystalline semiconductor region disposed on the surface comprising the steps of:

preparing a body comprising a porous monocrystalline semiconductor region and said non-porous monocrystalline semiconductor region formed thereon, bonding the substrate having a surface composed of an insulating material to the body so that the surface composed of an insulating material is adhered to the surface of said non-porous noncrystalline semiconductor region, and removing the porous monocrystalline semiconductor region by etching.

2. A method of manufacturing an insulating gate type field effect transistor comprising a substrate having a surface composed of an insulating material and a non-porous monocrystalline semiconductor layer disposed on the surface, and wherein a monocrystalline semiconductor layer constitutes at least a channel region of said transistor, comprising the steps of:

preparing a body comprising a porous silicon substrate and said non-porous monocrystalline semiconductor layer, said non-porous monocrystalline semiconductor layer having an oxidized surface which is formed on said non-porous semiconductor layer, bonding the substrate having the surface composed of the insulating material to the body so that the surface composed of the insulating material is adhered to the surface of the non-porous monocrystalline semiconductor layer, and removing the porous silicon substrate by chemical etching.

3. A method of manufacturing a bipolar transistor comprising a substrate having a surface composed of an insulating material and a non-porous monocrystalline layer disposed on the surface, and wherein a monocrystalline semiconductor layer constitutes at least an active region of said transistor, comprising the steps of:

preparing a body comprising a porous silicon substrate and said non-porous monocrystalline layer having an oxidized surface which is formed on said non-porous monocrystal layer, bonding the substrate having a surface composed of an insulating material to the body so that the surface composed of an insulating material is adhered to the oxidized or non-oxidized surface formed on said non-porous monocrystalline layer, and removing the porous silicon substrate by chemical etching.

4. A method of manufacturing a power transistor comprising a substrate having a surface composed of an insulating material and a non-porous monocrystalline layer disposed on the surface, and wherein a monocrystalline semiconductor layer constitutes at least a channel region of said transistor, comprising the steps of:

preparing a body comprising a porous silicon substrate and a non-porous monocrystalline layer with or without an oxidized surface which is formed thereon, boding the substrate having a surface composed of an insulating material to the body so that the surface composed of an insulating material is adhered to the oxidized or non-oxidized surface of the non-porous monocrystalline layer, and removing the porous silicon substrate by chemical etching.

5. A method of manufacturing a semiconductor device comprising a bipolar transistor and a field effect transistor in which said bipolar transistor and said field effect transistor comprise a substrate having a surface composed of an insulating material and a non-porous monocrystalline layer disposed on the surface, and wherein monocrystalline semiconductor layers constitute active regions of said bipolar transistor, comprising the steps of:

preparing a body comprising a porous silicon substrate and said non-porous monocrystalline layer with an oxidized surface which is formed thereon, bonding the substrate having a surface composed of an insulating material to the body so that the surface composed of an insulating material is adhered to the oxidized surface of the non-porous monocrystalline layer, and removing the porous silicon substrate by chemical etching.

6. A method of manufacturing a liquid crystal display apparatus having a semiconductor active device and a liquid crystal layer which are formed on a common substrate, said semiconductor active device comprising a light-transmissive substrate and a non-porous monocrystalline layer disposed on the surface, and wherein a monocrystalline layer constitutes at least an active region of said semiconductor active device, comprising the steps of:

preparing a body comprising a porous silicon substrate and said non-porous monocrystalline layer with an oxidized surface which is formed thereon, bonding the light-transmissive substrate so that the surface of the light-transmissive substrate to the body is adhered to the oxidized surface of the non-porous monocrystalline layer, and removing the porous silicon substrate by etching.

7. A method of manufacturing an insulating gate type field effect transistor according to claim 2, wherein said non-porous monocrystalline semiconductor layer is an unoxidized layer, and wherein said surface composed of an insulating material is adhered to the surface of said non-porous monocrystalline layer.

8. A method of manufacturing a bipolar transistor according to claim 3, wherein said non-porous monocrystalline layer is an unoxidized layer, and wherein said surface composed of an insulating material is adhered to the surface of said non-porous monocrystalline layer.

9. A method of manufacturing a power transistor according to claim 4, wherein said non-porous monocrystalline layer is an unoxidized layer, and wherein said surface composed of an insulating material is adhered to the surface of said monocrystalline layer.

10. A method of manufacturing a semiconductor device according to claim 5, wherein said non-porous monocrystalline layer is an unoxidized layer, and wherein said surface composed of an insulating material is adhered to the surface of said non-porous monocrystalline layer.

11. A method of manufacturing a liquid crystal display apparatus according to claim 6, wherein said non-porous monocrystalline layer is an unoxidized layer, and wherein said surface composed of an insulating material is adhered to the surface of said non-porous monocrystalline layer.

12. A semiconductor device manufactured by a method of claim 1.

13. An insulating gate type field effect transistor manufactured by a method of claim 3.

14. A bipolar transistor manufactured by a method of claim 3.

15. A power transistor manufactured by a method of claim 4.

16. A semiconductor device manufactured by a method of claim 5.

17. A liquid crystal display apparatus manufactured by a method of claim 6.

18. A method of manufacturing a semiconductor device comprising a substrate having an insulating layer and a non-porous monocrystalline semiconductor region disposed on the insulating layer, which comprises the steps of:
preparing a first member having a porous monocrystalline semiconductor region and the non-porous monocrystalline semiconductor region formed thereon;
bonding the first member to a second member with the insulating layer therebetween and in a manner so as to place the non-porous monocrystalline semiconductor region inside the multi-layer structure to be obtained; and
removing the porous monocrystalline semiconductor region from the multi-layer structure.

19. The method according to claim 18, wherein the porous monocrystalline semiconductor region and the non-porous monocrystalline semiconductor region comprise silicon.

20. The method according to claim 19, wherein the porous monocrystalline semiconductor region comprises a P-type semiconductor.

21. The method according to claim 20, wherein the non-porous monocrystalline semiconductor region comprises an intrinsic or N-type semiconductor.

22. The method according to claim 18, wherein the non-porous monocrystalline semiconductor region has a thickness of 50 microns or less.

23. The method according to claim 18, wherein the bonding step is carried out in an atmosphere comprising nitrogen.

24. The method according to claim 18, wherein the bonding step comprises a heat treatment.

25. The method according to claim 18, wherein the non-porous monocrystalline semiconductor region is formed by epitaxial growth.

26. The method according to claim 25, wherein the non-porous monocrystalline semiconductor region is formed according to a method selected from the group consisting of the molecular beam epitaxial method, the plasma CVD method, the low pressure CVD method, the photo CVD method, the liquid phase growth method and the sputtering method.

27. The method according to claim 18, wherein the porous monocrystalline semiconductor region is obtained by making porous at least a part of a substrate comprising a non-porous semiconductor monocrystal by anodization.

28. The method according to claim 27, wherein the anodization is carried out in a hydrofluoric acid solution.

29. The method according to claim 18, wherein the second member comprises a silicon substrate.

30. The method according to claim 18, wherein the second member and the insulating layer are formed by oxidizing a surface of a silicon substrate.

31. The method according to claim 18, wherein the first member and the insulating layer are formed by oxidizing a surface of a non-porous monocrystalline silicon layer of a substrate having a porous monocrystalline silicon layer and the non-porous monocrystalline silicon layer.

32. The method according to claim 18, wherein the insulating layer comprises a first and a second insulating layers, wherein the first member and the first insulating layer are formed by oxidizing a surface of a non-porous monocrystalline silicon layer of a substrate having a porous monocrystalline silicon layer and the non-porous monocrystalline silicon layer, and wherein the second member and the second insulating layer are formed by oxidizing a surface of a silicon substrate.

33. The method according to any one of claims 30 to 32, wherein the oxidation is thermal oxidation.

34. The method according to claim 18, wherein the removal of the porous monocrystalline semiconductor region from the multi-layer structure is carried out by etching.

35. The method according to claim 34, wherein the etching is carried out by using an aqueous solution as an etchant.

36. The method according to claim 35, wherein the etchant comprises hydrofluoric acid.

37. The method according to claim 18, wherein a substrate, comprising a non-porous semiconductor monocrystal, is partly made porous to form the porous monocrystalline semiconductor region; and after the bonding step, the region not made porous of the substrate is removed; and the porous monocrystalline semiconductor region is removed from the multi-layer structure.

38. The method according to claim 37, wherein the region not made porous of the substrate is mechanically removed.

39. The method according to claim 38, wherein the mechanical removal is carried out by grinding or polishing.

40. The method according to claim 18, wherein the semiconductor device comprises an insulated gate type field effect transistor, and wherein the non-porous monocrystalline semiconductor region forms at least the channel-region of the transistor.

41. The method according to claim 18, wherein the semiconductor device comprises a bipolar transistor, and wherein the non-porous monocrystalline semiconductor region forms at least the active region of the transistor.

42. The method according to claim 18, wherein the semiconductor device comprises a power transistor, and wherein the non-porous monocrystalline semiconductor region forms at least the channel region of the transistor.

43. The method according to claim 18, wherein the semiconductor device comprises a liquid crystal display having a semiconductor active region and a liquid crystal layer, and wherein the non-porous monocrystalline semiconductor region forms at least the semiconductor active region of the liquid crystal display.

44. A semiconductor device manufactured according to the method of claim 18.

45. A method of manufacturing a semiconductor device comprising a substrate having an insulating body and a non-porous monocrystalline semiconductor region disposed on the insulating body, which comprises the steps of:
preparing a first member having a porous monocrystalline semiconductor region and the non-porous monocrystalline semiconductor region formed thereon;

bonding the first member to a second member comprising the insulating body in a manner so as to place the non-porous monocrystalline semiconductor region inside the multi-layer structure to be obtained; and removing the porous monocrystalline semiconductor region from the multi-layer structure.

46. The method according to claim 45, wherein the porous monocrystalline semiconductor region and the non-porous monocrystalline semiconductor region comprise silicon.

47. The method according to claim 46, wherein the porous monocrystalline semiconductor region comprises a P-type semiconductor.

48. The method according to claim 47, wherein the non-porous monocrystalline semiconductor region comprises an intrinsic or N-type semiconductor.

49. The method according to claim 45, wherein the non-porous monocrystalline semiconductor layer has a thickness of 50 microns or less.

50. The method according to claim 45, wherein the bonding step is carried out in an atmosphere comprising nitrogen.

51. The method according to claim 45, wherein the bonding step comprises a heat treatment.

52. The method according to claim 45, wherein the non-porous monocrystalline semiconductor layer is formed by epitaxial growth.

53. The method according to claim 52, wherein the non-porous monocrystalline semiconductor layer is formed according to a method selected from the group consisting of the molecular beam epitaxial method, the plasma CVD method, the low pressure CVD method, the photo CVD method, the liquid phase growth method and the sputtering method.

54. The method according to claim 45, wherein the porous monocrystalline semiconductor region is obtained by making porous at least a part of a substrate comprising a non-porous semiconductor monocrystal by anodization.

55. The method according to claim 45, wherein the anodization is carried out in a hydrofluoric acid solution.

56. The method according to claim 45, wherein the second member comprises a light-transmissive material.

57. The method according to claim 56, wherein the light-transmissive material comprises glass.

58. The method according to claim 57, wherein the glass is quartz glass.

59. The method according to claim 45, wherein the removal of the porous monocrystalline semiconductor region from the multi-layer structure is carried out by etching.

60. The method according to claim 59, wherein the etching is carried out by using an aqueous solution as an etchant.

61. The method according to claim 60, wherein the enchant comprises hydrofluoric acid.

62. The method according to claim 46, wherein a substrate comprising a non-porous semiconductor monocrystal is partly made porous to form the porous monocrystalline semiconductor region: after the bonding step, the region not made porous of the substrate is removed; and the porous monocrystalline semiconductor region in removed from the multi-layer structure.

63. The method according to claim 62, wherein the region not made porous of the substrate is mechanically removed.

64. The method according to claim 63, wherein the mechanical removal is carried out by grinding or polishing.

65. The method according to claim 45, wherein the semiconductor device comprises an insulated gate type field effect transistor, and wherein the non-porous monocrystalline semiconductor region forms at least the channel region of the transistor.

66. The method according to claim 45, wherein the semiconductor device comprises a bipolar transistor, and wherein the non-porous monocrystalline semiconductor region forms at least the active region of the transistor.

67. The method according to claim 45, wherein the semiconductor device comprises a power transistor, and wherein the non-porous monocrystalline semiconductor region forms at least the channel region of the transistor.

68. The method according to claim 45, wherein the semiconductor device comprises a liquid crystal display having a semiconductor active region and a liquid crystal layer, and wherein the non-porous monocrystalline semiconductor region forms at least the semiconductor active region of the liquid crystal display.

69. A semiconductor device manufactured according to the method of claim 45.

* * * * *

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

It is certified that error appears in the above-identified patent and that said Letters Patent is hereby corrected as shown below:

ON THE TITLE PAGE:

AT [60] RELATED U.S. APPLICATION DATA

"Pat. No. 5,371,037." should read
--Pat. No. 5,371,037, issued Dec. 6, 1994.--.

AT [56] REFERENCES CITED

OTHER PUBLICATIONS

"Silicon-On Insulator" should read
--Silicon-on-Insulator--.

COLUMN 6

Line 17, "insulting" should read --insulating--; and
Line 36, "of" should read --or--.

COLUMN 12

Line 6, "make" should read --makes--.

COLUMN 13

Line 34, "(1956))" should read --(1956)).--; and
Line 48, "X>4." should read --$\lambda$>4.--.

COLUMN 24

Line 30, "(hours" should read --(hours)--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

Page 2 of 9

It is certified that error appears in the above-identified patent and that said Letters Patent is hereby corrected as shown below:

COLUMN 25

Line 53, "aced," should read --acid,--.

COLUMN 28

Line 47, "of" should read --with--.

COLUMN 29

Line 41, "of" should read --with--.

COLUMN 34

Line 16, "above" should read --above- --.

COLUMN 38

Line 39, "ben" should read --been--.

COLUMN 41

Line 58, "SiO," should read --$SiO_2$--.

COLUMN 47

Line 57, "and" should read --an--.

COLUMN 48

Line 17, "life time" should read --lifetime--;
Line 31, "was" (first occurrence) should read --as--; and
Line 50, "as" should read --As--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

Page 3 of 9

It is certified that error appears in the above-identified patent and that said Letters Patent is hereby corrected as shown below:

COLUMN 50

Line 35, "life time" should read --lifetime--; and
   Line 67, "SiO²." should read --SiO$_2$.--.

COLUMN 51

Line 10, "to" should be deleted; and
   Line 30, "SiH$_2$C$_2$" should read --SiH$_2$Cl$_2$--.

COLUMN 53

Line 7, "life time" should read --lifetime--.

COLUMN 54

Line 40, "AS" should read --As--;
   Line 45, "cold" should read --could--; and
   Line 60, "life time" should read --lifetime--.

COLUMN 57

Line 53, "life time" should read --lifetime--.

COLUMN 59

Line 40, "life time" should read --lifetime--.

COLUMN 61

Line 11, "life time" should read --lifetime--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

It is certified that error appears in the above-identified patent and that said Letters Patent is hereby corrected as shown below:

COLUMN 62

Line 28, "back side" should read --backside--;
Line 58, "plan view" should read --plan-view--; and
Line 64, "life time" should read --lifetime--.

COLUMN 63

Line 21, "SI$_3$N$_4$" should read --Si$_3$N$_4$--; and
Line 32, "cross section" should read --cross-section--.

COLUMN 64

Line 47, "as" should read --as in--; and
Line 64, "time" should read --time was--.

COLUMN 65

Line 25, "wa" should read --was--; and
Line 40, "as" should read --as a--.

COLUMN 66

Line 21, "as" should read --as a--; and
Line 31, "deposited" should read --was deposited--.

COLUMN 67

Line 10, "completely" should read --complete--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

Page 5 of 9

It is certified that error appears in the above-identified patent and that said Letters Patent is hereby corrected as shown below:

COLUMN 68

Line 1, "as" should read --as a--; and
    Line 61, "cross section" should read --cross-section--.

COLUMN 70

Line 23, "A" should read --An--; and
    Line 53, "os" should read --so--.

COLUMN 72

Line 6, "at" should read --a--;
    Line 46, "A" should read --An--; and
    Line 50, "substrates" should read --substrate--.

COLUMN 73

Line 10, "a" (first occurrence) should read --A--;
    Line 58, "having" should read --having a--; and
    Line 66, "a" should read --an--.

COLUMN 74

Line 34, "$SI_3N_4$" should read --$Si_3N_4$--;
    Line 36, "$SI_3N_4$" should read --$Si_3N_4$--; and
    Line 45, "cross section" should read --cross-section--.

COLUMN 75

Line 60, "$SI_3N_4$" should read --$Si_3N_4$--.

UNITED STATES PATENT AND TRADEMARK OFFICE
CERTIFICATE OF CORRECTION

PATENT NO. : 5,750,000

DATED : May 12, 1998

INVENTOR(S) : TAKAO YONEHARA, ET AL.

It is certified that error appears in the above-identified patent and that said Letters Patent is hereby corrected as shown below:

COLUMN 77

Line 54, "A" should read --An--; and
Line 58, "substrates" should read --substrate--.

COLUMN 78

Line 6, "SI$_3$N$_4$" should read --Si$_3$N$_4$--.

COLUMN 79

Line 64, "cross section" should read --cross-section--.

COLUMN 81

Line 28, "A" should read --An--.

COLUMN 83

Line 45, "A" should read --An--; and
Line 67, "SiO," should read --SiO$_2$--.

COLUMN 84

Line 62, "a" should read --as a--.

COLUMN 85

Line 37, "Si$^3$N$_4$" should read --Si$_3$N$_4$--; and
Line 51, "cross section" should read --cross-section--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

It is certified that error appears in the above-identified patent and that said Letters Patent is hereby corrected as shown below:

COLUMN 88

Line 55, "SI$_3$N$_4$" should read --Si$_3$N$_4$--.

COLUMN 89

Line 5, "A" should read --An--.

COLUMN 95

Line 21, "A" should read --An--; and
Line 60, "on" (second occurrence) should read --of--.

COLUMN 97

Line 41, "cross section" should read --cross-section--.

COLUMN 98

Line 54, "Su$_3$N$_4$" should read --Si$_3$N$_4$--; and
Line 60, "a n N-channel" should read --an N-channel--.

COLUMN 100

Line 29, "plasma CVD" (second occurrence) should be deleted.

COLUMN 102

Line 15, "plasma CVD" (second occurrence) should be deleted; and
Line 66, "cross section" should read --cross-section--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, ET AL.

It is certified that error appears in the above-identified patent and that said Letters Patent is hereby corrected as shown below:

COLUMN 105

Line 47, "$SiH_2C_2$" should read --$SiH_2Cl_2$--.

COLUMN 106

Line 58, "A" should read --An--.

COLUMN 108

Line 64, "cross section" should read --cross-section--.

COLUMN 109

Line 7, "a" should be deleted.

COLUMN 111

Line 11, "claim 3." should read --claim 2.--.

COLUMN 113

Line 1, "toa" should read --to a--.

UNITED STATES PATENT AND TRADEMARK OFFICE
CERTIFICATE OF CORRECTION

PATENT NO. : 5,750,000
DATED : May 12, 1998
INVENTOR(S) : TAKAO YONEHARA, et al.

It is certified that error appears in the above-identified patent and that said Letters Patent is hereby corrected as shown below:

<u>COLUMN 114</u>

Line 9, "enchant" should read --etchant--;
Line 13, "region:" should read --region;--; and
Line 15, "in" should read --is--.

Signed and Sealed this

Twenty-eighth Day of December, 1999

Attest:

Q. TODD DICKINSON

Attesting Officer    Acting Commissioner of Patents and Trademarks